United States Patent
Okumura

(10) Patent No.: US 12,272,746 B2
(45) Date of Patent: Apr. 8, 2025

(54) SEMICONDUCTOR DEVICE

(71) Applicant: FUJI ELECTRIC CO., LTD., Kawasaki (JP)

(72) Inventor: Keiji Okumura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 587 days.

(21) Appl. No.: 17/533,843

(22) Filed: Nov. 23, 2021

(65) Prior Publication Data

US 2022/0216335 A1 Jul. 7, 2022

(30) Foreign Application Priority Data

Jan. 6, 2021 (JP) .................................... 2021-1061

(51) Int. Cl.
*H01L 29/78* (2006.01)
*H01L 29/16* (2006.01)
*H01L 29/20* (2006.01)
*H01L 29/66* (2006.01)

(52) U.S. Cl.
CPC .... *H01L 29/7811* (2013.01); *H01L 29/66068* (2013.01); *H01L 29/66734* (2013.01); *H01L 29/1608* (2013.01); *H01L 29/2003* (2013.01); *H01L 29/66522* (2013.01); *H01L 29/7813* (2013.01)

(58) Field of Classification Search
CPC ........... H01L 29/7811; H01L 29/66078; H01L 29/66734; H01L 29/1608; H01L 29/2003; H01L 29/66522; H01L 29/7813
USPC ........................................................ 257/77
See application file for complete search history.

(56) References Cited

U.S. PATENT DOCUMENTS

| | | | |
|---|---|---|---|
| 9,825,164 B2 | 11/2017 | Kagawa et al. | |
| 10,134,593 B2 | 11/2018 | Endo et al. | |
| 10,777,678 B2 | 9/2020 | Okumura | |
| 10,964,809 B2 | 3/2021 | Noborio et al. | |
| 2016/0190307 A1 | 6/2016 | Kagawa et al. | |
| 2018/0040685 A1* | 2/2018 | Yeo | H10K 59/1315 |
| 2018/0151366 A1 | 5/2018 | Endo et al. | |
| 2018/0308972 A1 | 10/2018 | Ohse et al. | |
| 2019/0140095 A1* | 5/2019 | Okumura | H01L 29/0878 |

(Continued)

FOREIGN PATENT DOCUMENTS

| | | |
|---|---|---|
| JP | 2002-314099 A | 10/2002 |
| JP | 2016225455 A | 12/2016 |
| JP | 6099749 B2 | 3/2017 |

(Continued)

OTHER PUBLICATIONS

Japanese Office Action dated Sep. 24, 2024 for the corresponding Japanese Patent Application No. 2021-001061.

*Primary Examiner* — Igwe U Anya

(57) ABSTRACT

A semiconductor device has an active area in which a main current flows and an outer-edge area surrounding the active area. The semiconductor device includes: an n-type semiconductor layer made of a wide bandgap semiconductor; a plurality of p-type guard rings provided inside the semiconductor layer in the outer-edge area to surround the active area; and a separation region provided in a concentric ring shape in the outer-edge area to be in contact with both of the adjacent guard rings, wherein the separation region contains both n-type first impurities and p-type second impurities.

18 Claims, 43 Drawing Sheets

(56) References Cited

U.S. PATENT DOCUMENTS

2019/0288074 A1* 9/2019 Takeuchi ............ H01L 29/7397
2020/0227549 A1* 7/2020 Noborio ............ H01L 29/66734

FOREIGN PATENT DOCUMENTS

| JP | 2018-182234 A | 11/2018 |
| JP | 201954087 A | 4/2019 |
| JP | 20197134 A | 5/2019 |
| JP | 2019-87646 A | 6/2019 |
| WO | 2014/045480 A1 | 3/2014 |

* cited by examiner

SEMICONDUCTOR DEVICE

CROSS REFERENCE TO RELATED APPLICATIONS

This application is based upon and claims the benefit of priority from the prior Japanese Patent Application No. 12021-1061 filed on Jan. 6, 2021, the entire contents of which are incorporated herein by reference.

BACKGROUND OF THE INVENTION

1. Field of the Invention

The present invention relates to a semiconductor device, and more particularly to a technique for relaxing an electric field crowding in an edge-termination area of the semiconductor device.

2. Description of the Related Art

Conventionally, silicon (Si) semiconductors are used in power semiconductor devices which are mainly applied for power conversion devices and the like. Recently, silicon carbide (SiC), which is a wide-gap semiconductor, is expected as a semiconductor material to replace Si. The SiC power semiconductor devices have advantages, such as high breakdown voltage, low loss, high-speed operation, stable operation in high-temperature environments and the like, in comparison to the conventional Si power semiconductor devices. Such advantages are given by the properties of the SiC material itself in relation to Si, in that the band gap is about three times larger, the dielectric breakdown field strength is about ten times higher, the saturation drift velocity is about two times larger, and the thermal conductivity is about three times larger.

As power semiconductor devices, Schottky barrier diodes (SBDs), field effect transistors (FETs), static induction transistors (SITs), insulated gate bipolar transistors (IGBTs), and the like have been commercialized. A trench MOSFET is a semiconductor device having a three-dimensional structure in which a trench is formed in the SiC semiconductor substrate and a sidewall of the trench is used as a channel. Therefore, when comparing elements having the same on-resistance, the trench MOSFET can have an overwhelmingly smaller element area than the planar type vertical MOSFET, and the trench MOSFET is considered to be a particularly promising semiconductor element structure.

In a high-voltage semiconductor device, a high electric field is likely to be generated in an edge region of an outer-edge area of the semiconductor device, and an edge-termination structure to mitigate the electric field crowding is important. If the edge-termination structure is not provided, the electric field will be crowded in the edge region of the semiconductor device, and the semiconductor device may be destroyed at a low voltage. Therefore, the edge-termination structure such as a guard ring is provided in the edge region. Further, in the trench MOSFET, in addition to the edge-termination structure in the edge region, a structure for relaxing the electric field crowding at the bottom of the gate trench to prevent the gate insulating film from being destroyed is also required.

The guard ring as the edge-termination structure is generally formed by processing technology such as photolithography, ion implantation and the like. For example, in the case of MOSFET, an ion-implantation mask is fabricated by photolithography and the like using a photomask for the guard ring, and the guard ring is formed by implantation of p-type impurity ions on a top surface of an n-type drift layer. Therefore, at least the photomask for the guard ring, and processes of ion-implantation and mesa-groove forming are required, resulting in an increase in manufacturing time and cost.

In JP 2016-225455 A, the base-bottom embedded region and the guard ring are simultaneously formed by the ion-implantation through the trench and the embedded growth to fill the trench. In JP 2019-054087 A, the impurity ions are implanted deep inside from the top surface of the drift layer to selectively form the guard ring together with the base-bottom embedded region. In the semiconductor devices described in JP 2016-225455 A and JP 2019-054087 A, the electric field relaxation structure is not provided at the bottom of the gate trench.

SUMMARY OF THE INVENTION

A first aspect of the present invention inheres in a semiconductor device having an active area in which a main current flows and an outer-edge area surrounding the active area, includes: (a) a semiconductor layer having a first conductivity type made of a wide bandgap semiconductor; (b) a plurality of guard rings each having a second conductivity type provided inside the semiconductor layer in the outer-edge area to surround the active area; and (c) a separation region provided in a concentric ring shape in the outer-edge area to be in contact with both of the adjacent guard rings, wherein the separation region contains both first impurities of the first conductivity type and second impurities of the second conductivity type.

A second aspect of the present invention inheres in a method for manufacturing a semiconductor device having an active area in which a main current flows and an outer-edge area surrounding the active area in a first conductivity type semiconductor layer made of a wide bandgap semiconductor, including: (a) forming a second conductivity type semiconductor region on a top surface of the semiconductor layer from the active area to the outer-edge area; and (b) forming separation regions by implanting first conductivity type impurity ions into the semiconductor region to reach the semiconductor layer, the separation regions each having a concentric ring shape and guard rings sandwiching between the respective separation regions in the outer-edge area.

DETAILED DESCRIPTION

Figure 1:
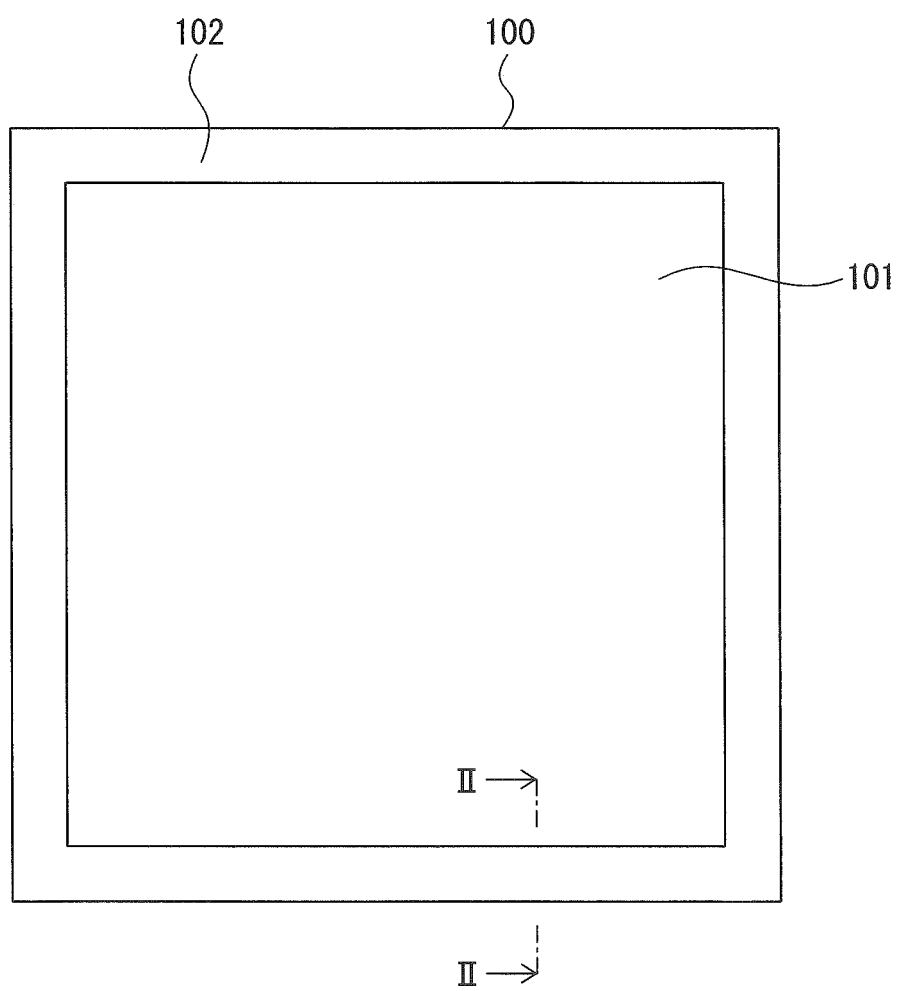
FIG. 1 is a schematic plan view illustrating an example of a semiconductor device according to a first embodiment of the present invention.

Hereinafter, first to third embodiments of the present invention will be described with reference to the drawings. In the descriptions of the drawings, the same or similar parts are denoted by the same or similar reference numerals, and duplicate explanation is omitted. However, the drawings are schematic, the relationship between the thickness and the plane dimension, the ratio of the thickness of each layer, etc. may be different from the actual one. In addition, parts having different dimensional relations and ratios may also be included between drawings. In addition, the embodiments described below exemplify apparatuses and methods for embodying the technical idea of the present invention, and the technical idea of the invention does not specify the material, shape, structure, or arrangement of the elements described below.

In the present specification, the source region of the MOS transistor is the "one main region (first main region)" that can be selected as the emitter region of the insulated gate bipolar transistor (IGBT). Further, in a thyristor such as a MOS-controlled electrostatic induction thyristor (SI thyristor), one main region can be selected as a cathode region. The drain region of the MOS transistor is the "other main region (second main region)" of the semiconductor device, which can be selected as the collector region in the IGBT and the anode region in the thyristor. As used herein, the term "main region" means either the first main region or the second main region, which is appropriate from the common general technical knowledge of those skilled in the art.

Further, in the following descriptions, the terms relating to directions, such as "top and bottom" are merely defined for illustration purposes, and thus, such definitions do not limit the technical spirit of the present invention. Therefore, for example, when the paper plane is rotated by 90 degrees, the "top and bottom" are read in exchange to the "left and right". When the paper plane is rotated by 180 degrees, the "top" is changed to the "bottom", and the "bottom" is changed to the "top". Further, in the following description, the case where a first conductivity type is n-type and a second conductivity type is p-type will be exemplarily described. However, it is also possible to select the conductivity type in an inverse relationship so that the first conductivity type is p-type and the second conductivity type is n-type. Further, the superscript "+" or "−" added to the mark "n" or "p" denotes that a semiconductor region has relatively high or low impurity concentration than a region without the superscript "+" or "−" added. It should be noted that semiconductor regions denoted by the same mark, such as "n", do not necessarily have exactly the same impurity concentration. Further, in the specification, "−" in the Miller index notation denotes a bar on top of the following Miller index, and a negative index is denoted with adding "−" before the index.

First Embodiment

<Structure of Semiconductor Device>

Figure 2:
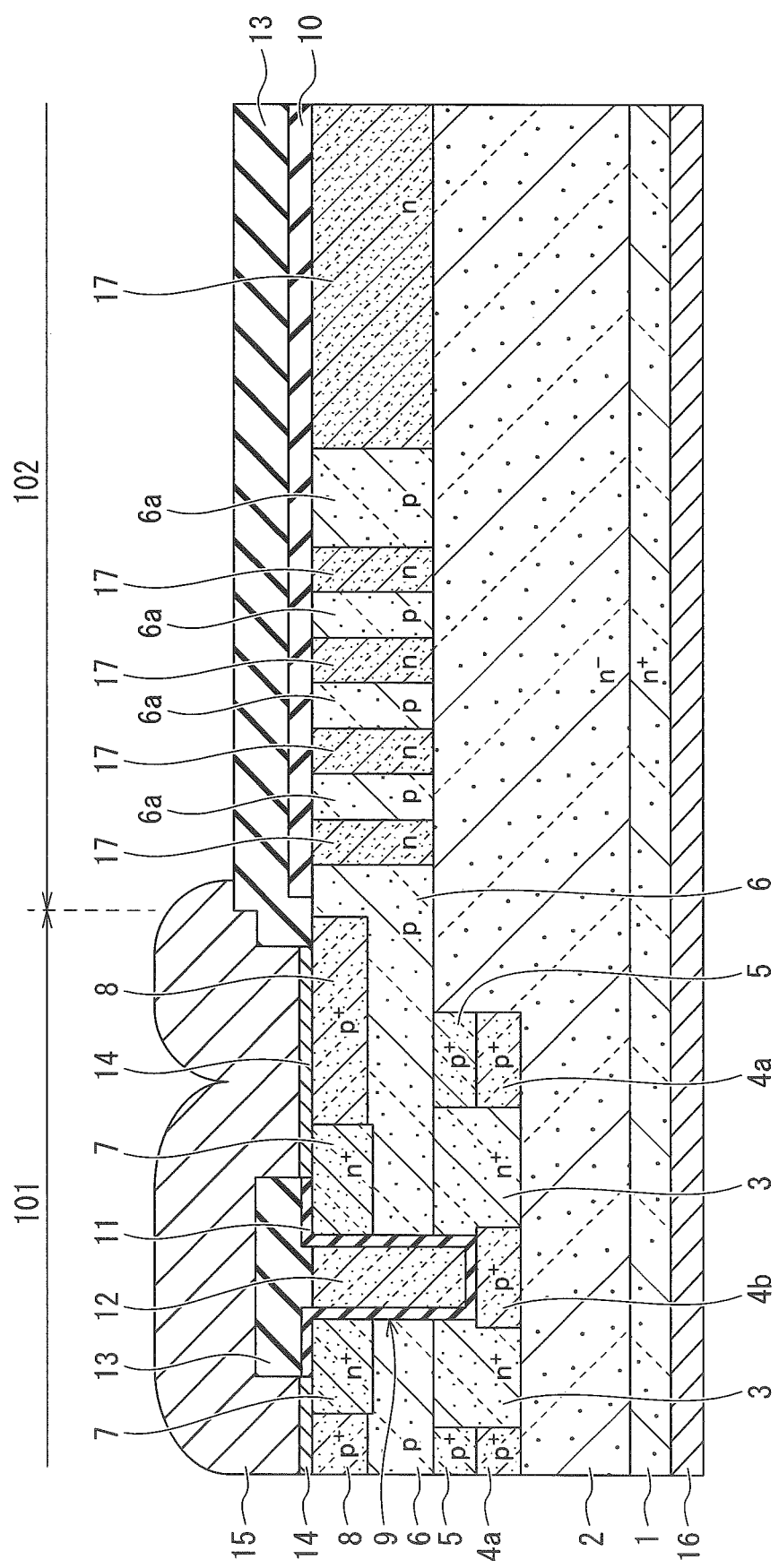
FIG. 2 is a schematic cross-sectional view taken along the line II-II in FIG. 1.

As illustrated in FIG. 1, an SiC semiconductor device (semiconductor chip) 100 according to a first embodiment of the present invention includes an active area 101 and an outer-edge area 102. For example, the active area 101 has a rectangular planar shape, and the outer-edge area 102 is arranged around the active area 101 so as to surround the active area 101. FIG. 2 is a cross-sectional view taken from the direction taken along the line II-II in FIG. 1. As illustrated in FIG. 2, the active area 101 includes an active element and the outer-edge area 102 includes an edge-termination structure. FIG. 2 illustrates a case including a MOSFET having a trench gate structure provided on a first conductivity type (n⁻-type) drift layer 2 as the active element and a plurality of electric-field relaxation regions (guard rings) 6a as the edge-termination structure.

As illustrated in FIG. 2, a second conductivity type (p-type) base region 6 is arranged on a top surface of the drift layer 2. The drift layer 2 and the base region 6 are provided by epitaxial growth layers (hereinafter, referred to as "epitaxial layers") made of SiC. A p⁺-type base contact region 8 having a higher impurity concentration than the base region 6 is selectively provided on the base region 6. An n⁺-type first main region (source region) 7 having a higher impurity concentration than the drift layer 2 is selectively provided on the base region 6 so as to be in contact with the base contact region 8.

For example, the impurity concentration of the drift layer 2 is $1\times10^{14}$ cm$^{-3}$ or more and $1\times10^{16}$ cm$^{-3}$ or less, and the impurity concentration of the base region 6 is $1\times10^{17}$ cm$^{-3}$ or more and $1\times10^{18}$ cm$^{-3}$ or less. The impurity concentration of the base contact region 8 is $5\times10^{18}$ cm$^{-3}$ or more and $5\times10^{20}$ cm$^{-3}$ or less, and the impurity concentration of the source region 7 is $5\times10^{18}$ cm$^{-3}$ or more and $5\times10^{20}$ cm$^{-3}$ or less.

A trench (first groove) 9 having a width of 1 µm or less is provided so as to penetrate the base region 6 from the top surfaces of the source region 7 and the base region 6. That is, the source regions 7 and the base region 6 are in contact with an outer sidewall of the trench 9. A gate insulating film 11 is provided on a bottom surface and a sidewall inside the trench 9. A gate electrode 12 is embedded in the trench 9 via the gate insulating film 11 to form an insulated-gate electrode-structure (11, 12). For the gate insulating film 11, in addition to a silicon oxide ($SiO_2$) film, a dielectric film, such as a silicon oxynitride (SiON) film, a strontium oxide (SrO) film, a silicon nitride ($Si_3N_4$) film, an aluminum oxide ($Al_2O_3$) film, a magnesium oxide (MgO) film, an yttrium oxide ($Y_2O_3$) film, a hafnium oxide ($HfO_2$) film, a zirconium oxide ($ZrO_2$) film, a tantalum oxide ($Ta_2O_5$) film, and a bismuth oxide ($Bi_2O_3$) film, may be adopted. Moreover, a single-layer film of any one of the above-mentioned dielectric films or a composite film in which the plural dielectric films are laminated, may be used. For a material of the gate electrode 12, for example, a polysilicon layer doped with impurities, such as phosphorus (P), boron (B) and the like, at a high concentration, that is a doped polysilicon layer, may be used.

An n$^+$-type current spreading layer (CSL) 3 having a higher impurity concentration than the drift layer 2 is selectively provided on the drift layer 2. The bottom of the trench 9 reaches the current spreading layer 3. The current spreading layer 3 does not necessarily have to be provided. When the current spreading layer 3 is not provided, the bottom of the trench 9 reaches the drift layer 2. A p$^+$-type gate-bottom protection region 4b is provided in the current spreading layer 3 so as to be in contact with the bottom of the trench 9. In the current spreading layer 3, a first base-bottom embedded region 4a is provided below the base contact region 8 at the same level of depth as the gate-bottom protection region 4b and away from the gate-bottom protection region 4b. A second base-bottom embedded region 5 is provided in an upper portion of the current spreading layer 3 so as to be in contact with a top surface of the first base-bottom embedded region 4a and a bottom surface of the base region 6. The second base-bottom embedded region 5 is also provided below the base contact region 8.

An interlayer insulating film 13 is arranged on the top surface of the gate electrode 12. For the interlayer insulating film 13, a silicon oxide film to which boron (B) and phosphorus (P) are doped, that is BPSG, may be used. However, for the interlayer insulating film 13, a silicon oxide film to which phosphorus (P) is doped, that is PSG, a non-doped $SiO_2$ film called "NSG", in which phosphorus (P) or boron (B) is not added, a silicon oxide film to which boron (B) is doped, that is BSG, a $Si_3N_4$ film, or the like, may be used. Alternatively, a composite film in which the above-mentioned films are laminated, may be adopted.

A source contact layer 14 is provided so as to physically contact the source region 7 and the base contact region 8, which are exposed between the interlayer insulating films 13. A first main electrode (source electrode) 15 is provided so as to cover the interlayer insulating film 13 and the source contact layer 14. A barrier metal layer (not shown) may be provided between the interlayer insulating film 13 and the first main electrode (source electrode) 15, and between the source contact layer 14 and the first main electrode (source electrode) 15. The first main electrode (source electrode) 15 is electrically connected to the source region 7 and the base contact region 8 via the barrier metal layer and the source contact layer 14. For example, a nickel silicide ($NiSi_x$) film for the source contact layer 14, a titanium nitride (TiN) film or a titanium (Ti) film for the barrier metal layer, and an aluminum (Al) film or an aluminum-silicon (Al—Si) film for the source electrode 15 may be adopted. The source electrode 15 is arranged to be separated from a gate surface electrode (not shown). Although not shown, a gate electrode pad (not shown) arranged on a top surface of a field insulating film 10 is electrically connected to the gate electrode 12.

An n$^+$-type second main region (drain region) 1 is arranged on a bottom surface of the drift layer 2. A second main electrode (drain electrode) 16 is arranged on a bottom surface of the drain region 1. For the drain electrode 16, for example, a single-layer film made of gold (Au) or a metal film in which Ti, nickel (Ni), and Au are laminated in this order may be used, and further a metal film, such as molybdenum (Mo), tungsten (W) or the like, may be laminated as the lowermost layer of the drain electrode 16. Further, a drain contact layer may be provided between the drain region 1 and the drain electrode 16. The drain contact layer may be a nickel silicide ($NiSi_x$) film, for example.

The impurity concentration of the current spreading layer 3 is $5\times10^{16}$ cm$^{-3}$ or more and $3\times10^{18}$ cm$^{-3}$ or less, and the impurity concentration of the first base-bottom embedded region 4a and the gate-bottom protection region 4b is $1\times10^{18}$ cm$^{-3}$ or more and $1\times10^{19}$ cm$^{-3}$ or less. The impurity concentration of the second base-bottom embedded region 5 is $1\times10^{18}$ cm$^{-3}$ or more and $1\times10^{19}$ cm$^{-3}$ or less. The impurity concentration in the drain region 1 is $1\times10^{18}$ cm$^{-3}$ or more and $1\times10^{19}$ cm$^{-3}$ or less.

In the semiconductor device according to the first embodiment, a structure having the drain region 1 implemented by the semiconductor substrate made of SiC or the SiC substrate and the drift layer 2 implemented by the epitaxial layer made of SiC or the SiC layer, is exemplified. The semiconductor regions implementing the semiconductor device according to the first embodiment which include the drain region 1 and the drift layer 2 is not limited to SiC. In addition to SiC, a hexagonal semiconductor material having the forbidden bandgap wider than 1.1 eV of Si, such as gallium nitride (GaN), lonsdaleite (hexagonal diamond), aluminum nitride (AlN) and the like, may be used. As for values of the forbidden bandgaps at room temperature, 3.26 eV for 4H-SiC, 3.02 eV for 6H-SiC, 3.4 eV for GaN, 5.5 eV for diamond and 6.2 eV for AlN, are reported respectively. In the present invention, a semiconductor having a forbidden bandgap larger than that of silicon may be defined as a wide bandgap semiconductor.

During operation of the semiconductor device according to the first embodiment, a positive voltage is applied to the drain electrode 16 with the source electrode 15 as the ground potential and a positive voltage equal to or higher than the threshold value is applied to the gate electrode 12. Thus, an inversion layer (a channel) is induced in the base region 6 at the sidewall of the trench 9 to turn on the semiconductor device. The inversion layer is formed on the side surface of the base region 6 located on the sidewall of the trench 9 as an interface between the gate dielectric film 11 and the base region 6 where the base region 6 faces the gate electrode 12.

In the on-state, a current flows from the drain electrode 16 to the source electrode 15 via the drain region 1, the drift layer 2, the current spreading layer 3, the inversion layer in the base region 6, and the source region 7. On the other hand, when the voltage applied to the gate electrode 12 is less than the threshold value, the inversion layer is not induced in the base region 6. Thus, the semiconductor device is turned off and no current flows from the drain electrode 16 to the source electrode 15.

As illustrated in FIG. 2, in the outer-edge area 102, a plurality of n-type separation regions 17 which penetrate through the p-type base region 6 extending from the active area 101 into to the n-type drift layer 2, are provided. The separation regions 17 have concentric ring shapes so as to surround the active area 101. Portions of the p-type base region 6 sandwiched between the adjacent separation regions 17 implement the plural p-type electric-field relaxation regions (guard rings) 6a. Therefore, the guard rings 6a and the separation regions 17 are alternately provided in contact with each other. The impurity concentration of the second conductivity type or p-type impurities contained in each of the p-type base region 6, the guard ring 6a, and separation region 17 is the same. The p-type electric-field relaxation regions (guard rings) 6a are provided in the concentric ring shape separated from each other by the separation regions 17. The p-type impurity concentration of each of the guard rings 6a is $1 \times 10^{17}$ cm$^{-3}$ or more and $1 \times 10^{18}$ cm$^{-3}$ or less. Each of the separation regions 17 is a co-doped region formed by doping the n-type impurities to the base region 6 containing the p-type impurities. Thus, in the co-doped region, the p-type impurity concentration is $1 \times 10^{17}$ cm$^{-3}$ or more and $1 \times 10^{18}$ cm$^{-3}$ or less and the n-type impurity concentration is $1 \times 10^{17}$ cm$^{-3}$ or more and $3 \times 10^{18}$ cm$^{-3}$ or less. Although the n-type separation region 17 is illustrated in FIG. 2, the separation region 17 may be a p-type. When there is a difference in the p-type impurity concentrations between the guard ring 6a and the separation region 17, it is possible to mitigate the electric field crowding. The interlayer insulating film 13 extending from the active area 101 is provided on the top surfaces of the guard ring 6a and the separation regions 17 via the field insulating film 10.

In the outer end of the outer-edge area 102, an n$^+$-type channel stopper may be provided concentrically on an upper portion of an outermost separation region 17. In addition, a p$^+$-type channel stopper may be provided instead of the n$^+$-type channel stopper.

In the semiconductor device according to the first embodiment, n-type impurities are selectively doped to the p-type base region 6 extending from the active area 101 to the outer-edge area 102 to form the separation regions 17 each having the concentric ring-shape. The portions of the base region 6 which is the p-type epitaxial layer, left between the adjacent separation regions 17 implement the p-type guard rings 6a each having the concentric ring shape. The semiconductor device according to the first embodiment does not require a mesa-groove-forming process, and the guard rings 6a can be provided by forming the separation regions 17 by implantation of the n-type impurity ions. As described above, the semiconductor device according to the first embodiment has a simple configuration, and the manufacturing process can be simplified. Since the implantation of p-type impurity ions requires high-temperature ion-implantation in order to improve the implantation efficiency, a photoresist film cannot be used as an ion-implantation mask, and an oxide film and the like is required as a mask material. On the other hand, since the implantation of n-type impurity ions is possible even at room temperature, a photoresist film can be used as an ion-implantation mask. As described above, it is not necessary to deposit an oxide film and the like, and the guard-ring-forming process can be shortened. Further, in the photolithography technique, it is possible to miniaturize a photoresist pattern. Further, since the active area 101 and the outer-edge area 102 may be flat, the photoresist pattern can be further miniaturized, and the patterns of the guard rings 6a formed on the outer-edge area 102 can be reduced. Thus, it is possible to increase the current capacity by to increasing in a dimension of the active area and to reduce the size of the semiconductor chip. As described above, the man-hours of the guard-ring-forming process and the mesa-groove-forming process can be reduced, and it is possible to shorten the manufacturing time of the semiconductor device and to reduce the manufacturing cost.

<Manufacturing Method of Semiconductor Device>

Next, a manufacturing method of the SiC semiconductor device according to the first embodiment will be given by taking a trench gate MOSFET as an example, with reference to the cross-sectional views of FIGS. 3 to 14. Note that the manufacturing method of the trench gate MOSFET described below is merely an example and may be achieved by various other manufacturing methods including a modification as long as the gist described in the claims is included.

Figure 3:
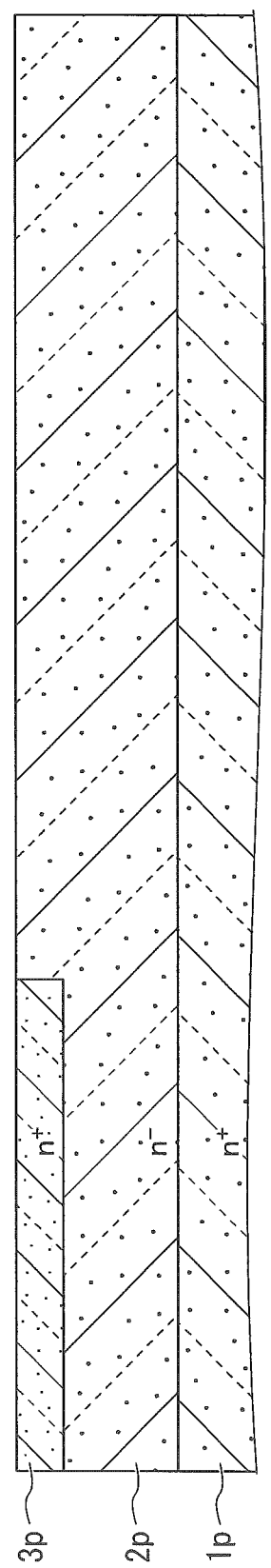
FIG. 3 is a schematic cross-sectional view illustrating an example of a process in a manufacturing method of the semiconductor device according to the first embodiment of the present invention.

First, an n$^+$-type SiC semiconductor substrate (substrate) 1p in which n-type impurities such as nitrogen (N) are doped, is prepared. As illustrated in FIG. 3, the n$^-$-type drift layer 2p is epitaxially grown on a top surface of the substrate 1p. Then, a photoresist film is applied to a top surface of the drift layer 2p, and a mask pattern is delineated to the photoresist film by photolithography technique and the like. The delineated photoresist film is used as an ion-implantation mask to selectively implant n-type impurity ions, such as nitrogen (N) and the like, from the upper side of the drift layer 2p in the active area 101 of the drift layer 2. Thus, the n-ion implanted layer 3p is formed on an upper portion of the drift layer 2p of the active area 101.

Figure 4:
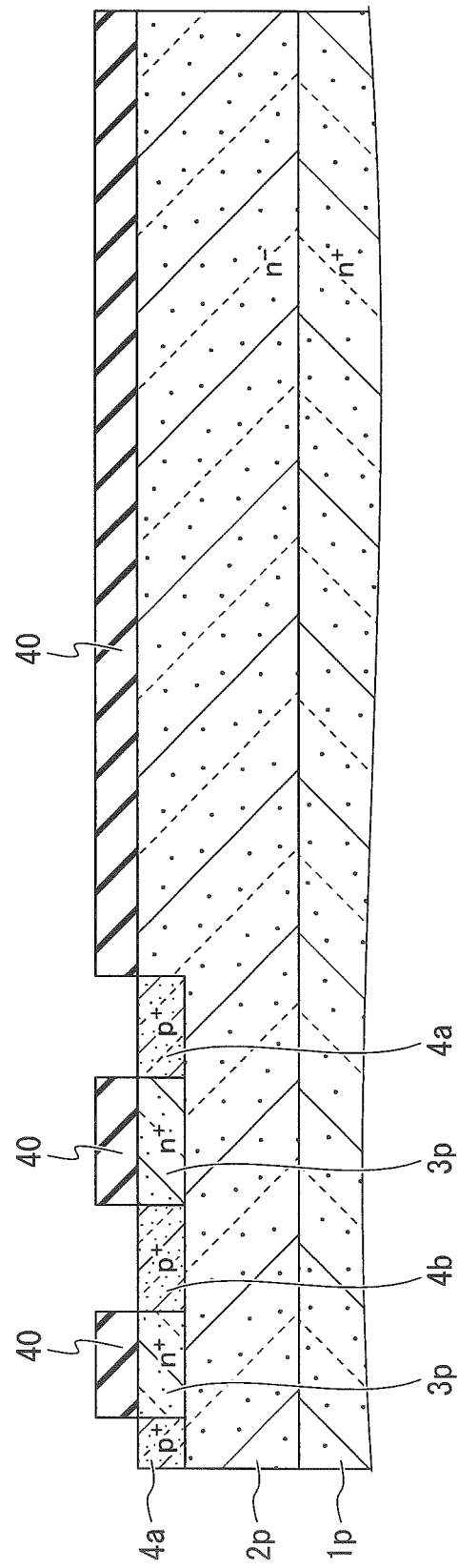
FIG. 4 is a schematic cross-sectional view illustrating an example of a process following FIG. 3 in the manufacturing method of the semiconductor device according to the first embodiment of the present invention.

An oxide film made of SiO$_2$ is deposited on the top surfaces of the n-ion implanted layer 3p and the drift layer 2p by CVD technique and the like. A photoresist film is applied to the top surface of the oxide film, and a mask pattern is delineated to the oxide film by photolithography technique, dry etching technique and the like. Using the delineated oxide film 40 as an ion-implantation mask, p-type impurity ions, such as aluminum (Al) and the like, are implanted into the n-ion implanted layer 3p by multiple-energy ion implantation. As a result, as illustrated in FIG. 4, the first base-bottom embedded region 4a and the gate-bottom protection region 4b are selectively formed on an upper portion of the n-ion implanted layer 3p.

Figure 5:
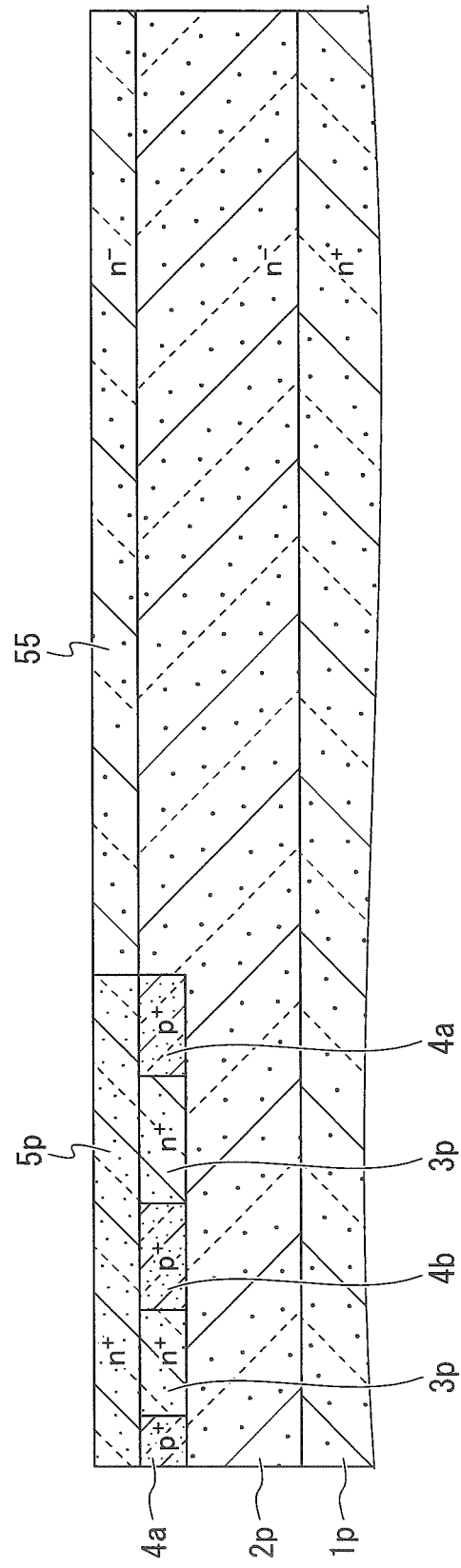
FIG. 5 is a schematic cross-sectional view illustrating an example of a process following FIG. 4 in the manufacturing method of the semiconductor device according to the first embodiment of the present invention.

After removing the oxide film 40, an n-type epitaxial layer 55 is grown on top surfaces of the n-ion implanted layer 3p, the first base-bottom embedded region 4a, the gate-bottom protection region 4b and the drift layer 2p. A photoresist film is applied to a top surface of the epitaxial layer 55, and a mask pattern is delineated to the photoresist film by photolithography technique and the like. Using the delineated photoresist film as an ion-implantation mask, n-type impurity ions, such as nitrogen (N) and the like, are selectively implanted into the upper portion of the epitaxial layer 55 from the upper side of the epitaxial layer 55 by multiple-energy ion implantation. As a result, as illustrated in FIG. 5, the n-ion implanted layer 5p is formed on the n-ion implanted layer 3p, the first base-bottom embedded region 4a and the gate-bottom protection region 4b. As will be described later, the n-ion implanted layer 3p and the n-ion implanted layer 5p implement the current spreading layer 3, and the impurity concentration of the n-ion implantation layer 5p is preferably higher than that of the n-ion implantation layer 3p.

Figure 6:
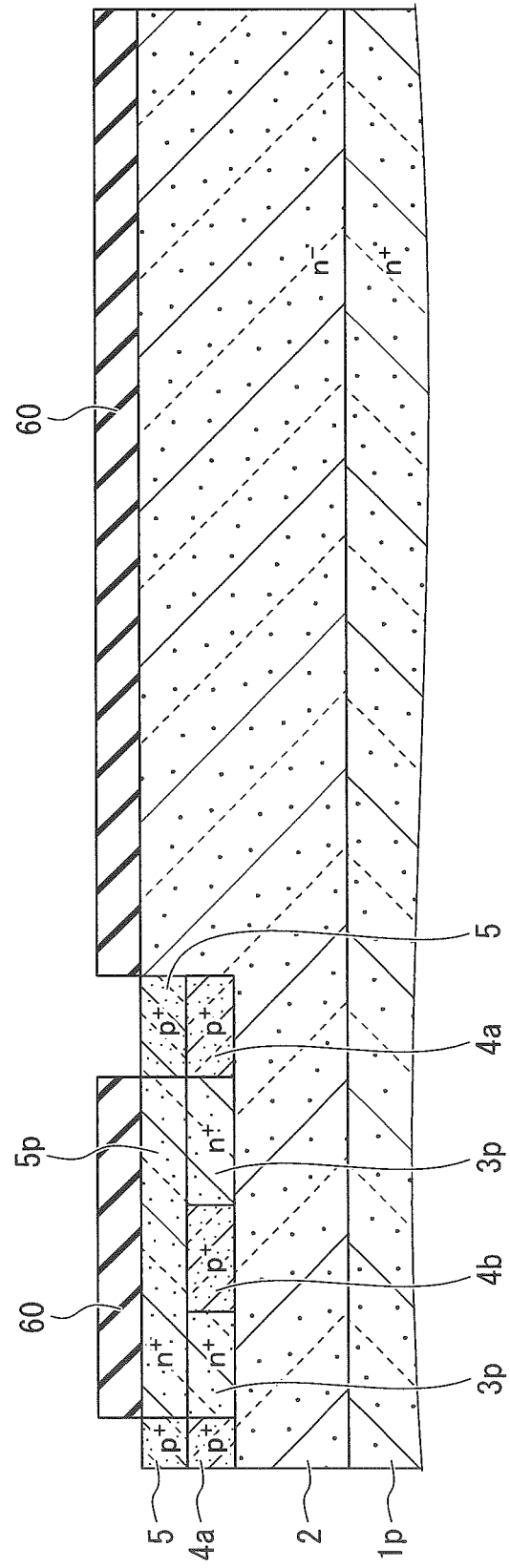
FIG. 6 is a schematic cross-sectional view illustrating an example of a process following FIG. 5 in the manufacturing method of the semiconductor device according to the first embodiment of the present invention.

Thereafter, an oxide film made of $SiO_2$ is deposited on the top surfaces of the n-ion implanted layer 5p and the epitaxial layer 55 by CVD technique and the like. A photoresist film is applied to a top surface of the oxide film, and a mask pattern is delineated to the photoresist film by photolithography technique, dry etching technique and the like. Using the delineated oxide film 60 as an ion-implantation mask, p-type impurity ions, such as aluminum (Al) and the like, are selectively implanted into the n-ion implanted layer 5p by multiple-energy ion implantation. As a result, as illustrated in FIG. 6, the second base-bottom embedded region 5 is selectively formed on the first base-bottom embedded region 4a. Further, the drift layer 2p and the epitaxial layer 55 implement the drift layer 2.

Figure 7:
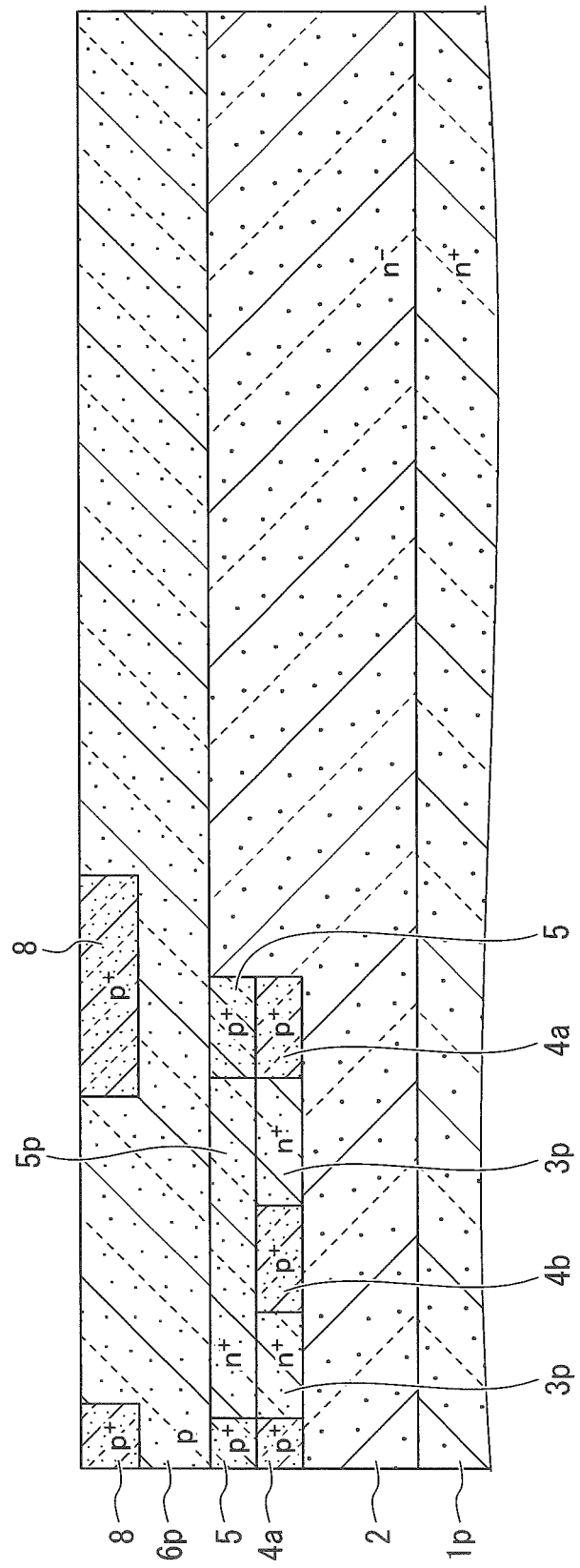
FIG. 7 is a schematic cross-sectional view illustrating an example of a process following FIG. 6 in the manufacturing method of the semiconductor device according to the first embodiment of the present invention.

After removing the oxide film 60, a p-type base region 6p is epitaxially grown on the top surfaces of the second base-bottom embedded region 5, the n-ion implanted layer 5p and the drift layer 2. An oxide film made of $SiO_2$ is deposited on a top surface of the base region 6p by CVD technique and the like. A photoresist film is applied to a top surface of the oxide film, and a mask pattern is delineated to the oxide film by photolithography technique, dry etching technique and the like. Using the delineated oxide film as an ion-implantation mask, p-type impurity ions, such as aluminum (Al) and the like, are selectively implanted into the base region 6p from the upper side of the base region 6p by multiple-energy ion implantation. As a result, as illustrated in FIG. 7, the base contact region 8 is formed on the top surfaces of the base region 6p above the second base-bottom embedded region 5 and the n-ion implanted layer 5p.

Figure 8:
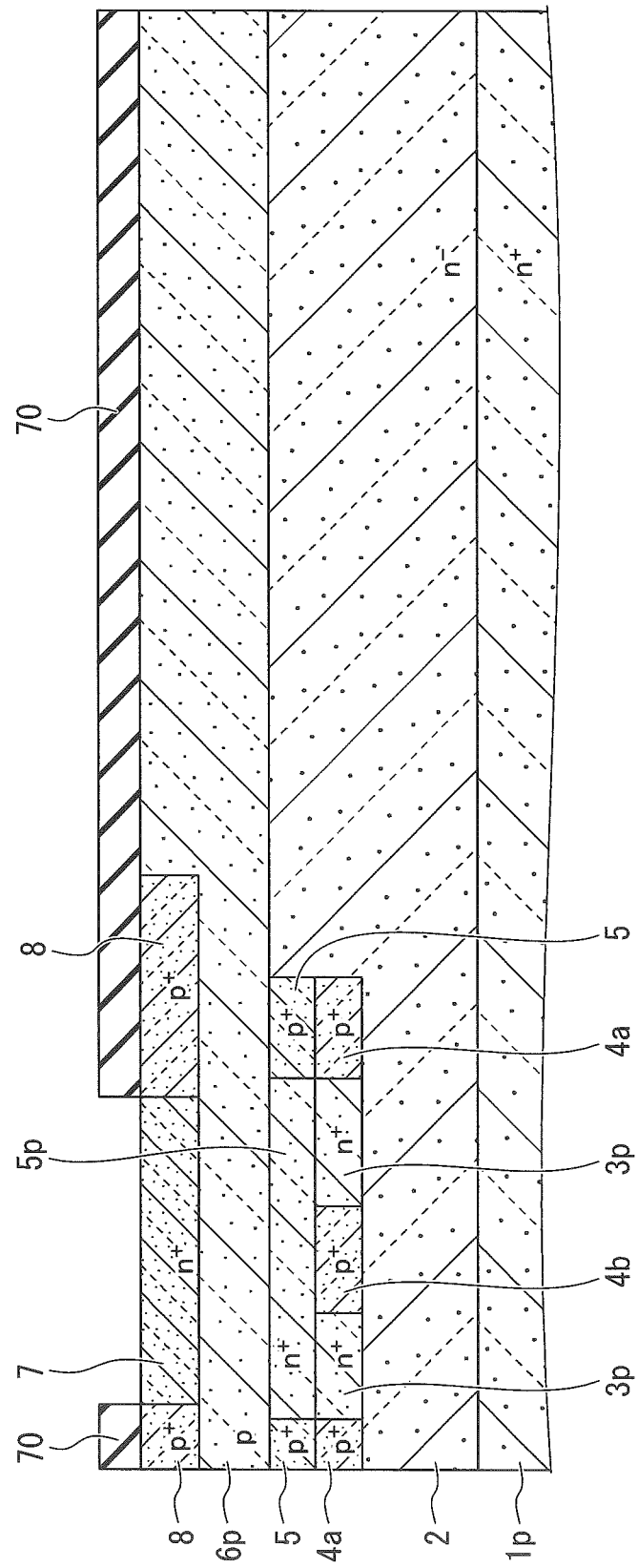
FIG. 8 is a schematic cross-sectional view illustrating an example of a process following FIG. 7 in the manufacturing method of the semiconductor device according to the first embodiment of the present invention.

After removing the oxide film used as the ion-implantation mask, an oxide film made of $SiO_2$ is deposited on the top surfaces of the base contact region 8 and the base region 6p by CVD technique or the like. A photoresist film is applied to a top surface of the oxide film, and a mask pattern is delineated to the oxide film by photolithography technique, dry etching technique and the like. Using the delineated oxide film 70 as an ion-implantation mask, n-type impurity ions, such as phosphorus (P) and the like, are selectively implanted into the base region 6p from the upper side of the base region 6p by multiple-energy ion implantation. As a result, as illustrated in FIG. 8, the source region 7 is formed on the top surface of the base region 6p above the n ion implanted layer 5p.

Figure 9:
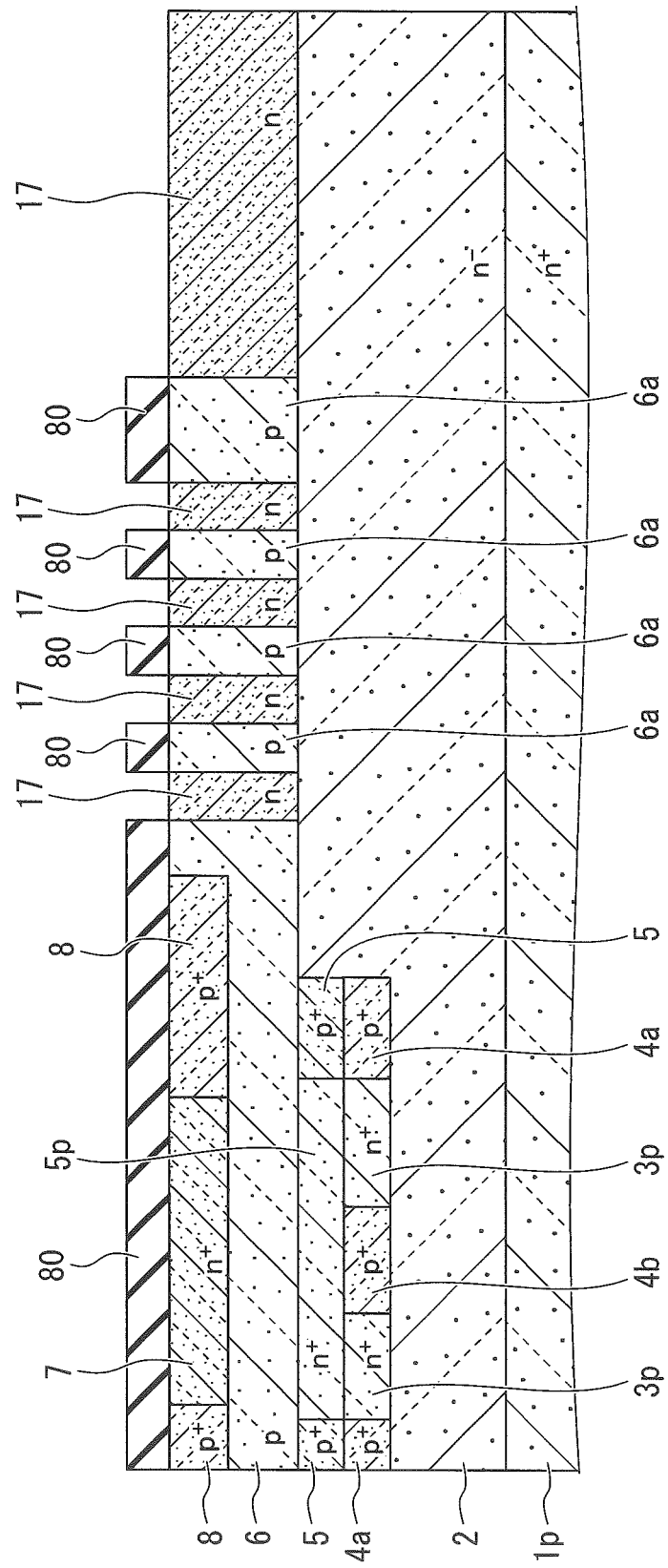
FIG. 9 is a schematic cross-sectional view illustrating an example of a process following FIG. 8 in the manufacturing method of the semiconductor device according to the first embodiment of the present invention.

After removing the oxide film 70 used as the ion-implantation mask, a photoresist film is applied to the top surfaces of the base contact region 8, the source region 7 and the base region 6p, and a mask pattern is delineated to the photoresist film by photolithography technique and the like. Using the delineated photoresist film 80 as an ion-implantation mask, n-type impurity ions, such as nitrogen (N) and the like, are selectively implanted in the base region 6p from the upper side of the base region 6p by multiple-energy ion implantation so as to reach the drift layer 2 through the base region 6p. As a result, the plural n-type separation regions 17 are provided in the base region 6p of the outer-edge area 102. As illustrated in FIG. 9, portions of the base region 6p sandwiched between the separation regions 17 implement the plural p-type guard rings 6a, which are separated from each other and formed in the concentric ring shapes. That is, the guard rings 6a and the separation regions 17 are alternately provided in contact with each other. Further, the base region 6p in the active area 101 implements the base region 6. Therefore, the impurity concentration of the second conductivity type (p-type) impurities contained in each of the p-type base region 6, the p-type guard ring 6a, and the n-type separation region 17 is the same.

After removing the photoresist film 80 used as the ion-implantation mask, an oxide film made of $SiO_2$ is deposited on the top surfaces of the base contact region 8, the source region 7 and the base region 6 by CVD technique and the like. A photoresist film is applied to a top surface of the oxide film, and a mask pattern is delineated to the oxide film by photolithography technique, dry etching technique and the like. Using the delineated oxide film 90 as an etching mask, the trench 9 is selectively formed by dry etching technique such as ICP-RIE and the like. The trench 9 penetrates the source region 7, the base region 6 and the n-ion implanted layer 5p to reach the gate-bottom protection region 4b. After removing the oxide film 90, a carbon (C) film is deposited on an exposed surface of the trench 9 by carbon sputtering technique and the like.

Figure 10:
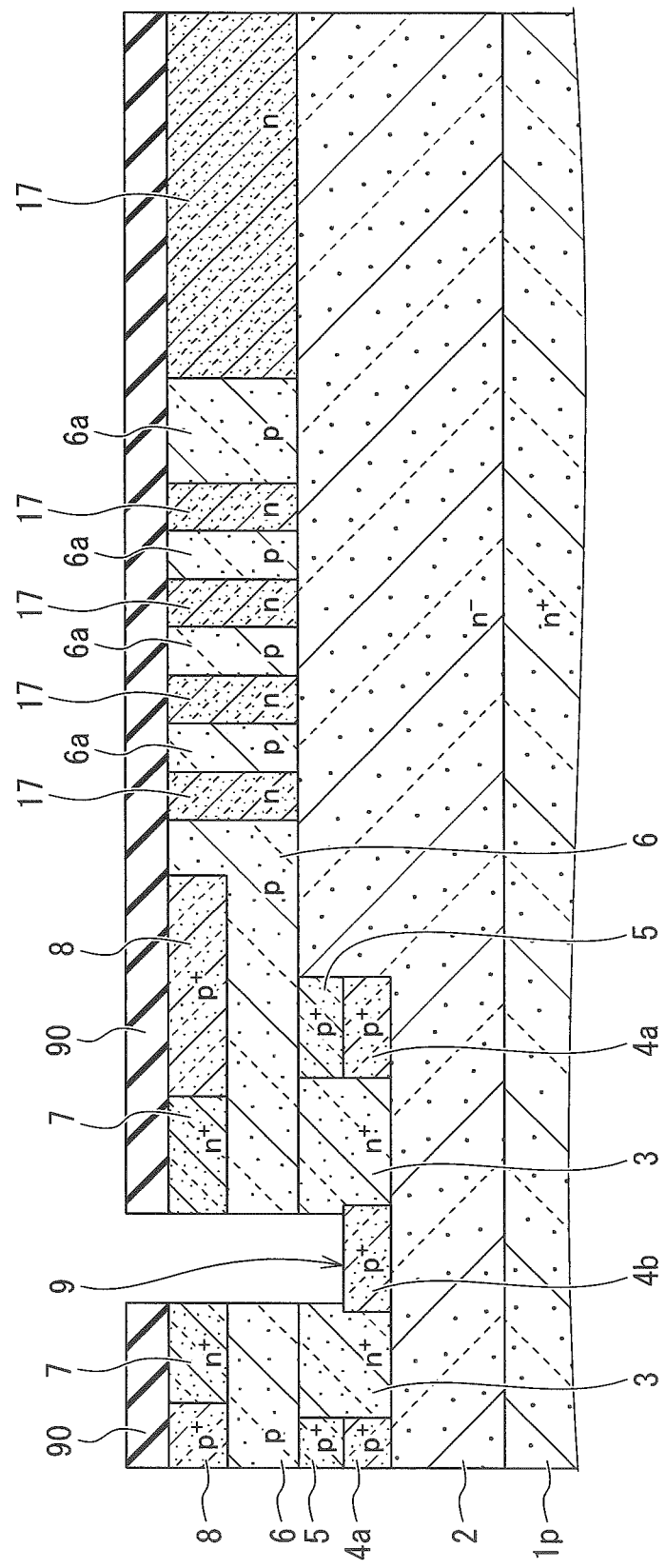
FIG. 10 is a schematic cross-sectional view illustrating an example of a process following FIG. 9 in the manufacturing method of the semiconductor device according to the first embodiment of the present invention.

Thereafter, the implanted n-type and p-type impurity ions are simultaneously activated by activation annealing. As a result, as illustrated in FIG. 10, the $n^+$-type current spreading layer 3 implemented by the n-ion implanted layer 3p and the n-ion implanted layer 5p is formed in the upper portion of the drift layer 2. The $p^+$-type first base-bottom embedded region 4a, the $p^+$-type second base-bottom embedded region 5 sandwiched between the first base-bottom embedded region 4a and the base region 6, and the $p^+$-type gate-bottom protection region 4b on the bottom of the trench 9 are formed in the current spreading layer 3. Further, the $n^+$-type source region 7 is formed on the top surface of the base region 6 so as to be in contact with the trench 9, and the $p^+$-type base contact region 8 is formed on the top surface of the base region 6 so as to be in contact with the source regions 7. Furthermore, the p-type guard rings 6a having the concentric ring shapes are formed on the outer-edge area 102 so as to be separated from each other by the n-type separation regions 17.

Figure 11:
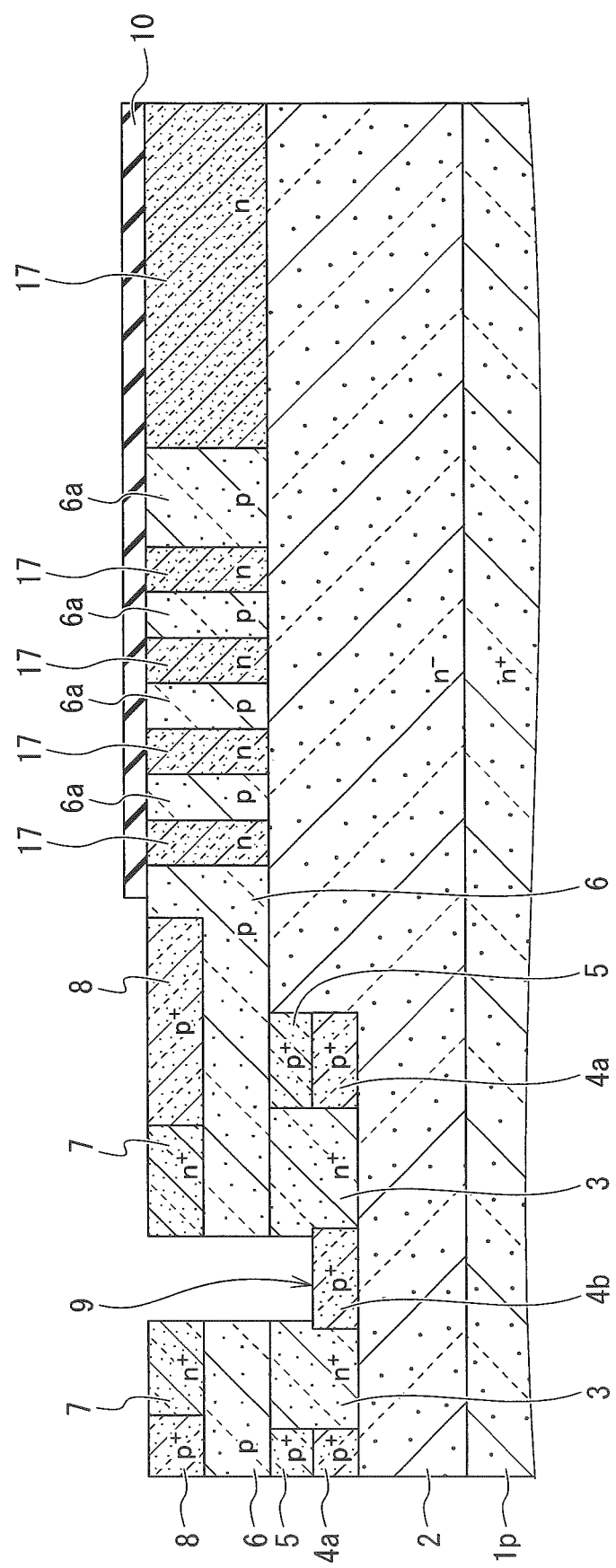
FIG. 11 is a schematic cross-sectional view illustrating an example of a process following FIG. 10 in the manufacturing method of the semiconductor device according to the first embodiment of the present invention.

A field oxide film is deposited on the exposed surface after removing the carbon film by CVD technique and the like. A photoresist film is applied to a top surface of the field oxide film, and a mask pattern is delineated to the photoresist film by photolithography technique, dry etching technique and the like. The delineated photoresist film is used as an etching mask to selectively remove the field oxide film. As a result, as illustrated in FIG. 11, the field insulating film 10 is formed on top surfaces of the guard rings 6a and the separation regions 17.

Figure 12:
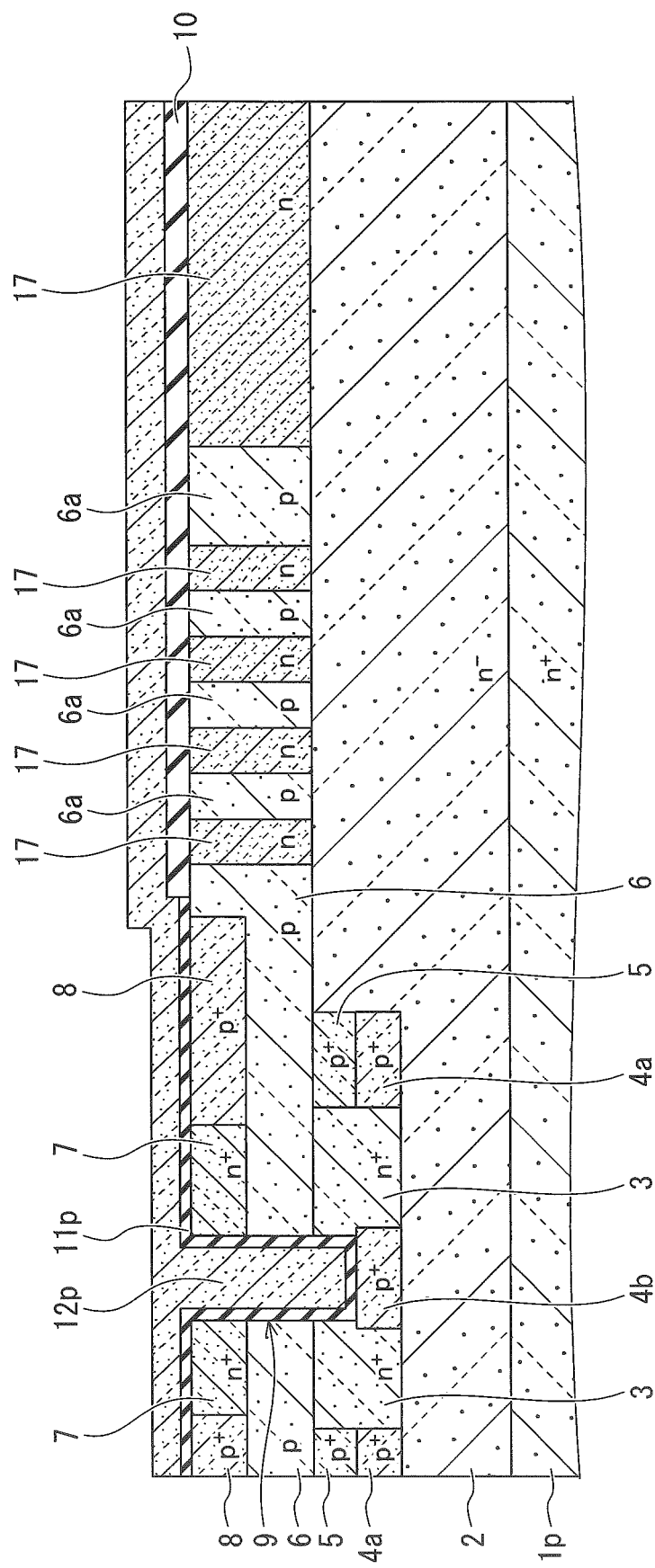
FIG. 12 is a schematic cross-sectional view illustrating an example of a process following FIG. 11 in the manufacturing method of the semiconductor device according to the first embodiment of the present invention.

As illustrated in FIG. 12, a gate insulating film 11p such as a $SiO_2$ film is formed on the bottom surface and sidewall of the trench 9, and the top surfaces of the source region 7 and the base contact region 8 by thermal oxidation method or chemical vapor deposition (CVD) technique. Then, a polysilicon layer (doped polysilicon layer) 12p in which impurities, such as phosphorus (P) and boron (B), are doped at a high concentration is deposited so as to fill the trench 9 by CVD technique and the like. As illustrated in FIG. 12, the polysilicon layer 12p extends so as to cover the top surface of the field insulating film 10 in the outer-edge area 102.

Figure 13:
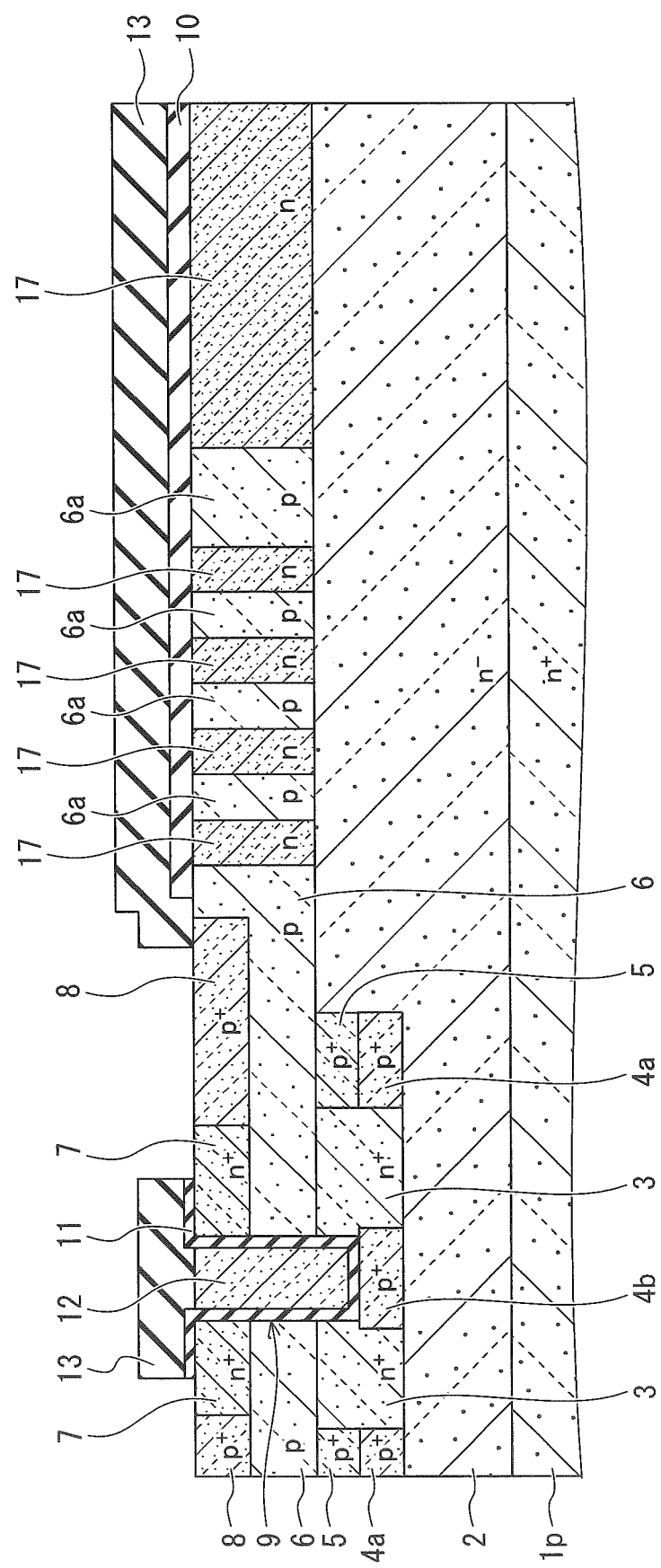
FIG. 13 is a schematic cross-sectional view illustrating an example of a process following FIG. 12 in the manufacturing method of the semiconductor device according to the first embodiment of the present invention.
Figure 14:
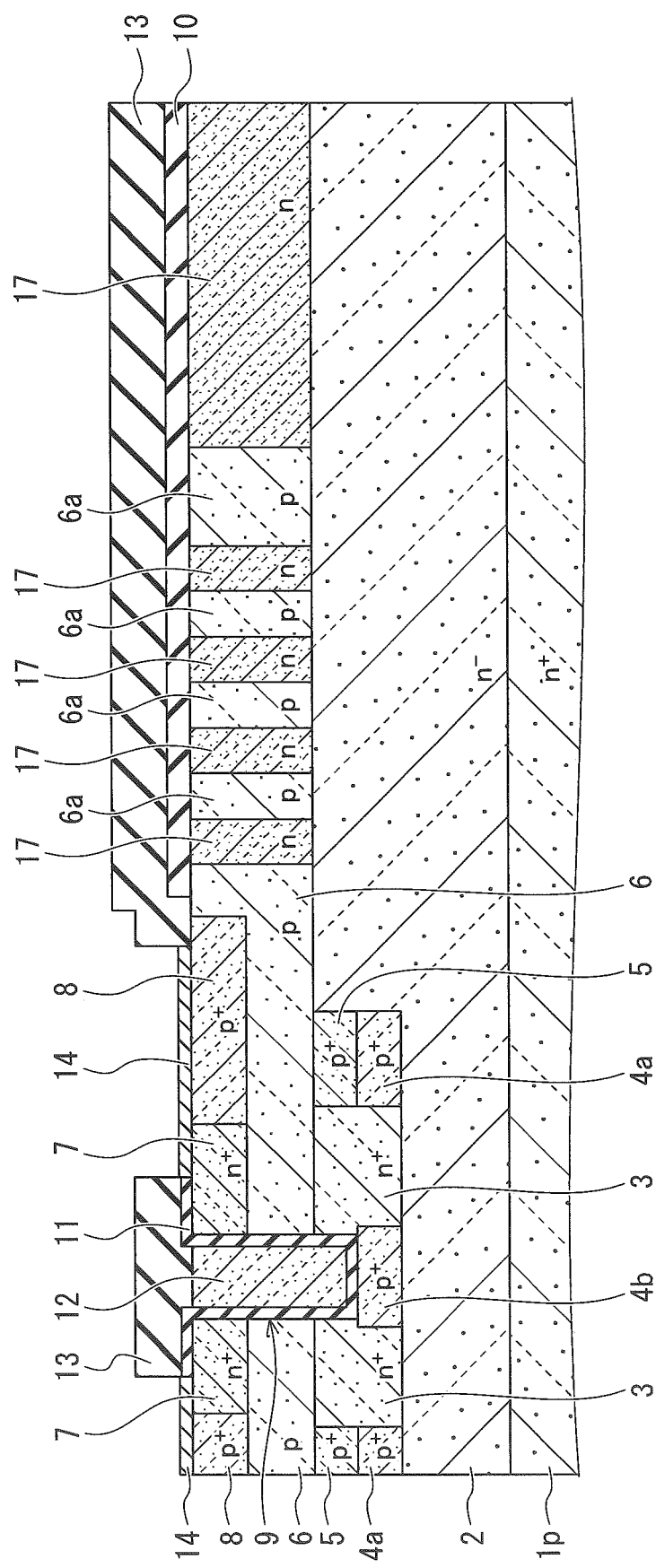
FIG. 14 is a schematic cross-sectional view illustrating an example of a process following FIG. 13 in the manufacturing method of the semiconductor device according to the first embodiment of the present invention.

Thereafter, a part of the polysilicon layer 12p and a part of the gate insulating film 11p are selectively removed by photolithography technique, dry etching technique and the like. As illustrated in FIG. 13, the insulated-gate electrode structure (11, 12) is formed by patterning the gate insulating film 11 and the gate electrode 12 of the polysilicon layer.

Then, an insulating film is deposited on a top surface of the insulated-gate electrode structure (11, 12) implemented by the gate electrode 12 and the gate insulating film 11 by CVD technique and the like. For the insulating film, boro-phospho silicate glass (BPSG), NSG and the like may be used. Then, a part of the deposited insulating film is selectively removed by photolithography technique, dry etching technique and the like. As a result, as illustrated in FIG. 13, the interlayer insulating film 13 in which a source electrode contact-hole is opened is formed. Although not illustrated, a gate contact-hole is also opened in the interlayer insulating film 13 so as to expose a part of the gate surface electrode connected to the gate electrode 12 at a position different from the source electrode contact-hole.

A metal layer, such as a Ni film and the like, is deposited by sputtering method, evaporation method and the like, and a pattern of the metal layer is delineated by photolithography technique, RIE technique and the like. Thereafter, a $NiSi_x$ film is formed by rapid thermal annealing (RTA) technique, for example, at about 1000° C. Then, the unreacted Ni film is removed to form the source contact layer 14 on the top surfaces of the source region 7 and the base contact region 8 illustrated in FIG. 14. Next, a barrier metal layer (not illustrated), such as a Ti film, a TiN film and the like, and a metal layer, such as an Al film and the like, are deposited by sputtering technique and the like, and the pattern of the barrier metal layer and the metal layer are delineated by photolithography technique, RIE technique and the like. As a result, a laminated structure of the barrier metal layer and the source electrode 15 is formed so as to cover the source contact layer 14 and the interlayer insulating film 13. Further, the patterns of the source electrode 15 and the gate surface electrode are separated, and the gate surface electrode is electrically connected to the gate electrode 12a via an interconnection layer (not illustrated) provided on the field insulating film 10.

Further, the bottom surface of the substrate 1p is polished by chemical mechanical polishing (CMP) technique and the like to adjust the thickness to form the drain region 1. Thereafter, the drain electrode 16 made of Ti, Ni, Au and the like is deposited on the entire bottom surface of the drain region 1 by sputtering method, evaporation method and the like. Thus, the trench gate semiconductor device illustrated in FIG. 2 is completed.

In the manufacturing method of the semiconductor device according to the first embodiment, the separation regions 17 are formed by implanting the n-type impurity ions into the base region 6 extending to the outer-edge area 102, and thus, the p-type guard rings 6a are formed to be separated from each other and in the concentric rings. In the conventional trench gate semiconductor device, the base region is removed by forming the mesa groove in the outer-edge area 102, and the p-type impurity ions are implanted into the exposed drift layer to form the guard rings. In the semiconductor device according to the first embodiment, the mesa-groove-forming process is not necessary, and the manufacturing process steps may be shortened. Further, the guard rings 6a can be provided by forming the separation regions 17 by the implantation of the n-type impurity ions. Since the implantation of the p-type impurity ions requires high-temperature ion-implantation in order to improve the implantation efficiency, a photoresist film cannot be used as an ion-implantation mask, and an oxide film and the like is required as a mask material. On the other hand, since the implantation of the n-type impurity ions can be executed even at room temperature, the photoresist film can be used as the ion-implantation mask. As described above, it is not necessary to deposit any oxide film and the like in the guard-ring-forming process, and the guard-ring-forming process can be shortened. In addition, in the photolithography technique, a fine photoresist pattern can be formed. And further, since the top surface from the active area 101 to the outer-edge area 102 may be flat, the photoresist pattern can be made further finer, and the patterns of the guard rings 6a formed on the outer-edge area 102 can be miniaturized. Thus, it is possible to increase the current capacity of the semiconductor chip and to reduce the size of the semiconductor chip. As described above, the man-hours of the guard-ring-forming process and the mesa-groove-forming process can be cut down, and it is possible to shorten the manufacturing time of the semiconductor device and to reduce the manufacturing cost.

In the above description, in order to form the guard rings 6a, the separation regions 17 are formed by ion-implantation so as to penetrate the base region 6 to reach the drift layer 2. When the capability of the ion-implanter is insufficient to allow ion-implantation through the base region 6, the base region 6 may be formed in multiple times, for example, twice, as follows.

Figure 15:
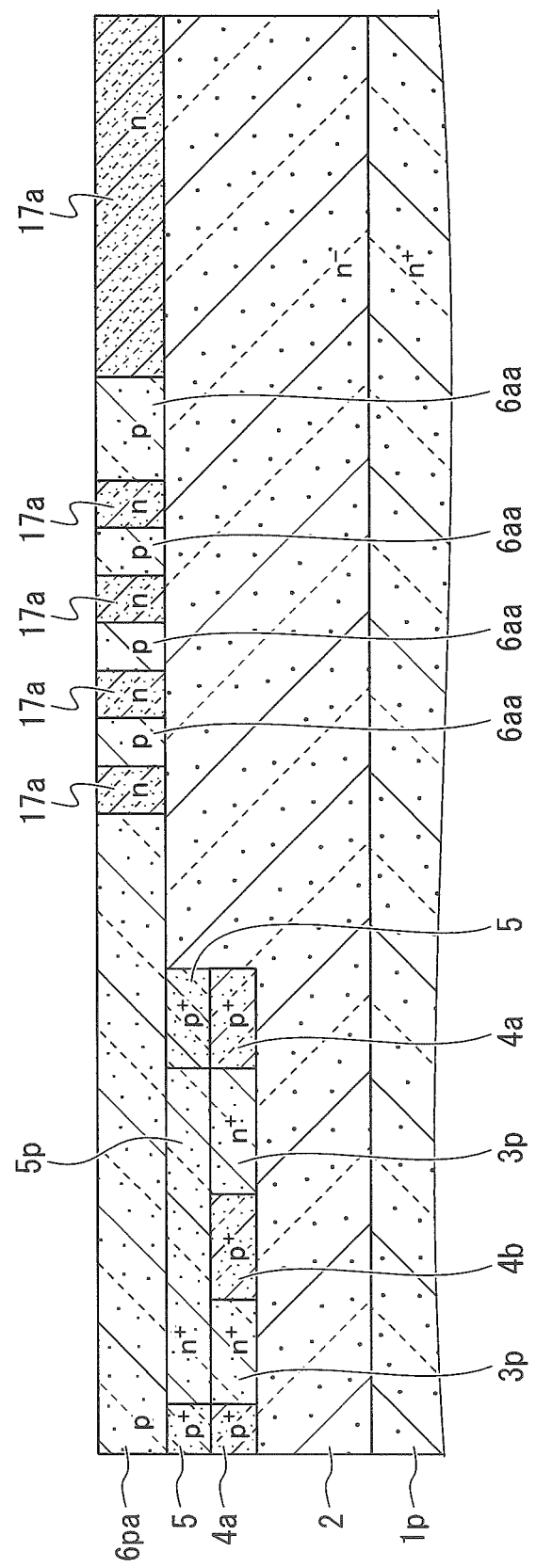
FIG. 15 is a schematic cross-sectional view illustrating an example of a process following FIG. 14 in the manufacturing method of the semiconductor device according to the first embodiment of the present invention.

For example, as illustrated in FIG. 6, the second base-bottom embedded region 5 is selectively formed on the first base-bottom embedded region 4a. Then, as illustrated in FIG. 15, a p-type first base region 6pa is epitaxially grown on the top surfaces of the second base-bottom embedded region 5, the n-ion implanted layer 5p and the drift layer 2. A photoresist film is applied to a top surface of the first base region 6pa, and a mask pattern is delineated to the photoresist film by photolithography technique and the like. Using the delineated photoresist film as the ion-implantation mask, n-type impurity ions, such as nitrogen (N) and the like, are selectively implanted in the first base region 6pa from the upper side of the first base region 6pa by multiple-energy ion implantation in the first base region 6pa to reach the drift layer 2. As a result, as illustrated in FIG. 15, a plurality of n-type first separation regions 17a are formed in the first base region 6pa in the outer-edge area 102, and a plurality of p-type first guard rings 6aa are formed to be separated from each other and in the concentric ring shapes.

Figure 16:
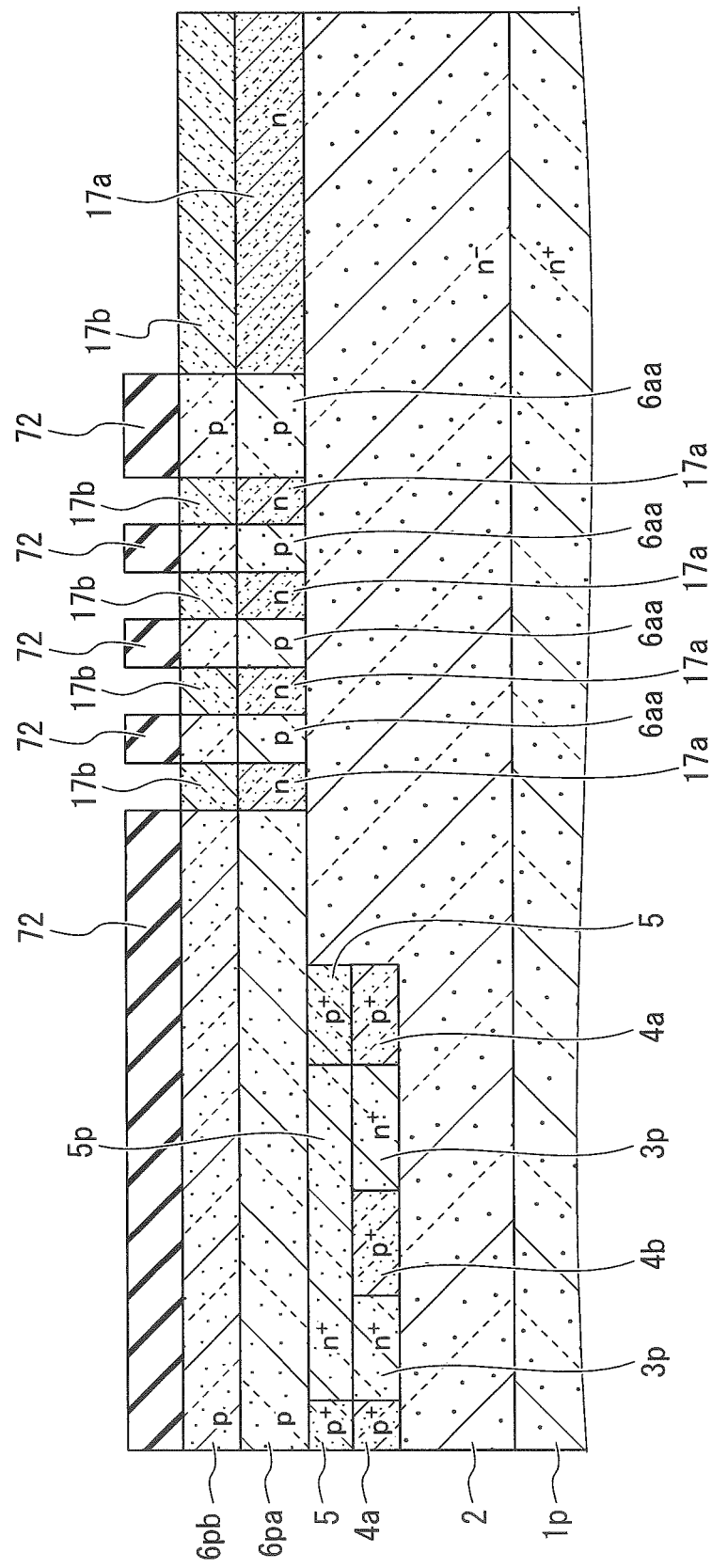
FIG. 16 is a schematic cross-sectional view illustrating an example of a process following FIG. 15 in the manufacturing method of the semiconductor device according to the first embodiment of the present invention.

After removing the photoresist film used as the ion-implantation mask, a p-type second base region 6pb is epitaxially grown on top surfaces of the first base region 6pa, the first guard rings 6aa and the first separation regions 17a. A photoresist film is applied to a top surface of the first base region 6pb, and a mask pattern is delineated to the photoresist film by photolithography technique and the like. Using the delineated photoresist film 72 as an ion-implantation mask, n-type impurity ions such as nitrogen (N) are selectively implanted in the second base region 6pb from the upper side of the second base region 6pb by multi-energy ion implantation to reach the first separation regions 17a. As a result, as illustrated in FIG. 16, a plurality of n-type second separation regions 17b are formed to be in contact with the first separation regions 17a in the second base region 6pb of the outer-edge area 102. Further, a plurality of p-type second guard rings 6ab are formed to be separated from each other and in the concentric ring shapes, to be in contact with the first guard rings 6aa.

After removing the photoresist film 72, the base region 6p implemented by the first and second base regions 6pa, 6pb, the guard rings 6a implemented by the first and second guard rings 6aa, 6ab, and separation regions 17 implemented by the first and second separation regions 17a, 17b are formed, respectively. An oxide film made of $SiO_2$ is deposited on the top surfaces of the base region 6p, the guard rings 6a and the separation regions 17 by CVD technique and the like. A photoresist film is applied to a top surface of the oxide film, and a mask pattern is delineated to the oxide film by photolithography technique, dry etching technique and the like. Using the delineated oxide film as an ion-implantation mask, p-type impurity ions such as aluminum (Al) are selectively implanted into the base region 6p from the upper side of the base region 6p. As a result, the base contact region 8 is formed on the top surface of the base region 6p above the second base-bottom embedded region 5 and the n-ion implanted layer 5p.

Figure 17:
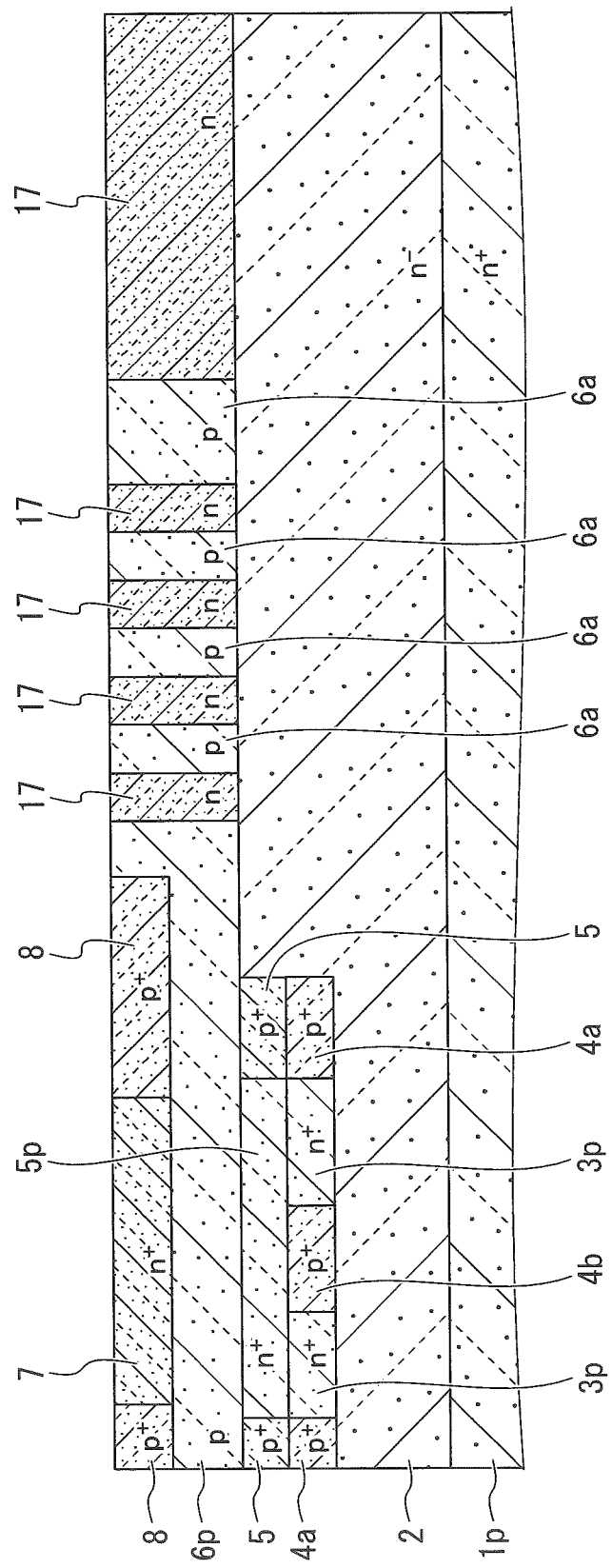
FIG. 17 is a schematic cross-sectional view illustrating an example of a process following FIG. 16 in the manufacturing method of the semiconductor device according to the first embodiment of the present invention.

After removing the oxide film used as the ion-implantation mask, an oxide film made of $SiO_2$ is deposited on the top surfaces of the base contact region 8 and the base region 6p by CVD technique and the like. A photoresist film is applied to a top surface of the oxide film, and a mask pattern is delineated to the oxide film by photolithography technique, dry etching technique and the like. Using the delineated oxide film as an ion-implantation mask, n-type impurity ions such as phosphorus (P) are selectively implanted into the base region 6p from the upper side of the base region 6p. As a result, as illustrated in FIG. 17, the source region 7 is formed on the top surface of the base region 6p above the n-ion implanted layer 5p. Subsequent processes are the same as the processes illustrated in FIGS. 10 to 14, so duplicate description will be omitted. When forming a channel stopper at the outer end portion of the outer-edge area 102, the channel stopper may be formed by ion-implantation into the outer end portion during the processes of forming the base contact region 8 or the source region 7.

(First Modification)

Figure 18:
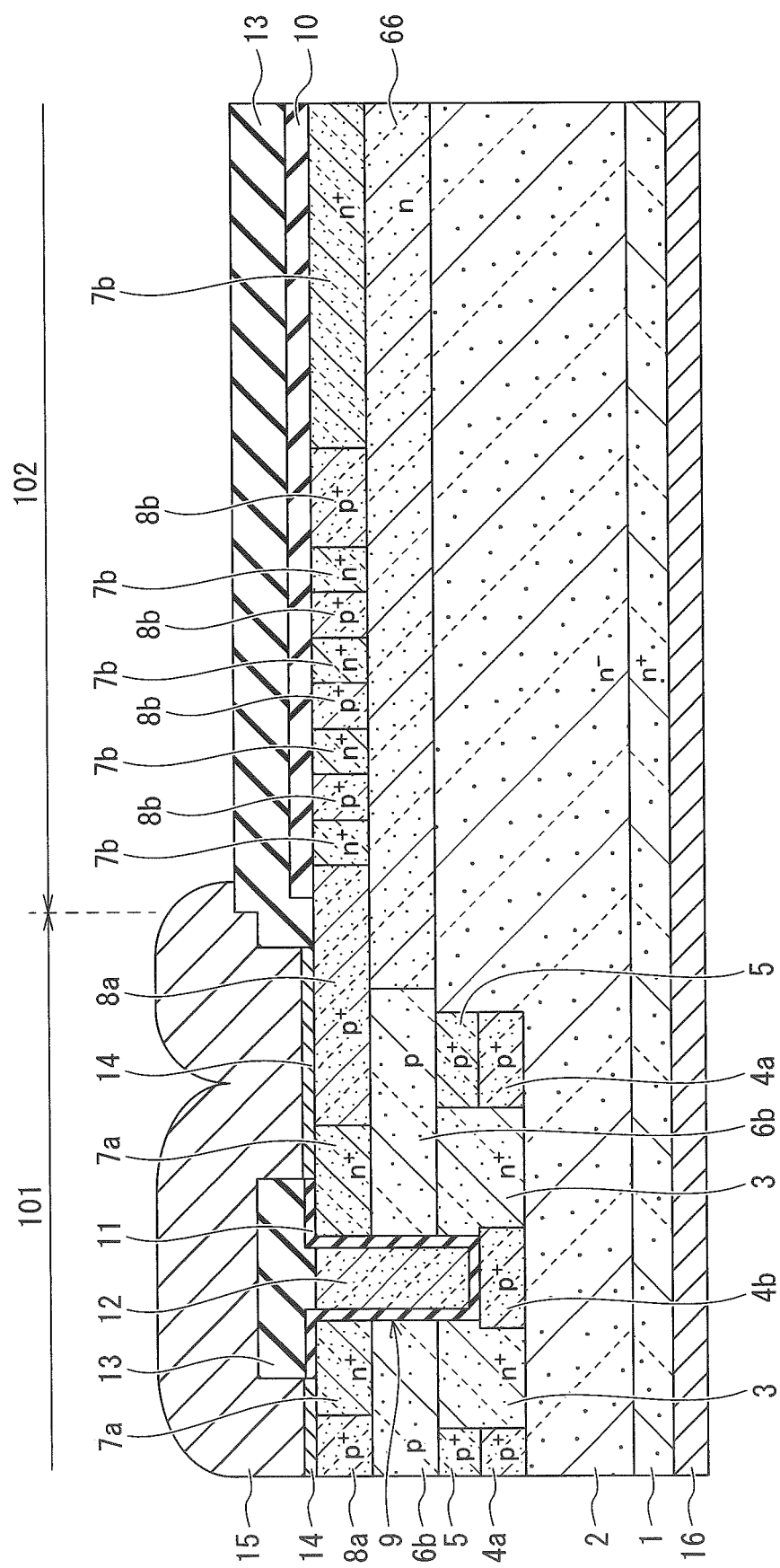
FIG. 18 is a schematic cross-sectional view illustrating an example of a semiconductor device according to a first modification of the first embodiment of the present invention.

As illustrated in FIG. 18, a semiconductor device according to a first modification of the first embodiment differs from the first embodiment in that a plurality of $n^+$-type separation regions 7b which penetrate a $p^+$-type base contact region 8a extending from the active area 101 to the outer-edge area 102 to reach an n-type semiconductor layer 66, are provided. The semiconductor layer 66 is provided on the top surface of the drift layer 2 in the outer-edge area 102 with a depth level of a base region 6b, and is in contact with a side surface of the base region 6b in the active area 101, bottom surfaces of the separation regions 7b, and bottom surfaces of guard rings 8b. An $n^+$-type source region 7a having a higher impurity concentration than that of the drift layer 2 is selectively provided in an upper portion of the base region 6b so as to be in contact with the base contact region 8a. The other configurations are the same as those of the semiconductor device according to the first embodiment, and thus, redundant descriptions will be omitted.

Figure 19:
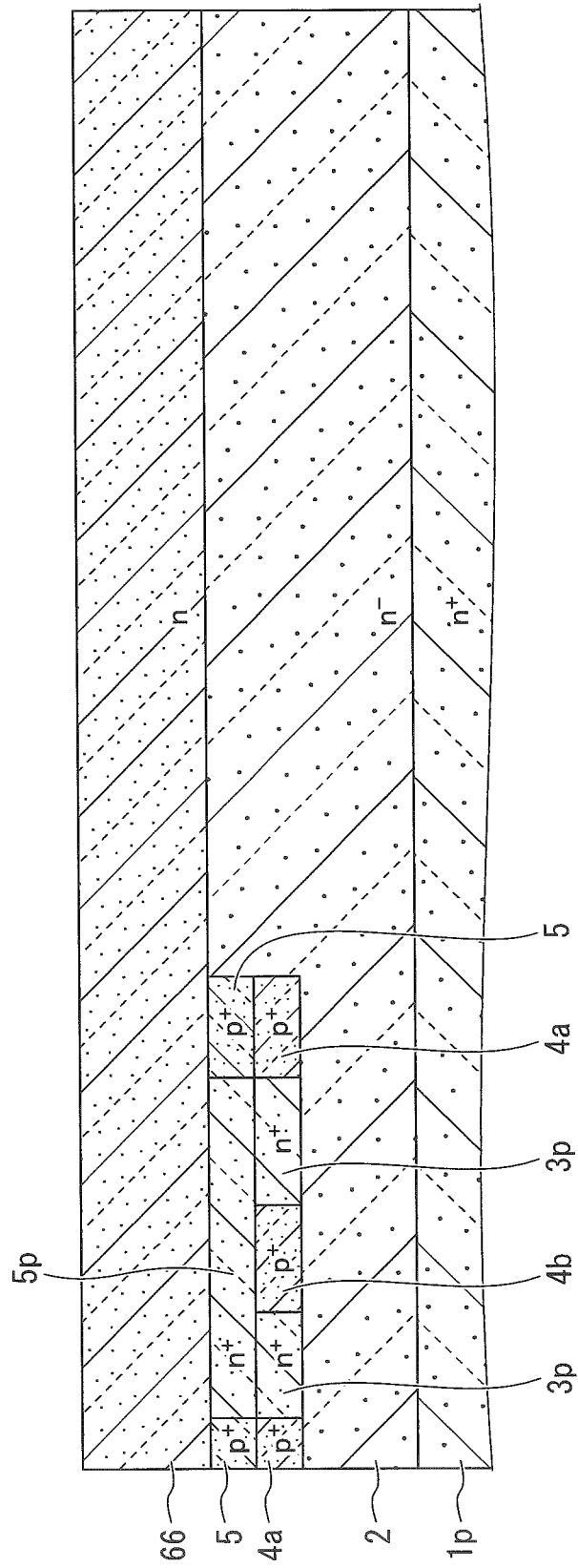
FIG. 19 is a schematic cross-sectional view illustrating an example of a process in a manufacturing method of the semiconductor device according to the first modification of the first embodiment of the present invention.
Figure 20:
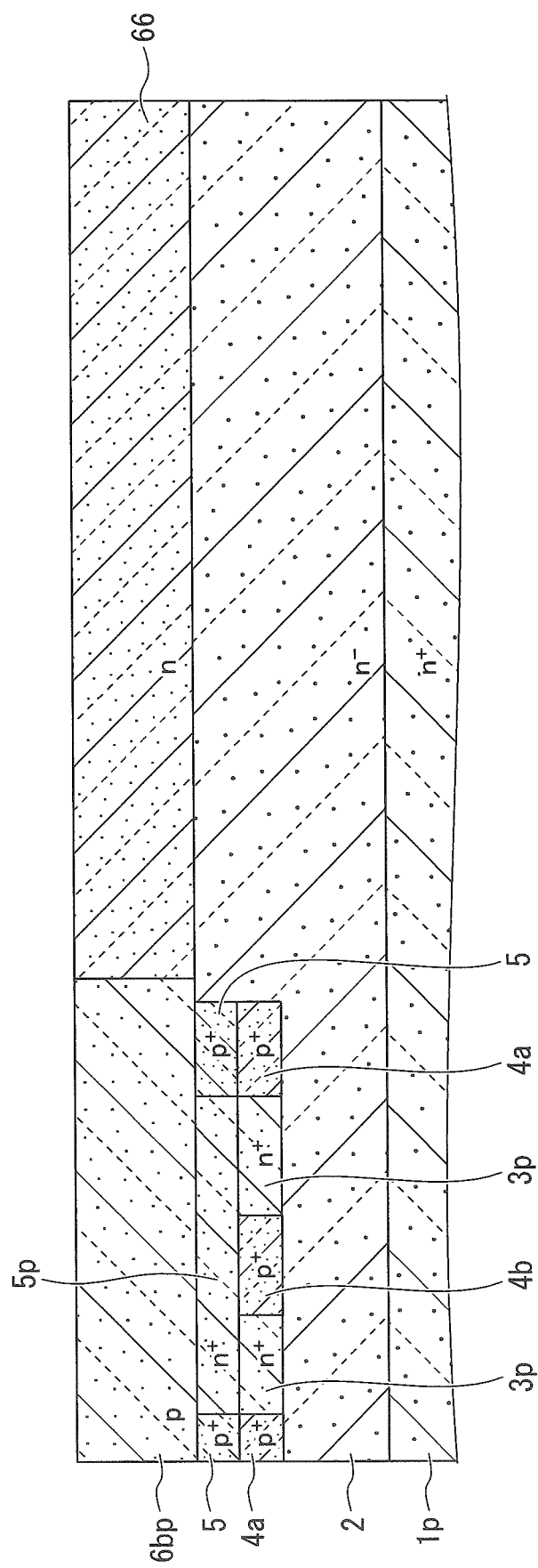
FIG. 20 is a schematic cross-sectional view illustrating an example of a process following FIG. 19 in the manufacturing method of the semiconductor device according to the first modification of the first embodiment of the present invention.

After the second base-bottom embedded region 5, as illustrated in FIG. 6, is selectively formed on the first base-bottom embedded region 4a, the n-type semiconductor layer 66 is epitaxially grown on the top surfaces of the second base bottom embedded region 5, the n-ion implanted layer 5p and the drift layer 2 as illustrated in FIG. 19. An oxide film made of $SiO_2$ is deposited on a top surface of the semiconductor layer 66 by CVD technique and the like. A photoresist film is applied to a top surface of the oxide film, and a mask pattern is delineated to the oxide film by photolithography technique, dry etching technique and the like. Using the delineated oxide film as an ion-implantation mask, p-type impurity ions such as aluminum (Al) are selectively implanted into the semiconductor layer 66 from the upper side of the semiconductor layer 66 by multiple-energy ion implantation. As a result, as illustrated in FIG. 20, a base region 6bp is formed on the top surfaces of the second base-bottom embedded region 5 and the n-ion implanted layer 5p.

Figure 21:
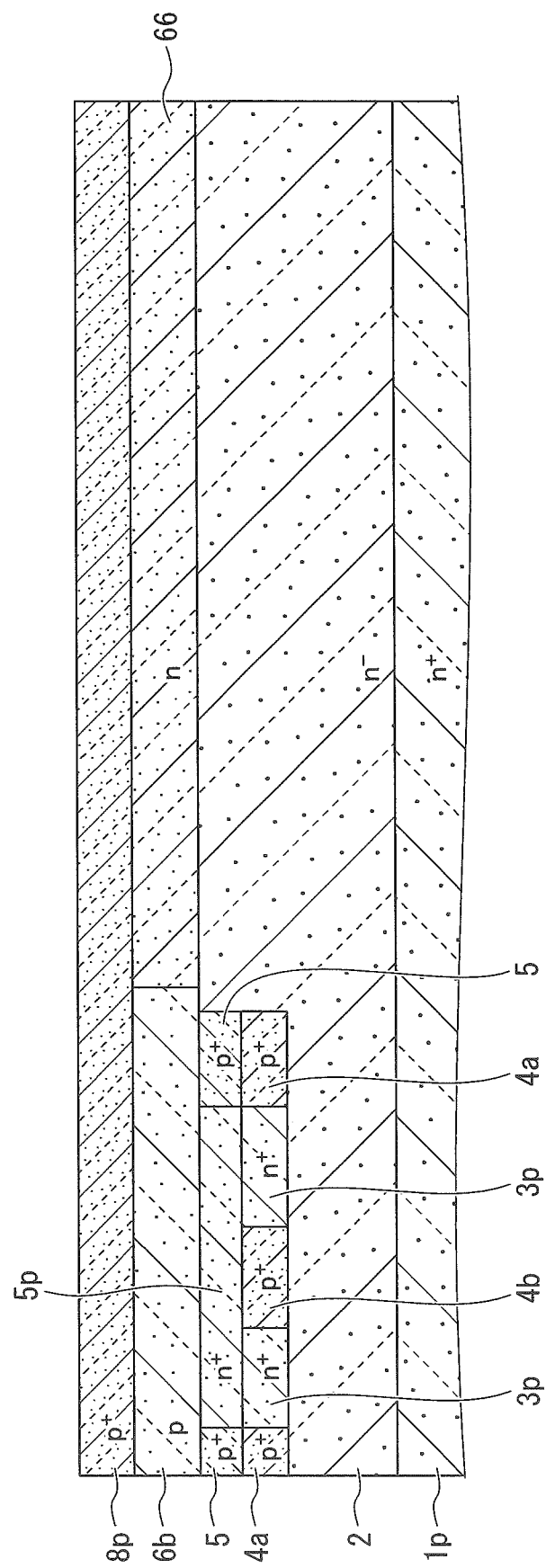
FIG. 21 is a schematic cross-sectional view illustrating an example of a process following FIG. 20 in the manufacturing method of the semiconductor device according to the first modification of the first embodiment of the present invention.

After removing the oxide film used as the ion-implantation mask, p-type impurity ions such as aluminum (Al) are implanted into the base region 6bp and the semiconductor layer 66 from the upper sides of the base region 6bp and the semiconductor layer 66 by multiple-energy ion implantation. As a result, as illustrated in FIG. 21, a base contact region 8p is formed on upper portions of the base region 6bp and the semiconductor layer 66.

Figure 22:
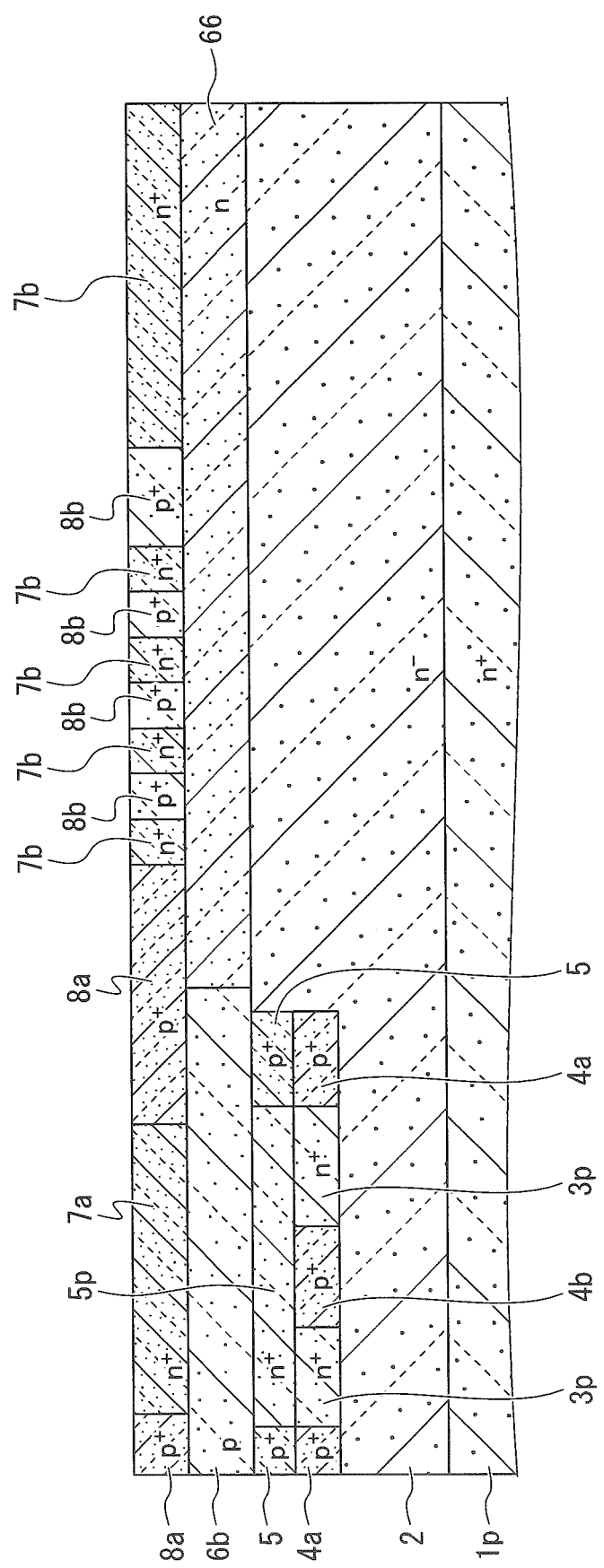
FIG. 22 is a schematic cross-sectional view illustrating an example of a process following FIG. 21 in the manufacturing method of the semiconductor device according to the first modification of the first embodiment of the present invention.

Thereafter, a photoresist film is applied to a top surface of the base contact region 8p, and a mask pattern is delineated to the photoresist film by photolithography technique and the like. Using the delineated photoresist film as an ion-implantation mask, n-type impurity ions such as phosphorus (P) are selectively implanted into the base contact region 8p from the upper side of the base contact region 8p. As a result, as illustrated in FIG. 22, the $n^+$-type source region 7a is formed in the base contact region 8a on the base region 6b. Further, the $n^+$-type separation regions 7b which penetrate the base contact region 8p extending on the semiconductor layer 66 to reach the semiconductor layer 66 are formed. Thus, the $p^+$-type guard rings 8b are formed in the concentric ring shapes so as to be separated from each other. Each of the separation regions 7b contains not only the ion-implanted n-type impurities but also the p-type impurities doped in the base contact region 8a. In such case, since each impurity concentration of the $p^+$-type base contact region 8a and the $n^+$-type source region 7a is more than an order of magnitude higher than the impurity concentration of the semiconductor layer 66 or the base region 6b, the base contact region 8a and the guard rings 8b may be the same depth. Further, each depth of the separation regions 7b may be the same as the source region 7a. In addition, although the separation regions 7b have been described as n-type semiconductor layers, the separation regions 7b may be p-type semiconductor layers. Further, after the p-type base region 6b has been grown on the entire surface by epitaxial growth, the semiconductor layer 66 may be formed by implantation of n-type impurity ions.

Figure 23:
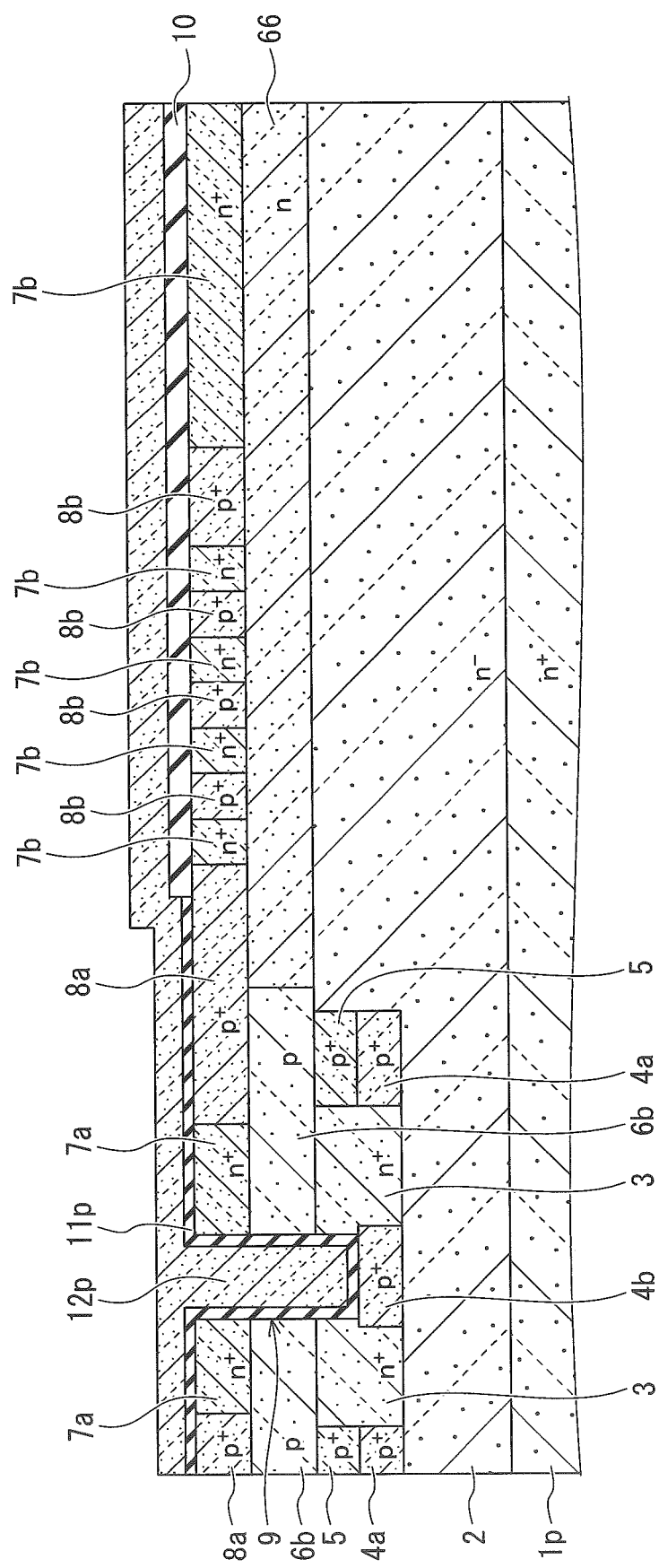
FIG. 23 is a schematic cross-sectional view illustrating an example of a process following FIG. 22 in the manufacturing method of the semiconductor device according to the first modification of the first embodiment of the present invention.

Thereafter, the trench 9 is formed by CVD technique, photolithography technique, dry etching technique and the like. The trench 9 penetrates the source region 7a, the base region 6b and the n-ion implanted layer 5p to reach the gate-bottom protection region 4b. The carbon (C) film is deposited on the exposed surface of the trench 9 by carbon sputtering technique and the like. The ion-implanted n-type and p-type impurity ions are simultaneously activated by activation annealing and the like. After removing the carbon film, the field insulating film 10 is selectively formed on the top surfaces of the guard rings 8b and the separation regions 7b by CVD technique, photolithography technique, dry etching technique, and the like. As illustrated in FIG. 23, the gate insulating film 11p such as a $SiO_2$ film is formed on the bottom surface and sidewall of the trench 9, and on the top surfaces of the source region 7a and the base contact region 8a by thermal oxidation method or CVD technique. Then, the polysilicon layer 12p to which impurities, such as phosphorus (P) and boron (B), are doped at a high concentration is deposited so as to fill the trench 9 by CVD technique and the like. As illustrated in FIG. 23, the polysilicon layer 12p extends so as to cover the top surface of the field insulating film 10 in the outer-edge area 102. The subsequent process steps are the same as the process steps illustrated in FIGS. 13 and 14, and thus, redundant descriptions will be omitted.

In the first modification of the first embodiment, the n⁺-type separation regions 7b are formed in the outer-edge area 102 so as to penetrate the p⁺-type base contact region 8a extending from the active area 101 to reach the n-type semiconductor layer 66. Then, the p-type guard rings 8b are formed to be separated from each other in the concentric rings. In the first modification of the first embodiment, the mesa-groove-forming process is not necessary, and the manufacturing process may be shortened. Further, the guard rings 8b can be provided by forming the separation regions 7b by the implantation of the n-type impurity ions. Since the implantation of n-type impurity ions can be executed even at room temperature, the photoresist film can be used as the ion-implantation mask. As described above, it is not necessary to deposit any oxide film and the like, and the guard-ring-forming process can be shortened. In addition, in the photolithography technique, a fine pattern of the photoresist film can be made. And further, since the top surface from the active area 101 to the outer-edge area 102 may be flat, the pattern of the photoresist film can be made further finer, and the patterns of the guard rings 8b formed on the outer-edge area 102 can be miniaturized. Thus, the size of the semiconductor chip can be reduced. As described above, in the first modification of the first embodiment, the man-hours of the guard-ring-forming process and the mesa-groove-forming process can be cut down, and it is possible to shorten the manufacturing time of the semiconductor device and to reduce the manufacturing cost.

(Second Modification)

Figure 24:
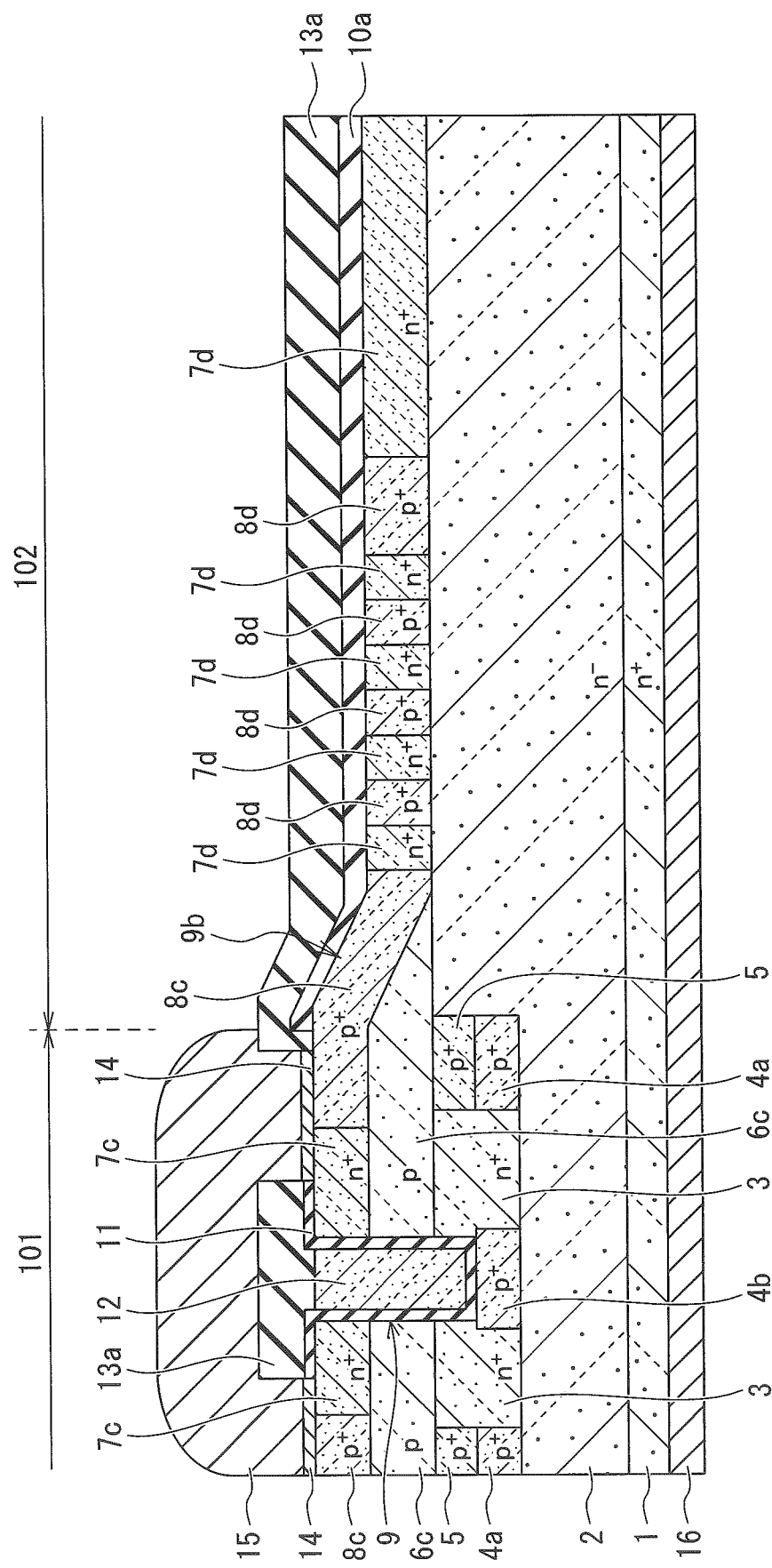
FIG. 24 is a schematic cross-sectional view illustrating an example of a semiconductor device according to a second modification of the first embodiment of the present invention.

As illustrated in FIG. 24, a semiconductor device according to a second modification of the first embodiment differs from the first modification of the first embodiment in that a mesa groove 9b is provided at the boundary between the active area 101 and the outer-edge area 102. Further, a p⁺-type base contact region 8c provided on a top surface of a p-type base region 6c in the active area 101 extends to the top surface of the drift layer 2 in the outer-edge area 102 via the mesa groove 9b. An n⁺-type source region 7c having a higher impurity concentration than the drift layer 2 is selectively provided on an upper portion of the base region 6c so as to be in contact with the base contact region 8c. The other configurations are the same as those of the semiconductor device according to the first modification of the first embodiment, and thus, redundant descriptions will be omitted.

Figure 25:
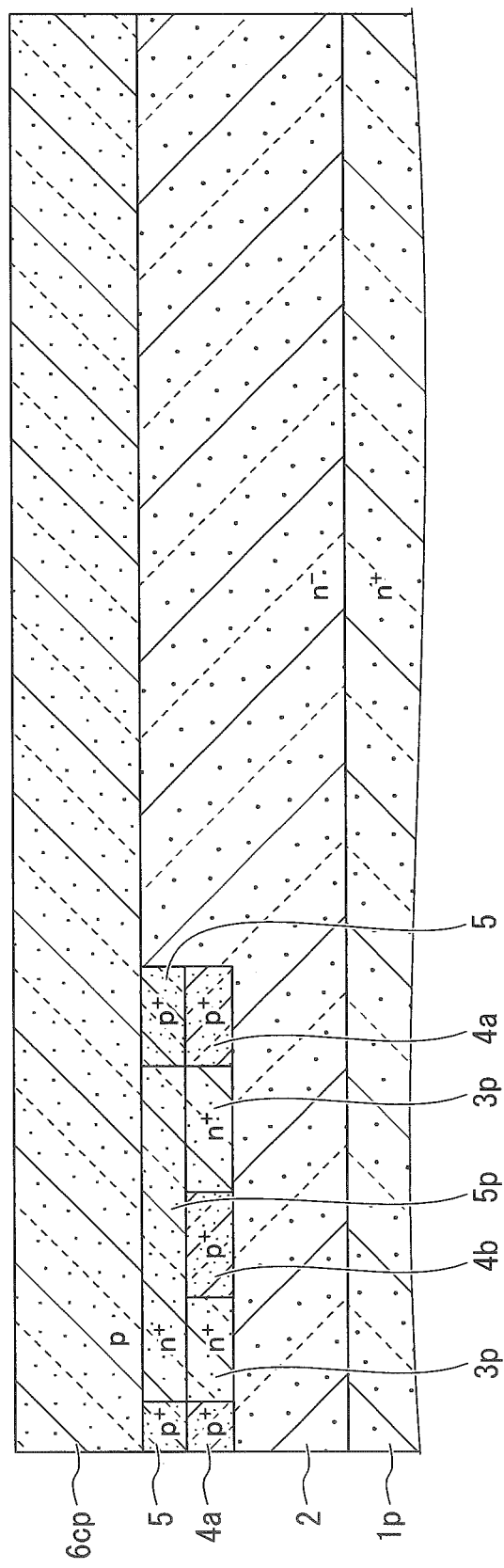
FIG. 25 is a schematic cross-sectional view illustrating an example of a process in a manufacturing method of the semiconductor device according to the second modification of the first embodiment of the present invention.
Figure 26:
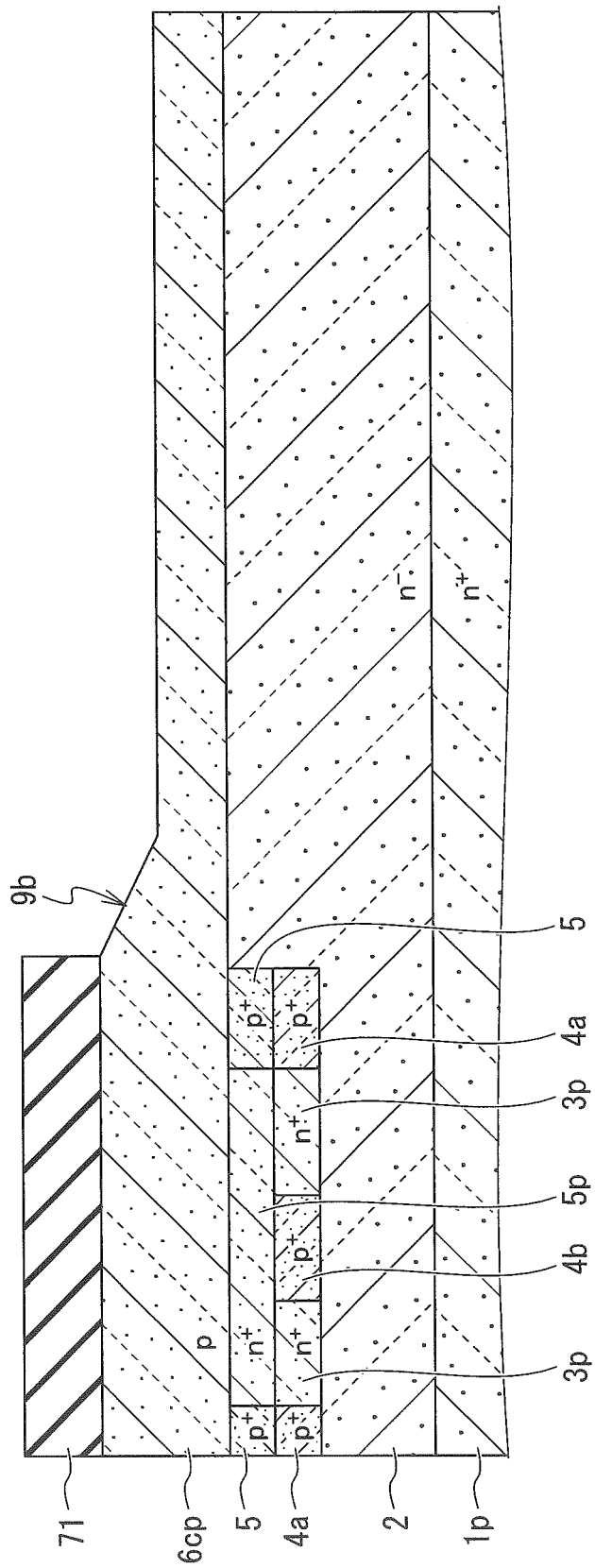
FIG. 26 is a schematic cross-sectional view illustrating an example of a process following FIG. 25 in the manufacturing method of the semiconductor device according to the second modification of the first embodiment of the present invention.

After the second base-bottom embedded region 5, as illustrated in FIG. 6, is selectively formed on the first base-bottom embedded region 4a, a p-type base region 6cp is epitaxially grown on the top surfaces of the second base-bottom embedded region 5, the n-ion implanted layer 5p and the drift layer 2 as illustrated in FIG. 25. An oxide film made of SiO₂ is deposited on a top surface of the base region 6cp by CVD technique and the like. A photoresist film is applied to a top surface of the oxide film, and a mask pattern is delineated to the oxide film by photolithography technique, dry etching technique and the like. Using the delineated oxide film 71 as an etching mask, a part of the base region 6cp is selectively etched by dry etching technique and the like to form the mesa groove 9b as illustrated in FIG. 26. In the outer-edge area 102, the base region 6cp remains on the top surface of the drift layer 2.

Figure 27:
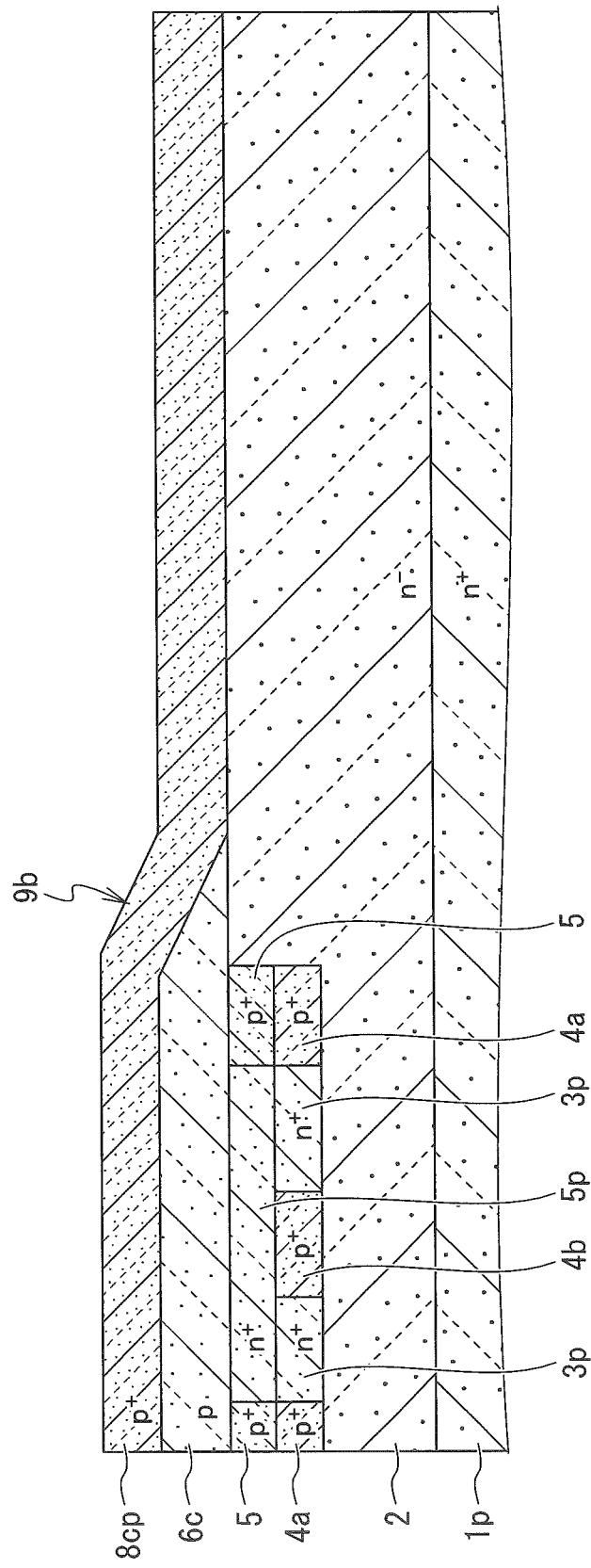
FIG. 27 is a schematic cross-sectional view illustrating an example of a process following FIG. 26 in the manufacturing method of the semiconductor device according to the second modification of the first embodiment of the present invention.

After removing the oxide film 71 used as the etching mask, p-type impurity ions such as aluminum (Al) are implanted into the entire surface of the base region 6cp from the upper side of the base region 6cp by multiple-energy ion implantation. As a result, as illustrated in FIG. 27, a base contact region 8cp is formed on the top surfaces of the base region 6c and the drift layer 2.

Figure 28:
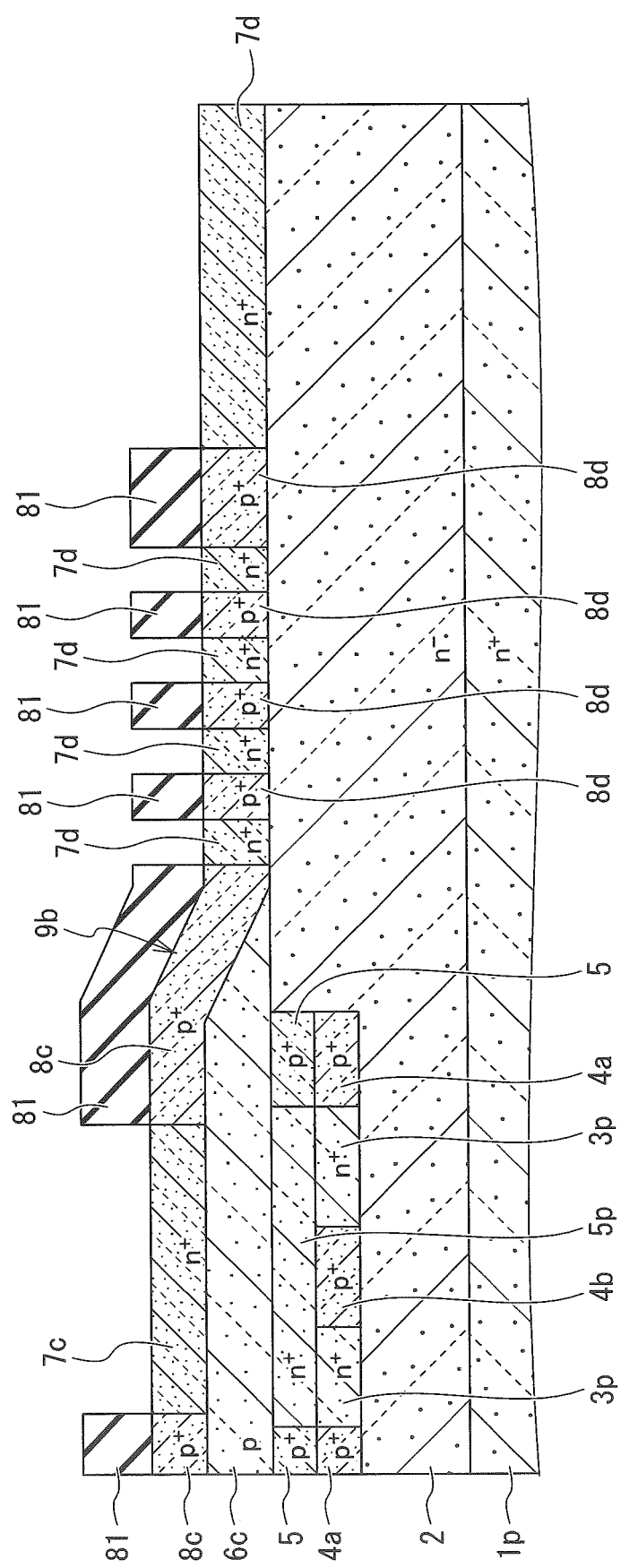
FIG. 28 is a schematic cross-sectional view illustrating an example of a process following FIG. 27 in the manufacturing method of the semiconductor device according to the second modification of the first embodiment of the present invention.

Then, a photoresist film is applied to a top surface of the base contact region 8cp, and a mask pattern is delineated to the photoresist film by photolithography technique and the like. Using the delineated photoresist film 81 as an ion-implantation mask, n-type impurity ions such as phosphorus (P) are selectively implanted into the base contact region 8cp from the upper side of the base contact region 8cp. As a result, as illustrated in FIG. 28, the n⁺-type source region 7c is formed in the base contact region 8c on the base region 6c. Further, the n⁺-type separation regions 7d which penetrate the base contact region 8c extending on the top surface of the drift layer 2 and reach the drift layer 2, are formed. In such case, the base contact region 8cp left in the active area 101 implements the base contact region 8c. Further, portions of the base contact region 8cp sandwiched between the separation regions 7d implement the p⁺-type guard rings 8d which are separated from each other and formed in the concentric ring shapes. Each of the separation regions 7d contains not only the ion-implanted n-type impurities but also the p-type impurities doped in the base contact region 8c. The guard rings 8d and the separation regions 7d are alternately provided in contact with each other. The impurity concentration of the second conductivity type (p-type) impurities in the guard rings 8d is the same as the impurity concentration of the second conductivity type (p-type) impurities in the base contact region 8c. Further, the impurity concentration of the first conductivity type (n-type) impurities in the separation regions 7d is the same as the impurity concentration of the first conductivity type impurities (n-type) in the source region 7c. In addition, although the separation regions 7d have been described as n-type semiconductor layers, the separation regions 7d may be p-type semiconductor layers.

Figure 29:
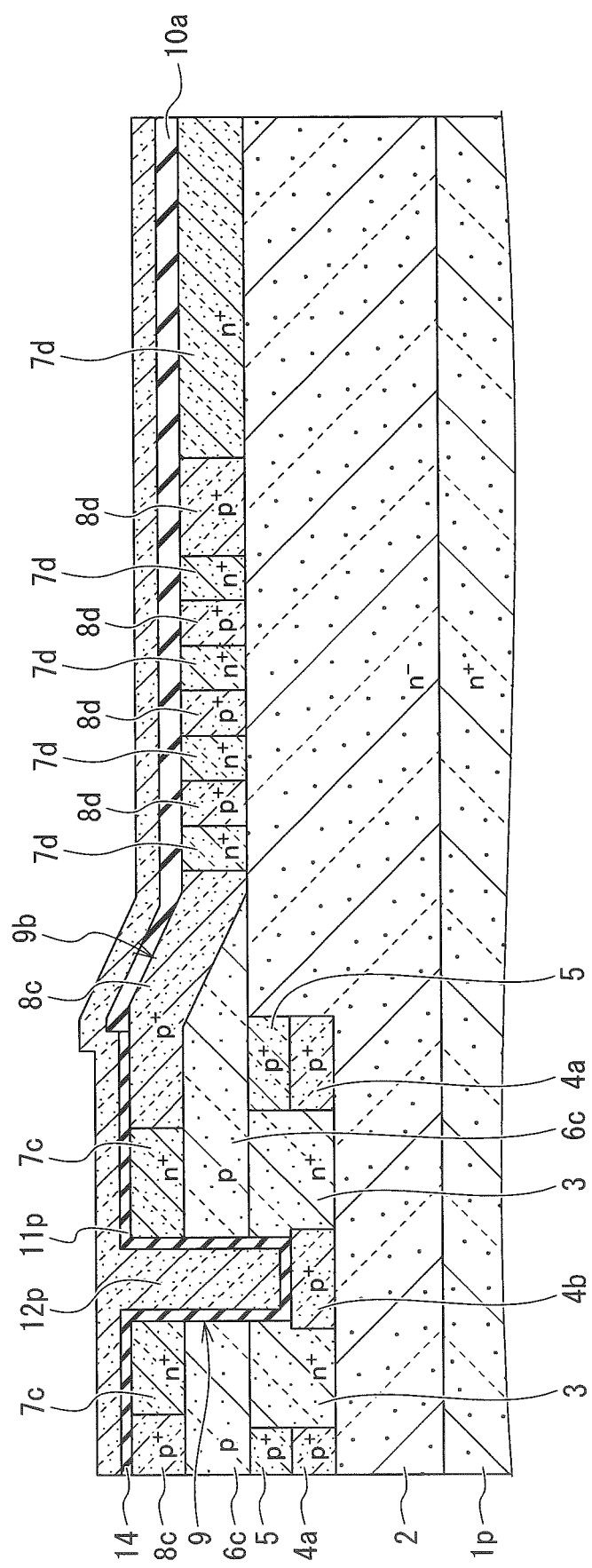
FIG. 29 is a schematic cross-sectional view illustrating an example of a process following FIG. 28 in the manufacturing method of the semiconductor device according to the second modification of the first embodiment of the present invention.

Thereafter, the trench 9 is formed by CVD technique, photolithography technique, dry etching technique and the like. The trench 9 penetrates the source region 7c, the base region 6c and the n-ion implanted layer 5p to reach the gate-bottom protection region 4b. The carbon (C) film is deposited on the exposed surface of the trench 9 by carbon sputtering technique and the like. The implanted n-type and p-type impurity ions are simultaneously activated by activation annealing and the like. After removing the carbon film, the field insulating film 10a is selectively formed on the top surfaces of the guard ring 8d and the separation region 7d by CVD technique, photolithography technique, dry etching technique and the like. As illustrated in FIG. 29, the gate insulating film 11p such as a SiO₂ film is formed on the bottom surface and sidewall of the trench 9, and on the top surfaces of the source region 7c and the base contact region 8c by thermal oxidation method or CVD technique. Then, the polysilicon layer 12p to which impurities, such as phosphorus (P) and boron (B), are doped at a high concentration is deposited so as to fill the trench 9 by CVD technique and the like. As illustrated in FIG. 29, the polysilicon layer 12p extends so as to cover the top surface of the field insulating film 10a in the outer-edge area 102. The subsequent steps are the same as the steps illustrated in FIGS. 13 and 14, and thus, redundant descriptions will be omitted.

In the second modification of the first embodiment, the mesa groove 9b is provided at the boundary between the active area 101 and the outer-edge area 102, and in the outer-edge area 102, the n⁺-type separation regions 7d which penetrate the p⁺-type base contact region 8c extending from the active area 101 and reach the n-type drift layer 2 are formed. Then, the p-type guard rings 8d are formed to be separated from each other and in the concentric rings. In the second modification of the first embodiment, although the mesa-groove forming process is introduced, the base contact region 8c is formed by ion-implantation to the entire top surface of the base region 6cp without any mask, a number of photomasks and a number of manufacturing processes can be reduced. Further, the guard rings 8d are provided by forming the separation regions 7d by implantation of the n-type impurity ions. Since the implantation of n-type impurity ions can be executed even at room temperature, the photoresist film 81 can be used as the ion-implantation mask. As described above, it is not necessary to deposit any oxide film and the like, and the guard-ring-forming process can be shortened. In addition, in the photolithography technique, the fine pattern of the photoresist film can be formed, and the patterns of the guard rings 8b formed on the outer-edge area 102 can be miniaturized. Thus, the size of the semiconductor chip can be reduced. As described above, in the second modification of the first embodiment, the man-hours of the base-contact-region-forming process and guard-ring-forming process can be cut down, and it is possible to shorten the manufacturing time of the semiconductor device and to reduce the manufacturing cost.

Second Embodiment

<Structure of Semiconductor Device>

Figure 30:
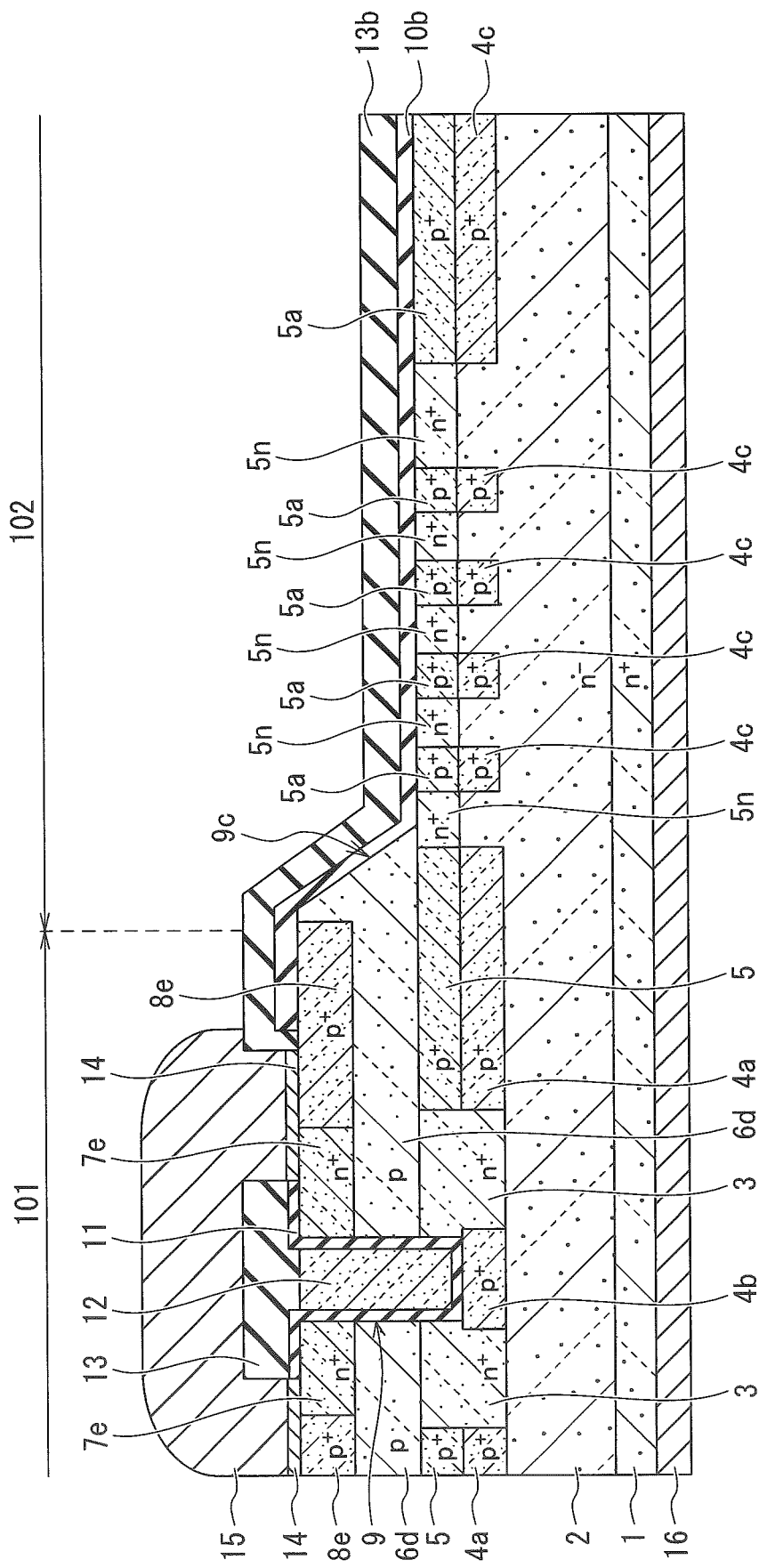
FIG. 30 is a schematic cross-sectional view illustrating an example of a semiconductor device according to a second embodiment of the present invention.

As illustrated in FIG. 30, a semiconductor device according to a second embodiment of the present invention differs from the first embodiment in that a mesa groove 9c penetrating the base region 6d is provided on the outer-edge area 102 and a plurality of $p^+$-type guard rings (4c, 5a) and a plurality of $n^+$-type separation regions 5n are provided on the drift layer 2. Each of the guard rings (4c, 5a) is implemented by a $p^+$-type first region 4c and a $p^+$-type second region 5a. The second regions 5a of the guard ring (4c, 5a) and the separation regions 5n are alternately provided in contact with each other. The first region 4c is provided at the same depth level as the first base-bottom embedded region 4a and the gate-bottom protection region 4b, and the second region 5a is at the same depth level as the second base-bottom embedded region 5. An $n^+$-type source region 7e having a higher impurity concentration than the drift layer 2 is selectively provided on the base region 6d so as to be in contact with the base contact region 8e. A field insulating film 10b and an interlayer insulating film 13b extend from the vicinity of the boundary between the active area 101 and the outer-edge area 102 to a bottom of the mesa groove 9c. The other configurations are the same as those of the semiconductor device according to the first modification of the first embodiment, and thus, redundant descriptions will be omitted.

In the semiconductor device according to the second embodiment, each of the guard rings (4c, 5a) is implemented by the first region 4c and the second region 5a. The first region 4c may be formed by simultaneously implanting the p-type impurity ions with the first base-bottom embedded region 4a and the gate-bottom protection region 4b located at the same depth level. Similarly, the second region 5a may be formed by simultaneously implanting the p-type impurity ions with the second base-bottom embedded region 5 located at the same depth level. As described above, in the second embodiment, the guard rings (4c, 5a) can be formed in the forming process of the first base-bottom embedded region 4a and the gate-bottom protection region 4b and the forming process of the second base-bottom embedded region 5. Since a dedicated photomask of guard-ring-forming and the guard-ring-forming process may be cut down, it is possible to shorten the manufacturing time of the semiconductor device and to reduce the manufacturing cost of the semiconductor device.

<Manufacturing Method of Semiconductor Devices>

Next, a manufacturing method of the SiC semiconductor device according to the second embodiment will be given by taking a trench gate MOSFET as an example, with reference to the cross-sectional views of FIGS. 31 to 37. Note that the manufacturing method of the trench gate MOSFET described below is merely an example and may be achieved by various other manufacturing methods including a modification as long as the gist described in the claims is included.

First, the $n^+$-type SiC semiconductor substrate (substrate) 1p in which n-type impurities such as nitrogen (N) are doped, is prepared. A photoresist film is applied to the top surface of the n-type drift layer 2 which is epitaxially grown on the top surface of the substrate 1p, and a mask pattern is delineated to the photoresist film by photolithography technique and the like. Using the delineated photoresist film as an ion-implantation mask, n-type impurity ions such as nitrogen (N) are selectively implanted in the active area 101 of the drift layer 2 from the upper side of the drift layer 2. Thus, the $n^+$-type n-ion implanted layer 3p is formed on the upper portion of the drift layer 2 of the active area 101.

Figure 31:
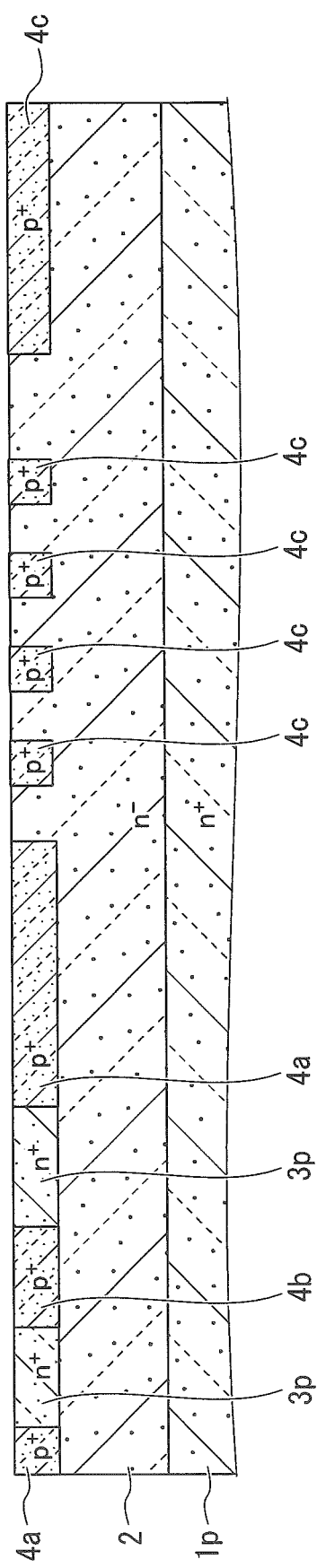
FIG. 31 is a schematic cross-sectional view illustrating an example of a process in a manufacturing method of the semiconductor device according to the second embodiment of the present invention.

An oxide film made of $SiO_2$ is deposited on the top surfaces of the n-ion implanted layer 3p and the drift layer 2 by CVD technique and the like. A photoresist film is applied to the top surface of the oxide film, and a mask pattern is delineated to the oxide film by photolithography technique, dry etching technique and the like. Using the delineated oxide film as an ion-implantation mask, p-type impurity ions such as aluminum (Al) are implanted into the n-ion implanted layer 3p by multiple-energy ion implantation. As a result, as illustrated in FIG. 31, in the active area 101, the $p^+$-type first base-bottom embedded region 4a and the $p^+$-type gate-bottom protection region 4b are selectively formed on the upper portion of the drift layer 2 so as to be in contact with the n-ion implanted layer 3p. In the outer-edge area 102, the $p^+$-type first regions 4c are formed on the upper portion of the drift layer 2.

Figure 32:
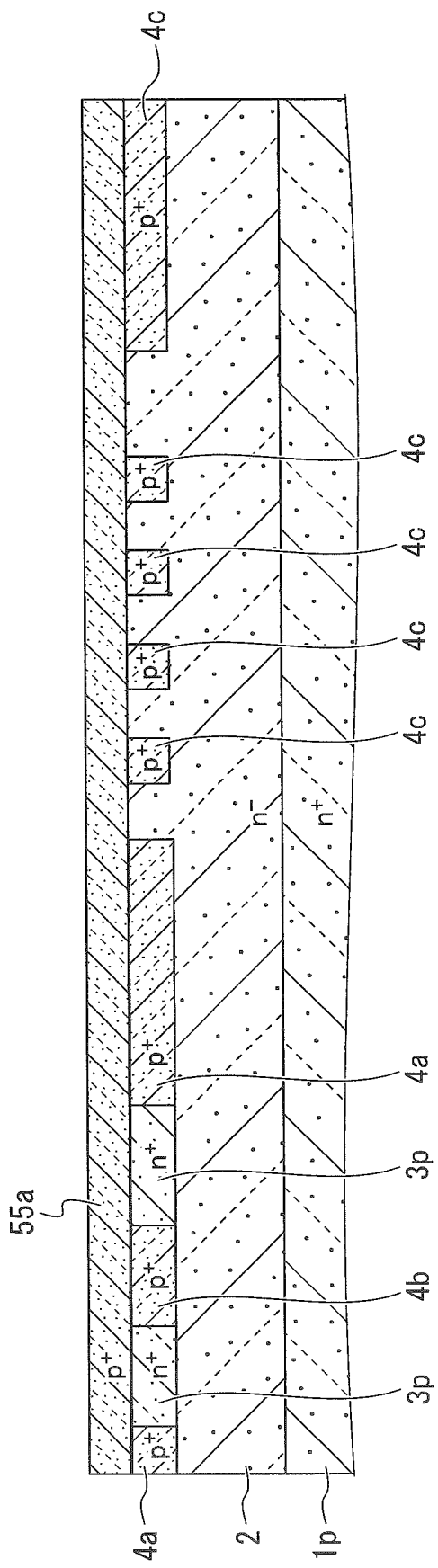
FIG. 32 is a schematic cross-sectional view illustrating an example of a process following FIG. 31 in the manufacturing method of the semiconductor device according to the second embodiment of the present invention.
Figure 33:
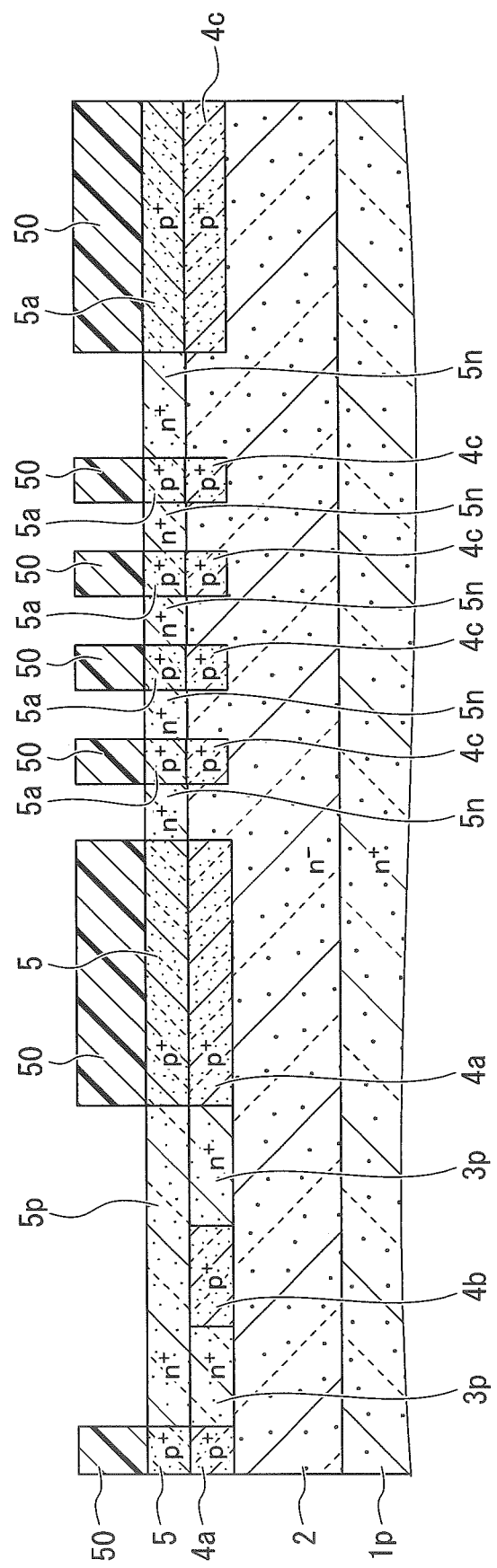
FIG. 33 is a schematic cross-sectional view illustrating an example of a process following FIG. 32 in the manufacturing method of the semiconductor device according to the second embodiment of the present invention.

After removing the oxide film used as the ion-implantation mask, $n^-$-type epitaxial layer is grown on top surfaces of the n-ion implanted layer 3p, the first base-bottom embedded region 4a, the gate-bottom protection region 4b, the first region 4c and the drift layer 2. Then, p-type impurity ions are implanted on the entire surface of the epitaxial layer to form a $p^+$-type p-ion implanted layer 55a as illustrated in FIG. 32. A photoresist film is applied to a top surface of the p-ion implanted layer 55a, and a mask pattern is delineated to the photoresist film by photolithography technique and the like. Using the delineated photoresist film 50 as an ion-implantation mask, n-type impurity ions such as nitrogen (N) are selectively implanted on the p-ion implanted layer 55a from the upper side of the p-ion implantation layer 55a. As a result, as illustrated in FIG. 33, in the active area 101, the $n^+$-type n-ion implanted layer 5p is formed on the n-ion implanted layer 3p and the gate-bottom protection region 4b. Further, a portion of the p-ion implanted layer 55a where the n-type impurity ions are not implanted, is formed on the first base-bottom embedded region 4a to implement the second base-bottom embedded region 5. As will be described later, the n-ion implanted layer 3p and the n-ion implanted layer 5p implement the current spreading layer 3, and the impurity concentration of the n-ion implantation layer $5p$ is preferably higher than that of the n-ion implantation layer $3p$.

In the outer-edge area 102, the $n^+$-type separation regions $5n$ are formed on the drift layer 2 sandwiched between the first regions $4c$. Then, the portions of the p-ion implantation layer $55a$ left between the separation regions $5n$ implement the $p^+$-type second regions $5a$ which are provided on the first region $4c$. The guard rings ($4c$, $5a$) implemented by the first regions $4c$ and the second regions $5a$ are formed in the concentric ring shapes so as to be separated from each other. Therefore, the second regions $5a$ of the guard ring ($4c$, $5a$) and the separation regions $5n$ are alternately provided in contact with each other. Each of the separation regions $5n$ contains both n-type (first conductivity type) impurities and p-type (second conductivity type) impurities, and the impurity concentration of the p-type (second conductivity type) impurities in the separation regions $5n$ is the same as the impurity concentration of the p-type (second conductivity type) impurities in the second region $5a$. Further, the impurity concentration of the p-type (second conductivity type) impurities in the second region $5a$ is the same as the impurity concentration of the p-type (second conductivity type) impurities in the second base-bottom embedded region 5. The impurity concentration of the n-type (first conductivity type) impurities in the separation region $5n$ is the same as the impurity concentration of the n-type (first conductivity type) impurities in the current spreading layer 3, or the n-ion implanted layer $5p$.

Figure 34:
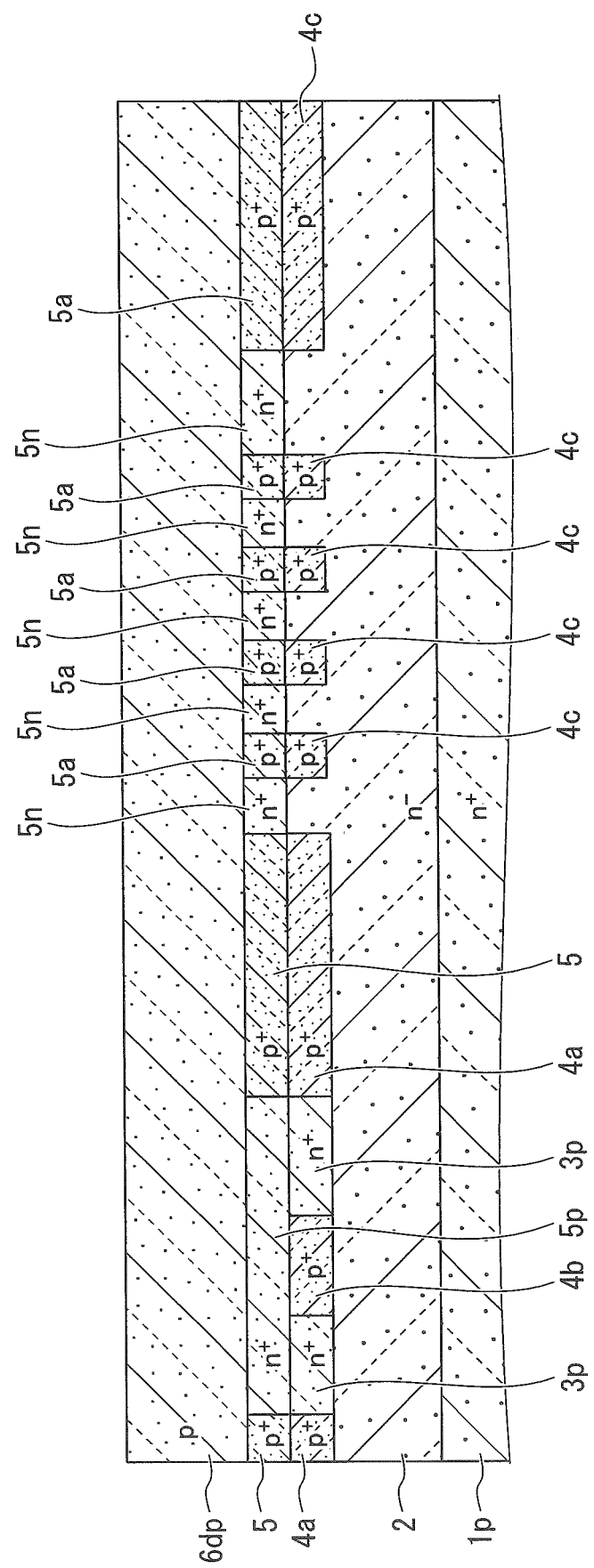
FIG. 34 is a schematic cross-sectional view illustrating an example of a process following FIG. 33 in the manufacturing method of the semiconductor device according to the second embodiment of the present invention.
Figure 35:
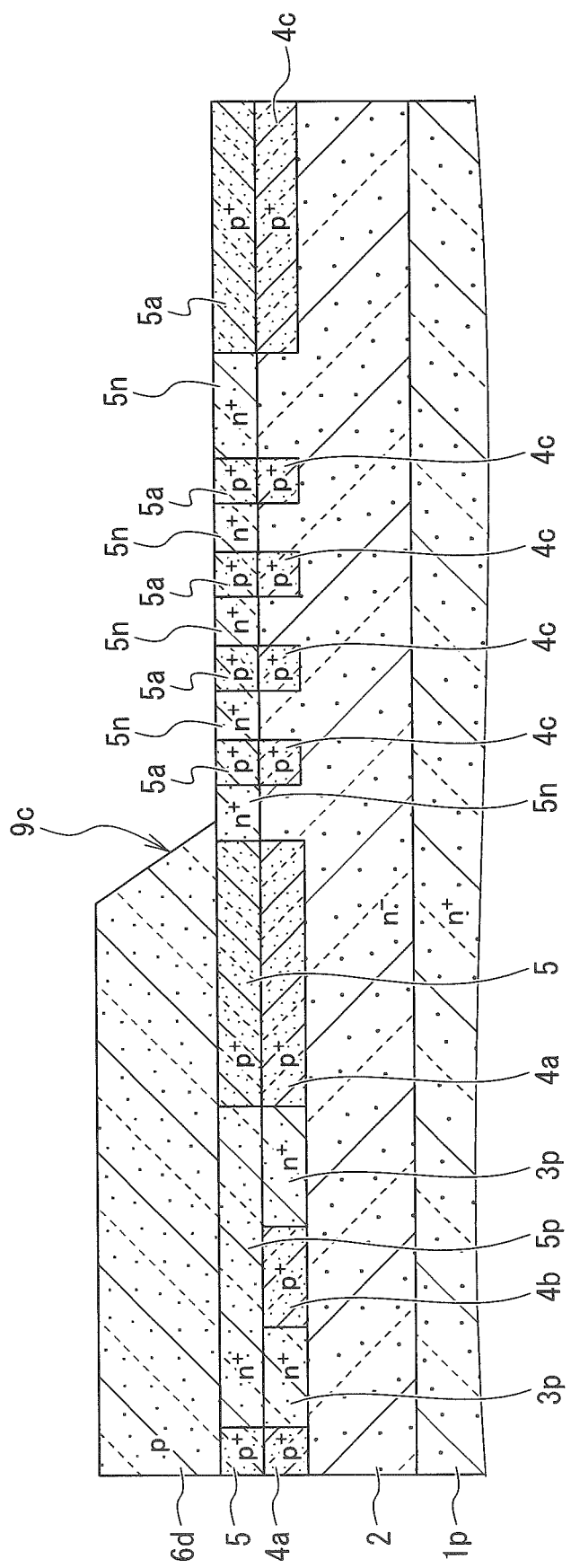
FIG. 35 is a schematic cross-sectional view illustrating an example of a process following FIG. 34 in the manufacturing method of the semiconductor device according to the second embodiment of the present invention.

After removing the photoresist film 50 used as the ion-implantation mask, a p-type base region $6tp$ is epitaxially grown on the top surfaces of the second base-bottom embedded region 5, the n-ion implanted layer $5p$, the guard rings ($4c$, $5a$) and the separation regions $5n$, as illustrated in FIG. 34. An oxide film made of $SiO_2$ is deposited on a top surface of the base region $6dp$ by CVD technique and the like. A photoresist film is applied to a top surface of the oxide film, and a mask pattern is delineated to the oxide film by photolithography technique, dry etching technique, and the like. Using the delineated oxide film as an etching mask, the base region $6dp$ is selectively etched by dry etching technique and the like to form the mesa groove $9c$ as illustrated in FIG. 35. The base region $6d$ is left in the active area 101, and the top surfaces of the second regions $5a$ of the guard ring ($4c$, $5a$) and the top surface of the separation regions $5n$ are exposed on a bottom surface of the mesa groove $9c$ in the outer-edge area 102.

After removing the etching mask, an oxide film made of $SiO_2$ is deposited on the top surface of the base region $6d$ and the bottom surface of the mesa groove $9c$ by CVD technique and the like. A photoresist film is applied to a top surface of the oxide film, and a mask pattern is delineated to the oxide film by photolithography technique, dry etching technique and the like. Using the delineated oxide film as an ion-implantation mask, p-type impurity ions such as aluminum (Al) are selectively implanted into the base region $6d$ from the upper side of the base region $6d$ by multiple-energy ion implantation. As a result, the $p^+$-type base contact region $8e$ is formed on the top surface of the base region $6d$ above the second base-bottom embedded region 5 and the n-ion implanted layer $5p$.

Figure 36:
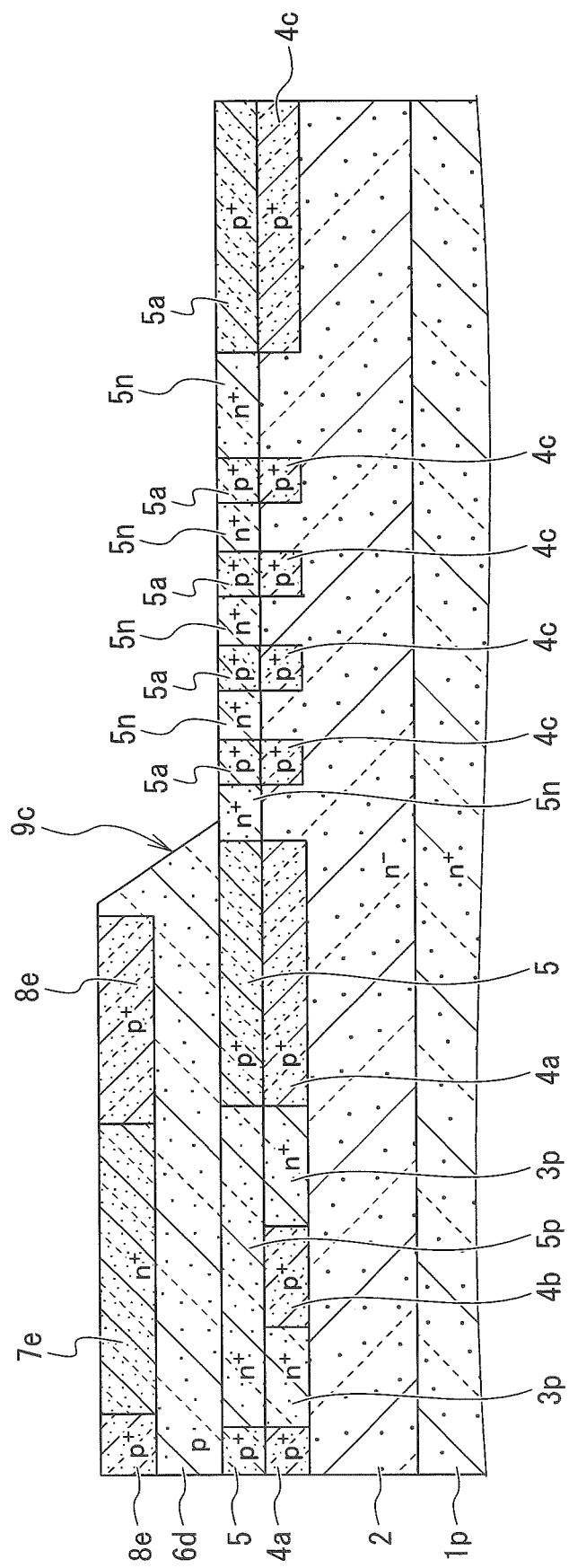
FIG. 36 is a schematic cross-sectional view illustrating an example of a process following FIG. 35 in the manufacturing method of the semiconductor device according to the second embodiment of the present invention.

After removing the oxide film used as the ion-implantation mask, an oxide film made of $SiO_2$ is deposited on the top surfaces of the base contact region $8e$ and the base region $6d$, and the bottom surface of the mesa groove $9c$ by CVD technique and the like. A photoresist film is applied to a top surface of the oxide film, and a mask pattern is delineated to the oxide film by photolithography technique, dry etching technique and the like. Using the delineated oxide film as an ion-implantation mask, n-type impurity ions such as phosphorus (P) are selectively implanted into the base region $6d$ from the upper side of the base region $6d$. As a result, as illustrated in FIG. 36, the $n^+$-type source region $7e$ is formed on the top surface of the base region $6d$ above the n-ion implanted layer $5p$.

An oxide film made of $SiO_2$ is deposited on the top surfaces of the base contact region $8e$ and the source region $7e$, and the bottom surface of the mesa groove $9c$ by CVD technique and the like. A photoresist film is applied to a top surface of the oxide film, and a mask pattern is delineated to the oxide film by photolithography technique, dry etching technique and the like. Using the delineated oxide film as an etching mask, the trench 9 is selectively formed by dry etching technique. The trench 9 penetrates the source region $7e$, the base region $6d$ and the n-ion implanted layer $5p$ to reach the gate-bottom protection region $4b$. After removing the oxide film used as the etching mask, the field insulating film $10b$ is deposited on the exposed surfaces of the trench 9, the mesa groove $9c$ and the like by CVD technique and the like. A photoresist film is applied to the top surface of the field insulating film $10b$, and a mask pattern is delineated to the photoresist film by photolithography technique, dry etching technique and the like. A part of the field insulating film $10b$ is selectively removed by using the delineated photoresist film as an etching mask.

Figure 37:
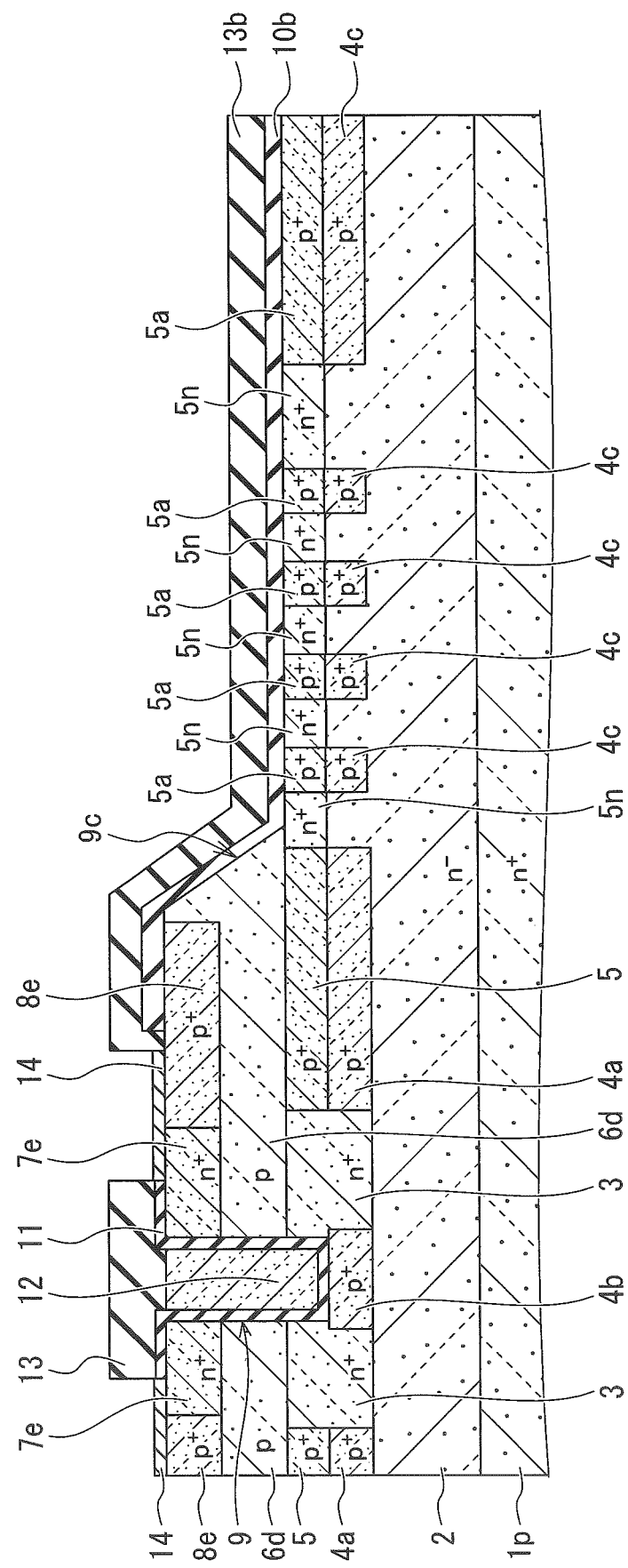
FIG. 37 is a schematic cross-sectional view illustrating an example of a process following FIG. 36 in the manufacturing method of the semiconductor device according to the second embodiment of the present invention.

As illustrated in FIG. 37, the gate insulating film 11 such as a $SiO_2$ film is formed on the bottom surface and the sidewall of the trench 9, and the top surfaces of the source region $7e$ and the base contact region $8e$ by thermal oxidation method or chemical vapor deposition (CVD) technique. Then, a polysilicon layer (doped polysilicon layer) to which impurities, such as phosphorus (P) and boron (B), are doped at a high concentration is deposited so as to fill the trench 9 by CVD technique and the like.

Thereafter, a part of the polysilicon layer and a part of the gate insulating film 11 are selectively removed by photolithography technique, dry etching and the like. As illustrated in FIG. 37, the insulated-gate electrode structure (11, 12) is formed by patterning the gate insulating film 11 and the gate electrode 12 of the polysilicon layer. Then, an insulating film is deposited on the top surface of the insulated-gate electrode structure (11, 12) implemented by the gate electrode 12 and the gate insulating film 11 by CVD technique and the like. For the insulating film, boro-phospho silicate glass (BPSG), NSG and the like may be used. Then, a part of the deposited insulating film is selectively removed by photolithography technique, dry etching technique and the like. As a result, as illustrated in FIG. 37, the interlayer insulating film 13 in which a source electrode contact-hole is opened is formed. Although not illustrated, the gate contact-hole is also opened in the interlayer insulating film 13 so as to expose a part of the gate surface electrode connected to the gate electrode 12 at a position different from the source electrode contact-hole.

A metal layer such as a Ni film is deposited by sputtering method or evaporation method and the like, and a pattern of the metal layer is delineated by photolithography technique, RIE technique and the like. Then, by rapid thermal annealing (RTA) technique, for example, at about 1000° C., the source contact layer 14 is formed on the top surfaces of the source region $7e$ and the base contact region $8e$, as illustrated in FIG. 37. Then, a barrier metal layer (not illustrated), such as a Ti film, a TiN film and the like, and a metal layer, such as an Al film and the like, are deposited by sputtering technique and the like, and the pattern of the barrier metal layer and the metal layer is delineated by photolithography technique, RIE technique and the like. As a result, as illustrated in FIG. 30, a laminated structure of the barrier metal layer (not illustrated) and the source electrode 15 is formed so as to cover the source contact layer 14 and the interlayer insulating film 13. Further, the patterns of the source electrode 15 and the gate surface electrode are separated, and the gate surface electrode is electrically connected to the gate electrode 12 via an interconnection layer (not illustrated) provided on the field insulating film 10b.

Further, the bottom surface of the substrate 1p is polished by chemical mechanical polishing (CMP) technique and the like to adjust the thickness to form the drain region 1. Thereafter, the drain electrode 16 made of Ti, Ni, Au and the like is deposited on the entire bottom surface of the drain region 1 by sputtering method, evaporation method and the like. Thus, the trench gate type semiconductor device illustrated in FIG. 30 is completed.

In the second embodiment, the mesa groove 9c which penetrates the base region 6d is formed on the outer-edge area 102, and the p$^+$-type guard rings (4c, 5a) are provided on the drift layer 2. Each of the guard rings (4c, 5a) is implemented by the first region 4c and the second region 5a provided to be in contact with the upper surface of the first region 4c. The second regions 5a of the guard ring (4c, 5a) and the separation regions 5n are alternately formed in contact with each other. The first regions 4c are simultaneously formed by ion-implantation of the p-type impurity with the first base-bottom embedded region 4a and the gate-bottom protection region 4b at the same depth level. Similarly, the second regions 5a are simultaneously formed by ion-implantation of the p-type impurity with the second base-bottom embedded region 5 at the same depth level. As described above, in the second embodiment, the guard rings (4c, 5a) can be formed in the forming process of the first base-bottom embedded region 4a and the gate-bottom protection region 4b, and the forming process of the second base-bottom embedded region 5. Therefore, a dedicated photomask of guard-ring-forming and the guard-ring-forming process may be cut down, and it is possible to shorten the manufacturing time of the semiconductor device and to reduce the manufacturing cost of the semiconductor device.

In the above description, the first region 4c and the second region 5a of the guard ring (4c, 5a) have the same width. In the photolithography process, the mask pattern of the second region 5a is formed in accordance with the pattern of the first region 4c that has been formed before the second region 5a. A misalignment may occur between the pattern of the first region 4c and the mask pattern of the second region 5a. If the misalignment between the patterns is large, the relaxation of electric-field crowding degrades and it becomes difficult to maintain the withstand voltage of the semiconductor device.

Figure 38:
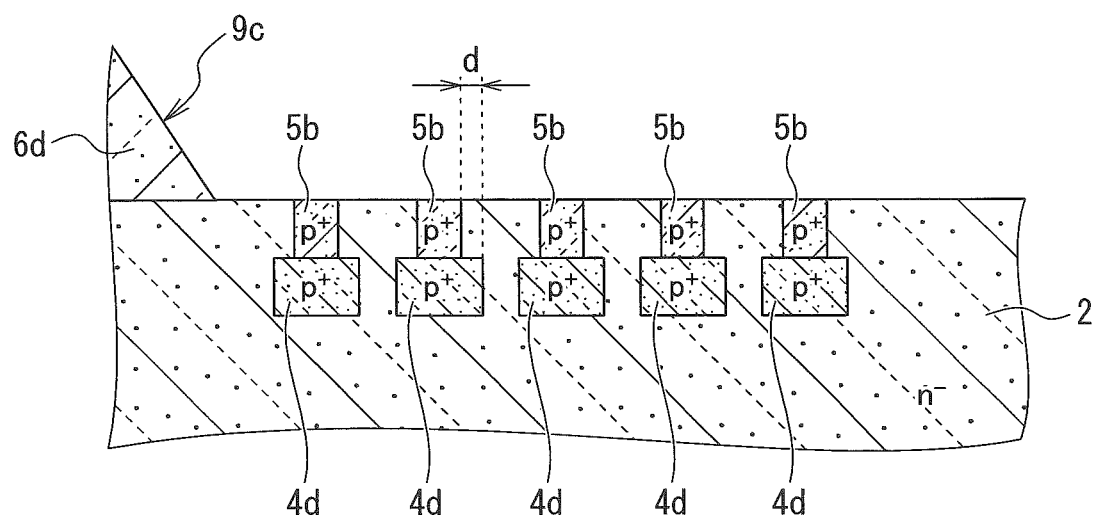
FIG. 38 is a schematic cross-sectional view illustrating another example of the edge-termination structure of the semiconductor device according to the second embodiment of the present invention.
Figure 39:
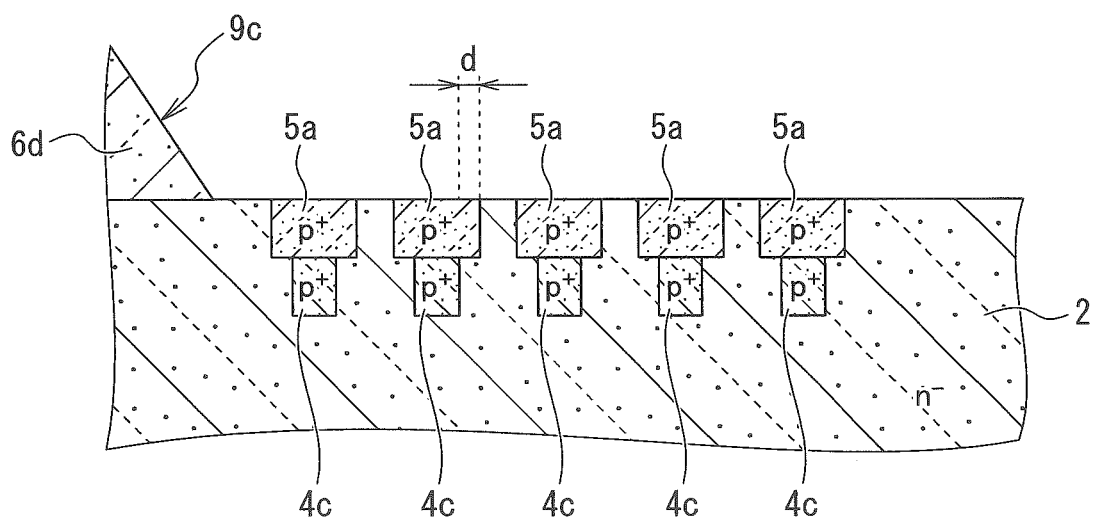
FIG. 39 is a schematic cross-sectional view illustrating another example of the edge-termination structure of the semiconductor device according to the second embodiment of the present invention.

In order to suppress the misalignment between the patterns, for example, as illustrated in FIG. 38, each width of the second regions 5b may be decreased by twice a width d with respect to each width of the first regions 4d. As the width d, for example, the maximum misalignment width of an aligner used in the photolithography process may be adopted. When using the aligner to align the mask pattern of the second region 5b with the pattern of the first region 4d, the second region 5b may be formed without protruding from the top surface of the first region 4d even if the resultant misalignment is the maximum misalignment width of the aligner. Further, as illustrated in FIG. 39, each width of the second regions 5a may be increased by twice the width d with respect to each width of the first regions 4c. In order to maintain the withstand voltage of the semiconductor device, it is preferable to relax the electric field crowding at a position deeper from the top surface of the drift layer 2. Therefore, the guard rings (4d, 5b) illustrated in FIG. 38 in which the first regions 4d are wider than the second regions 5b are more desirable.

Figure 40:
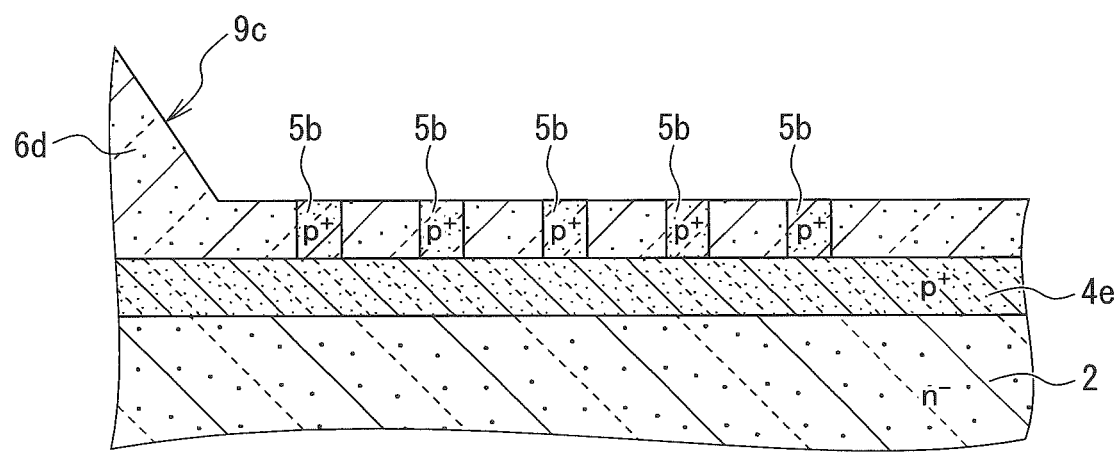
FIG. 40 is a schematic cross-sectional view illustrating another example of the edge-termination structure of the semiconductor device according to the second embodiment of the present invention.
Figure 41:
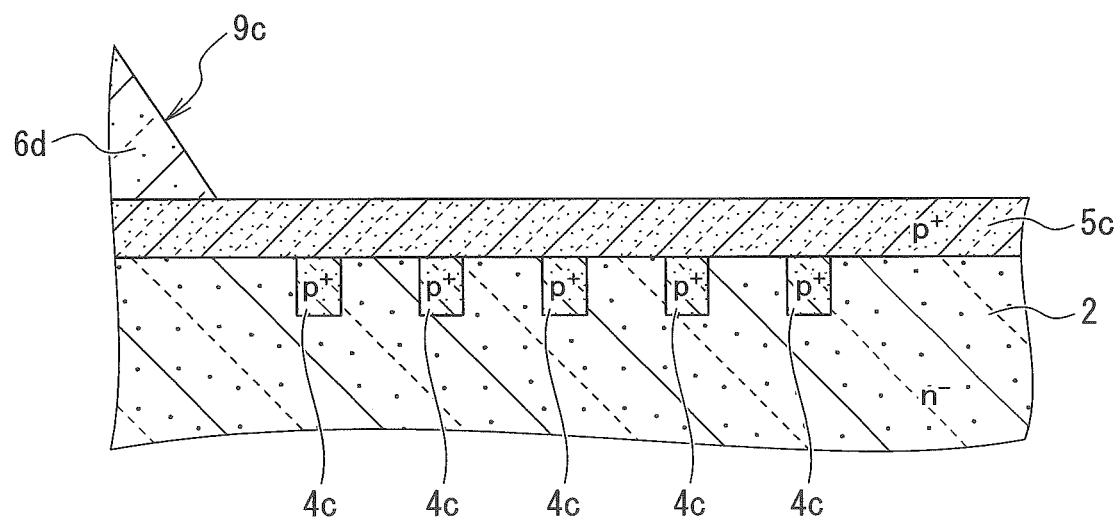
FIG. 41 is a schematic cross-sectional view illustrating another example of the edge-termination structure of the semiconductor device according to the second embodiment of the present invention.

Further, as a countermeasure against the misalignment, as illustrated in FIG. 40, the first region 4e may be a continuous integral pattern and a plurality of second regions 5b may be provided to be separated from each other. In such case, even if the mask pattern of the second regions 5b is misaligned, the second regions 5b will be in contact with the top surface of the first region 4e, and thus, the influence on relaxation of the electric-field crowding may be suppressed. Further, as illustrated in FIG. 41, a plurality of first regions 4c may be formed to be separated from each other and the second region 5c may be formed as a continuous integral pattern. Also in such case, the influence on relaxation of the electric field crowding caused by the misalignment may be suppressed, and the withstand voltage of the semiconductor device may be maintained.

Figure 42:
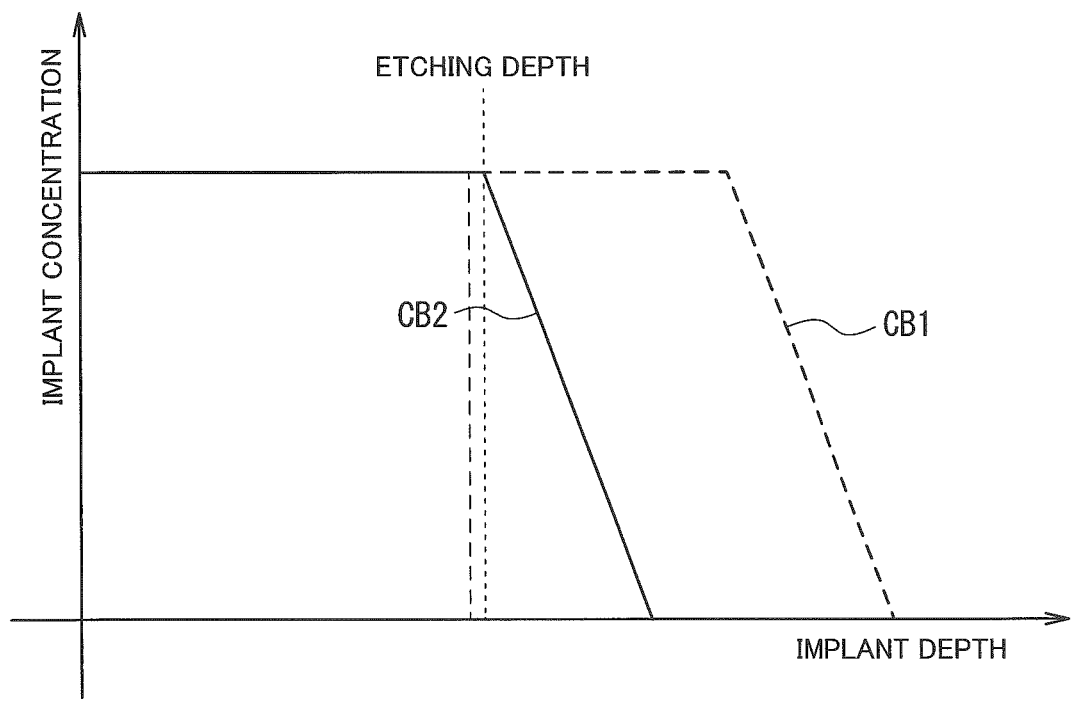
FIG. 42 is a diagram illustrating an example of impurity concentration distribution by ion-implantation of the edge-termination structure of the semiconductor device according to the second embodiment of the present invention.

Further, for example, in the guard ring (4d, 5b) illustrated in FIG. 38, the implanted p-type impurity ions are distributed in the depth direction as illustrated in FIG. 42. In FIG. 42, the broken line CB1 corresponds to the impurity concentration distribution in the first region 4d, and the solid line CB2 corresponds to the impurity concentration distribution in the second region 5b. As illustrated in FIG. 42, even when a portion having a flat impurity concentration in the second region 5b is removed, a tail of the impurity concentration distribution in which the impurity concentration derived from the second region 5b decreases remains in the first region 4d.

Figure 43:
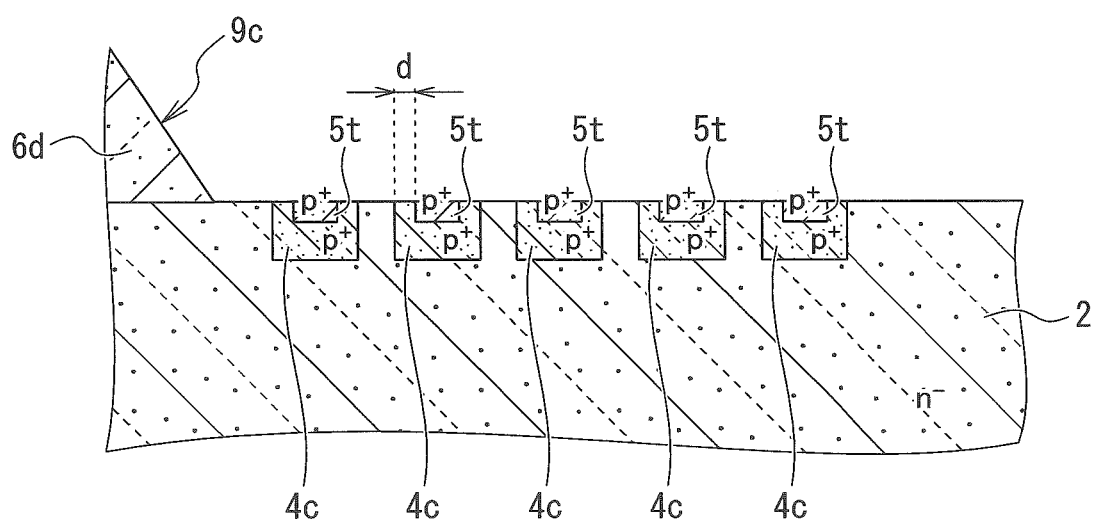
FIG. 43 is a schematic cross-sectional view illustrating an example of the edge-termination structure having the impurity concentration distribution illustrated in FIG. 42.

FIG. 43 illustrates a case where the tail in the impurity concentration distribution of the ion-implanted p-type impurities on the first region 4c is used as a second region 5t. In such case, in the forming process of the mesa groove 9c, the second region 5t may be partially removed to the depth level of a portion where the impurity concentration is flat by dry etching. As illustrated in FIG. 43, the second region 5t is made narrower than the first region 4c by twice the width d. Therefore, even if the misalignment occurs, the second region 5t may be formed on the upper portions of the first regions 4c, the influence on relaxation of the electric field crowding may be suppressed, and the withstand voltage of the semiconductor device may be maintained.

Third Embodiment

Figure 44:
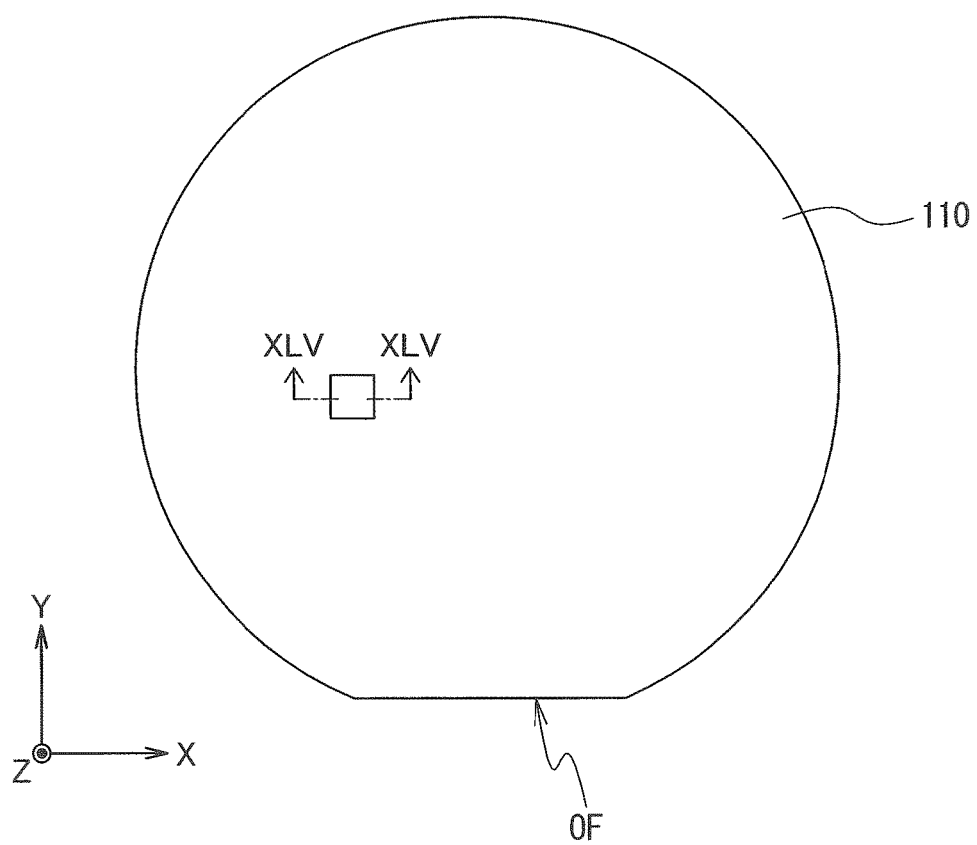
FIG. 44 is a schematic plan view illustrating an example of a semiconductor substrate used for manufacturing a semiconductor device according to a third embodiment of the present invention.

As illustrated in FIG. 44, a semiconductor device according to a third embodiment is manufactured based on a semiconductor substrate 110 having a plane orientation (0001) made of SiC. An orientation flat OF indicating the crystal orientation of the semiconductor substrate 110 is provided on the outer-edge area of the semiconductor substrate 110. The semiconductor substrate 110 is sliced along a direction in which the plane is inclined by a certain offset angle, or off-angle, with respect to a specific crystal orientation, and the position of the orientation flat OF is determined by the crystal orientation. Instead of the orientation flat OF, a notch may be provided on the outer-edge area of the semiconductor substrate 110. In FIG. 44, the X direction is the <11-20> direction, and the Y direction is the <1-100> direction. On the top surface of the semiconductor substrate 110, trenches of the semiconductor device extend in a stripe shape along the <11-20> direction, that is, the X direction.

Figure 45:
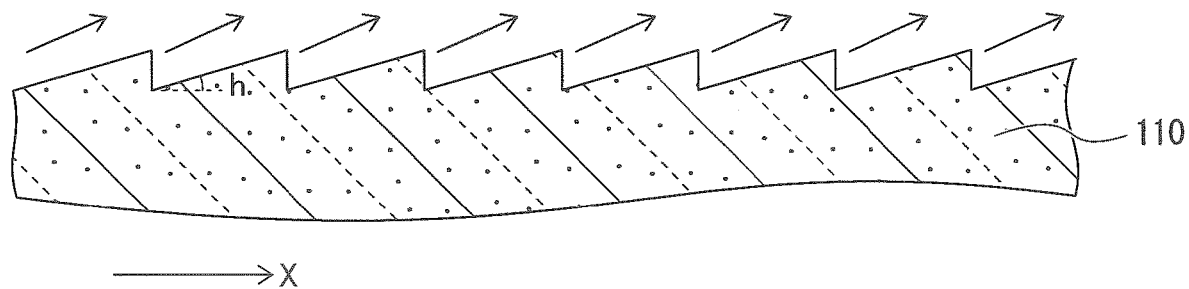
FIG. 45 is a schematic cross-sectional view taken along the line XLV-XLV in FIG. 44.

As illustrated in FIG. 45, in the X direction, the top surface of the semiconductor substrate 110 has an off-angle h of greater than 0° and equal to or less than about 10° in the <11-20> direction with respect to the <0001> (c-axis) direction. The off-angle h is the angle between the plane perpendicular to the c-axis (base plane), which is the (0001) plane, that is the Si plane, or (000-1) plane, that is the C plane, and the top surface of the semiconductor substrate 110. For example, when an epitaxial layer is grown on the top surface of the semiconductor substrate 110 on which an uneven pattern such as an alignment mark is delineated, the uneven pattern observed on the top surface of the epitaxial layer displaces a certain distance parallel to the main surface of the semiconductor substrate 110 toward the X direction, as illustrated by the arrows in FIG. 45. Since the epitaxial layer grows in the c-axis direction, the amount of shift is a value proportional to the thickness of the epitaxial layer. In the direction where the off-angle is not provided, that is the Y direction, no such shift occurs. For example, when the off-angle h is set to 4°, the shift of about 0.112 μm occurs in the X direction when the thickness of the epitaxial layer is about 1.6 μm.

Therefore, when the epitaxial layer is grown on the drift layer 2 on which the first region 4c is formed, and the second region 5d is formed by ion-implantation from the upper side of the epitaxial layer, it is desirable to design a pattern in anticipation of a shifting width based on the thickness of the epitaxial layer. Further, it is desirable to design the width of the second region 5d with respect to the first region 4c also in consideration of the width of the misalignment in photolithography.

Figure 46:
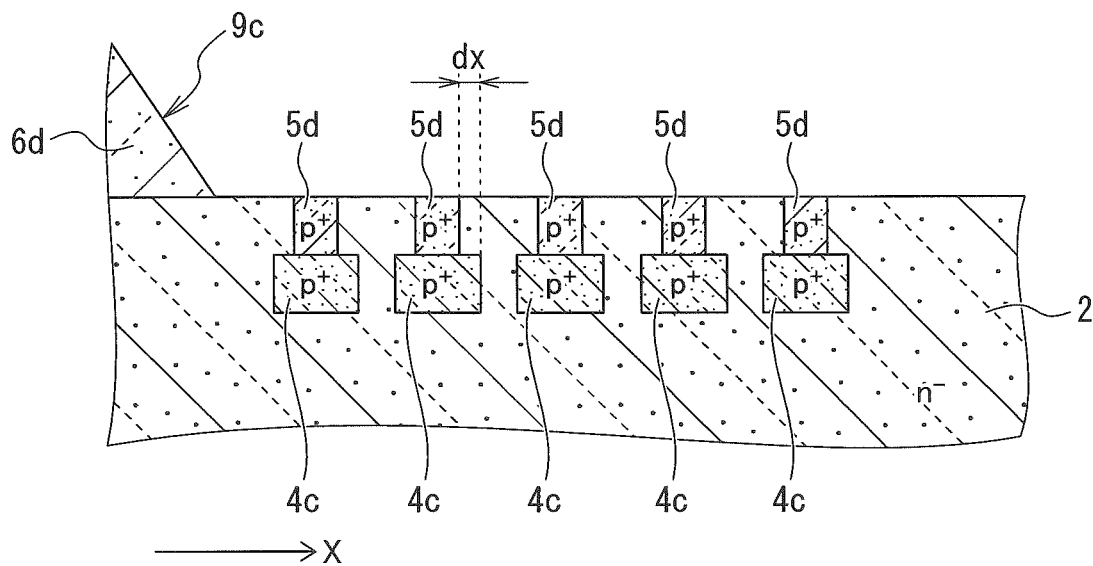
FIG. 46 is a schematic cross-sectional view illustrating an example of the edge-termination structure of the semiconductor device according to the third embodiment of the present invention.
Figure 47:
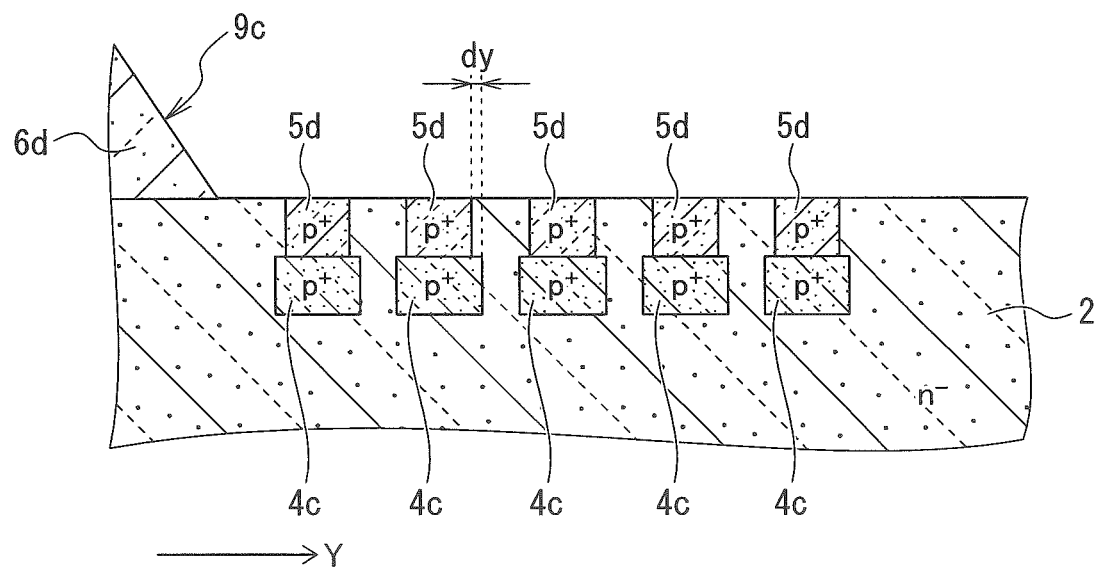
FIG. 47 is a schematic cross-sectional view illustrating another example of the edge-termination structure of the semiconductor device according to the third embodiment of the present invention.

Specifically, as illustrated in FIG. 46, in the X direction where the off-angle is provided, a width dx between each side surface of the first regions 4c and each side surface of the second regions 5d may be determined in consideration of the amount of shift based on the thickness of the epitaxial layer and the width of the misalignment in photolithography. Further, as illustrated in FIG. 47, in the Y direction where no off-angle is provided, a width dy between each side surface of the first regions 4c and each side surface of the second regions 5d may be determined in consideration of only the width of the misalignment in photolithography. Thus, by making the width dx in the X direction larger than the width dy in the Y direction, the influence of the shift based on the epitaxial layer thickness can be minimized.

OTHER EMBODIMENTS

While the insulated gate semiconductor device according to the first to third embodiments of the present invention has been described, it should be understood that the present invention is not intended to be limited to the descriptions of the specification and the drawings implementing part of this disclosure. Various alternative embodiments, examples, and technical applications will be apparent to those skilled in the art according to this disclosure.

Figure 48:
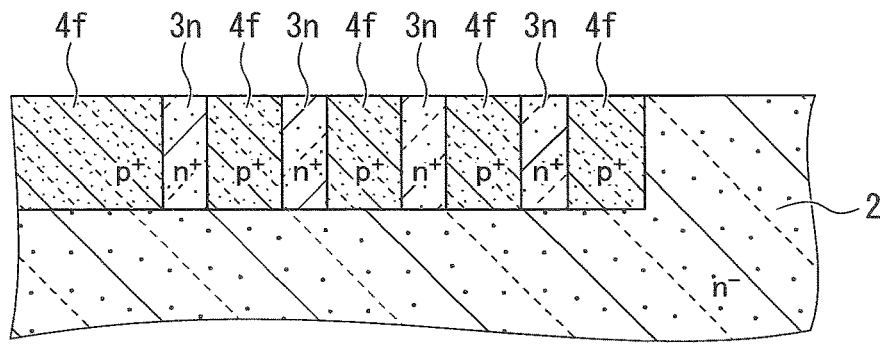
FIG. 48 is a schematic cross-sectional view illustrating an example of an edge-termination structure of a semiconductor device according to other embodiment of the present invention.
Figure 49:
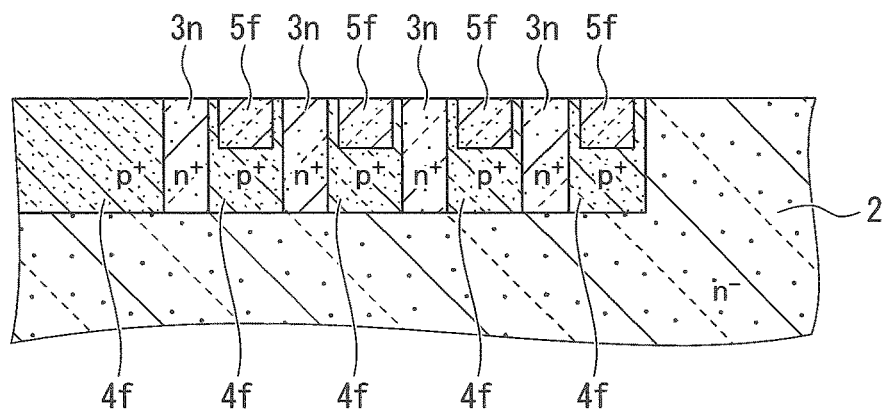
FIG. 49 is a schematic cross-sectional view illustrating another example of the edge-termination structure of the semiconductor device according to the other embodiment of the present invention.
Figure 50:
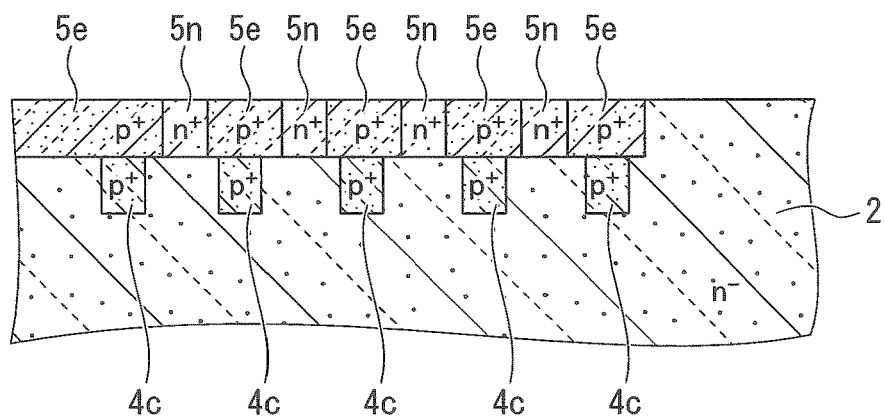
FIG. 50 is a schematic cross-sectional view illustrating another example of the edge-termination structure of the semiconductor device according to the other embodiment of the present invention.

In the semiconductor device according to the second embodiment, a plurality of p$^+$-type guard rings 4f illustrated in FIG. 48 may be used instead of the guard rings (4c, 5a) in the outer-edge area 102 illustrated in FIG. 30. In such case, p-type impurity ions are simultaneously implanted with the first base-bottom embedded region 4a and the gate-bottom protection region 4b illustrated in FIG. 31 to form a continuous integral p-ion implanted layer. Then, n-type impurity ions are simultaneously implanted to the p-ion implanted layer with the n-ion implanted layer 3p, to selectively form the n$^+$-type separation regions 3n. Thus, the guard rings 4f having the concentric ring shapes can be formed so as to be separated from each other. Alternatively, as illustrated in FIG. 49, a plurality of p$^+$-type second region 5f may be provided inside the guard rings 4f. In such case, p-type impurity ions are selectively implanted into the p-ion implanted layer simultaneously with the second base-bottom embedded region 5, to form the second regions 5f separated from each other in the p-ion implanted layer. Then, n-type impurity ions are simultaneously implanted into the p-ion implanted layer with the n-ion implanted layer 5p, to selectively form a plurality of separation regions 3n. In such way, a plurality of guard rings (4f, 5f) having the concentric ring shapes can be formed so as to be separated from each other. Further, as illustrated in FIG. 50, widths of the first regions 4c and the second regions 5e may be different in the guard rings (4c, 5e) in the outer-edge area 102. In addition, the widths of the first regions 4c and the second regions 5e, which are different from each other, may be changed in the X direction and the Y direction, respectively.

In the first to third embodiments, the MISFET having the trench structure is exemplified, but the present invention is not limited thereto, and the present invention is applicable to a semiconductor device having various trench structures such as an IGBT having a trench structure. As the trench gate IGBT, the n$^+$-type source region 7 of the MISFET illustrated in FIGS. 2, 18 and 30 may be used as an emitter region, and a p$^+$-type collector region may be provided on the bottom surface of the drift layer 2 instead of the n$^+$-type drain region 1. The present invention is also applicable to diodes such as a SBD.

In the first to third embodiments, the semiconductor device using SiC has been exemplified, but the present invention can also be applied to a semiconductor device using another hexagonal wide bandgap semiconductor such as gallium nitride (GaN), aluminum nitride (AlN), diamond and the like.

As described above, it should be noted that the present invention includes various embodiments, which are not disclosed herein, including elements optionally modified as alternatives to those illustrated in the above embodiments and modified examples. Therefore, the scope of the present invention is defined only by the technical features specifying the invention prescribed by the claims reasonably derived from the description heretofore.

What is claimed is:

1. A semiconductor device having an active area in which a main current flows and an outer-edge area surrounding the active area, the semiconductor device comprising:
    a semiconductor layer having a first conductivity type made of a wide bandgap semiconductor;
    a plurality of guard rings each having a second conductivity type provided inside the semiconductor layer in the outer-edge area to surround the active area; and
    a separation region provided in a concentric ring shape in the outer-edge area to be in contact with adjacent guard rings among the plurality of guard rings inside the semiconductor layer whereby the adjacent guard rings are separated from each other by the separation region,
    wherein the separation region contains both first impurities of the first conductivity type and second impurities of the second conductivity type,
    wherein a top surface of the semiconductor layer has an offset angle in a range of greater than 0° and equal to or less than about 10° in a <11-20> direction with respect to a <0001> direction.

2. The semiconductor device of claim 1, wherein the separation region is a semiconductor region of the first conductivity type.

3. The semiconductor device of claim 1, wherein the separation region is a semiconductor region of the second conductivity type.

4. The semiconductor device of claim 1, wherein a mesa groove is provided in the outer-edge area.

5. The semiconductor device of claim 1, wherein the wide bandgap semiconductor is any one of silicon carbide, gallium nitride, and aluminum nitride.

6. A semiconductor device having an active area in which a main current flows and an outer-edge area surrounding the active area, the semiconductor device comprising:
   a semiconductor layer having a first conductivity type made of a wide bandgap semiconductor;
   a plurality of guard rings each having a second conductivity type provided inside the semiconductor layer in the outer-edge area to surround the active area; and
   a separation region provided in a concentric ring shape in the outer-edge area to be in contact with both of adjacent guard rings, wherein the separation region contains both first impurities of the first conductivity type and second impurities of the second conductivity type,
   wherein, in a depth where the guard rings and the separation region are in contact with each other, an impurity concentration of the second impurity in the separation region is the same as an impurity concentration of impurities of the second conductivity type contained in each of the guard rings.

7. A semiconductor device having an active area in which a main current flows and an outer-edge area surrounding the active area, the semiconductor device comprising:
   a semiconductor layer having a first conductivity type made of a wide bandgap semiconductor;
   a plurality of guard rings each having a second conductivity type provided inside the semiconductor layer in the outer-edge area to surround the active area; and
   a separation region provided in a concentric ring shape in the outer-edge area to be in contact with adjacent guard rings among the plurality of guard rings inside the semiconductor layer whereby the adjacent guard rings are separated from each other by the separation region,
   wherein the separation region contains both first impurities of the first conductivity type and second impurities of the second conductivity type,
   wherein the active area including:
      a base region of the second conductivity type provided on a top surface of the semiconductor layer;
      a source region of the first conductivity type selectively provided on an upper portion of the base region;
      a base contact region of the second conductivity type selectively provided on an upper portion of the base region;
      a trench which penetrates the base region to reach the semiconductor layer,
      an insulated-gate electrode structure provided inside the trench;
      a gate-bottom protection region of the second conductivity type provided to be in contact with a bottom of the trench; and
      a base-bottom embedded region of the second conductivity type provided inside the semiconductor layer to be in contact with a bottom surface of the base region.

8. The semiconductor device of claim 7, wherein an impurity concentration of second conductivity type impurities contained in each of the guard rings is the same as an impurity concentration of second conductivity type impurities contained in the base region.

9. The semiconductor device of claim 7, wherein each depth of the guard rings is the same as a depth of the base contact region, and a depth of the separation region is the same as a depth of the source region.

10. The semiconductor device of claim 7, wherein an impurity concentration of second conductivity type impurities contained in each of the guard rings is the same as an impurity concentration of second conductivity type impurities contained in the base contact region, and an impurity concentration of the first impurities of the first conductivity type contained in the separation region is the same as an impurity concentration of first conductivity type impurities contained in the source region.

11. A semiconductor device having an active area in which a main current flows and an outer-edge area surrounding the active area, the semiconductor device comprising:
   a semiconductor layer having a first conductivity type made of a wide bandgap semiconductor;
   a plurality of guard rings each having a second conductivity type provided inside the semiconductor layer in the outer-edge area to surround the active area; and
   a separation region provided in a concentric ring shape in the outer-edge area to be in contact with adjacent guard rings among the plurality of guard rings inside the semiconductor layer whereby the adjacent guard rings are separated from each other by the separation region,
   wherein the separation region contains both first impurities of the first conductivity type and second impurities of the second conductivity type,
   wherein each of the guard rings has a first region and a second region in contact with a bottom surface of the first region, the second region having a width different from that of the first region.

12. A method for manufacturing a semiconductor device having an active area in which a main current flows and an outer-edge area surrounding the active area in a first conductivity type semiconductor layer made of a wide bandgap semiconductor, the method including:
   forming a second conductivity type semiconductor region on a top surface of the semiconductor layer from the active area to the outer-edge area; and
   forming separation regions by implanting first conductivity type impurity ions into the semiconductor region to reach the semiconductor layer, the separation regions each having a concentric ring shape and guard rings sandwiching between the respective separation regions in the outer-edge area.

13. The method of claim 12, wherein, the separation regions are formed in a depth where the guard rings and the separation regions are in contact with each other, so that an impurity concentration of the second impurity in each of the separation regions is the same as an impurity concentration of impurities of the second conductivity type contained in each of the guard rings.

14. The method of claim 12, further executed in the active area, the method including:
   forming a base region of the second conductivity type on a top surface of the semiconductor layer;
   selectively forming a source region of the first conductivity type on an upper portion of the base region;

selectively forming a base contact region of the second conductivity type on the upper portion of the base region;

forming a trench which penetrates the base region to reach the semiconductor layer;

forming an insulated-gate electrode structure inside the trench;

forming a gate-bottom protection area of the second conductivity type to be in contact with a bottom of the trench, and forming a base-bottom embedded region of the second conductivity type inside the semiconductor layer to be in contact with a bottom surface of the base region.

15. The method of claim 14, wherein the base region is formed by growing a second conductivity type epitaxial layer, and the semiconductor region is implemented by the epitaxial layer.

16. The method of claim 14, wherein each of the guard rings is formed to have a depth as same as the depth of the base contact region, and the separation regions are formed to have a depth as same as the depth of the source region.

17. The method of claim 14, wherein the separation regions are formed so that an impurity concentration of second conductivity type impurities contained in each of the guard rings is the same as an impurity concentration of second conductivity type impurities contained in the base contact region and an impurity concentration of first conductivity type impurities contained in each of the separation regions is the same as the impurity concentration of first conductivity type impurities contained in the source region.

18. The method of claim 12, wherein each of the guard rings has a first region and a second region in contact with a bottom surface of the first region, and the second region is formed to have a width different from that of the first region.

* * * * *

UNITED STATES PATENT AND TRADEMARK OFFICE
CERTIFICATE OF CORRECTION

PATENT NO. : 12,272,746 B2  
APPLICATION NO. : 17/533843  
DATED : April 8, 2025  
INVENTOR(S) : Keiji Okumura Page 1 of 1

It is certified that error appears in the above-identified patent and that said Letters Patent is hereby corrected as shown below:

In the Specification

Column 1, Line 8, Delete "12021-1061" and insert -- 2021-1061 --.

Signed and Sealed this
First Day of July, 2025

Coke Morgan Stewart
*Acting Director of the United States Patent and Trademark Office*